US012356869B2

(12) United States Patent
Schmidt et al.

(10) Patent No.: US 12,356,869 B2
(45) Date of Patent: Jul. 8, 2025

(54) HALL INTEGRATED SENSOR AND CORRESPONDING MANUFACTURING PROCESS

(71) Applicant: LFOUNDRY S.R.L., Avezzano (IT)

(72) Inventors: Carsten Schmidt, Avezzano (IT); Gerhard Spitzlsperger, Avezzano (IT); Daniel Hohnloser, Avezzano (IT)

(73) Assignee: LFOUNDRY S.R.L., Avezzano (IT)

(*) Notice: Subject to any disclaimer, the term of this patent is extended or adjusted under 35 U.S.C. 154(b) by 608 days.

(21) Appl. No.: 17/625,634

(22) PCT Filed: Jul. 8, 2020

(86) PCT No.: PCT/IB2020/056427
§ 371 (c)(1),
(2) Date: Jan. 7, 2022

(87) PCT Pub. No.: WO2021/005532
PCT Pub. Date: Jan. 14, 2021

(65) Prior Publication Data

US 2022/0246840 A1 Aug. 4, 2022

(30) Foreign Application Priority Data

Jul. 8, 2019 (EP) .................................... 19185046

(51) Int. Cl.
*H10N 52/00* (2023.01)
*G01R 33/00* (2006.01)
(Continued)

(52) U.S. Cl.
CPC ....... *H10N 52/101* (2023.02); *G01R 33/0017* (2013.01); *G01R 33/0052* (2013.01);
(Continued)

(58) Field of Classification Search
CPC ........... H10N 52/101; H10N 52/00–85; H10N 52/01; H10N 59/00; G01R 33/0017;
(Continued)

(56) References Cited

U.S. PATENT DOCUMENTS 4,673,964 A * 6/1987 Popovic ............... H10N 52/101
257/E27.005
10,424,616 B1 * 9/2019 Sun ........................ H10N 59/00
(Continued)

FOREIGN PATENT DOCUMENTS

EP 3462201 A1 * 4/2019 ......... G01R 33/0017

*Primary Examiner* — Vu A Vu
*Assistant Examiner* — Jeremy Daniel Watts
(74) *Attorney, Agent, or Firm* — Stinson LLP

(57) ABSTRACT

An integrated Hall sensor is provided with: a main wafer (10) of semiconductor material having a substrate (101) with a first surface (101*a*) and a second surface (101*b*), opposite to the first surface (101*a*) along a vertical axis (y); Hall sensor terminals (1, 2, 3, 4; 1', 2', 3', 4') arranged at least one of the first and second surfaces (101*a*, 101*b*) of the substrate (101); an isolation structure (109) in the substrate (101) defining a Hall sensor plate (103) of the integrated Hall sensor, the Hall sensor terminals being arranged in the isolation structure (109). The integrated Hall sensor moreover has a test or calibration coil integrated in the wafer (10), having a plurality of windings formed, at least in part, by metal portions (130*b*, 170*b*; 130*a*, 170*a*) arranged above the first and second surfaces (101*a*, 101*b*) of the substrate (101) and defining an inner volume (1001) entirely enclosing the Hall sensor plate (103).

20 Claims, 47 Drawing Sheets

(51) Int. Cl.
*G01R 33/07* (2006.01)
*H10N 52/01* (2023.01)
*H10N 52/80* (2023.01)

(52) U.S. Cl.
CPC ........... *G01R 33/077* (2013.01); *H10N 52/01* (2023.02); *H10N 52/80* (2023.02)

(58) Field of Classification Search
CPC .. G01R 33/0052; G01R 33/077; G01R 33/07; H01L 43/04; H01L 43/06; H03B 15/00–006
See application file for complete search history.

(56) References Cited

U.S. PATENT DOCUMENTS

| | | | | |
|---|---|---|---|---|
| 2006/0170406 | A1 | 3/2006 | Kawashima et al. | |
| 2012/0169329 | A1 | 7/2012 | Hellwig et al. | |
| 2016/0018478 | A1* | 1/2016 | Hebert | G01R 33/0052 257/421 |
| 2016/0274196 | A1* | 9/2016 | Takaki | H10N 59/00 |
| 2017/0316875 | A1* | 11/2017 | Lee | H10N 50/80 |
| 2019/0103551 | A1* | 4/2019 | Cesaretti | H10N 52/00 |
| 2019/0346515 | A1* | 11/2019 | Motz | H10N 52/00 |

* cited by examiner

10A'
182
108
107
101
104
105
106
201
170
161b
151b
150
141b
111b
110b
121b
130
777
109
154
4
1
111
103
130b
153
3
2
112
1001
170b
160b
150b
140b
181
110b
101b
101a
1100
Cut 10B-10B'
Cut 10A-10A'
10A
10
20

100

HALL INTEGRATED SENSOR AND CORRESPONDING MANUFACTURING PROCESS

CROSS-REFERENCE TO RELATED APPLICATIONS

This patent application is a U.S. national stage application of International Application No. PCT/IB2020/056427 filed Jul. 8, 2020, and claims priority from European patent application no. 19185046.0 filed Jul. 8, 2019, the entire disclosures of which are incorporated by reference in their entirety for all purposes.

TECHNICAL FIELD

The present invention relates to a Hall integrated sensor, in particular having at least an integrated coil for final test and calibration, and to a corresponding manufacturing process.

BACKGROUND ART

Magnetic sensor ICs (Integrated Circuits) typically use silicon-based Hall sensor elements which are monolithically integrated with the electrical circuits required for signal conditioning and amplification. Typical commercial products with monolithically integrated Hall sensors are Hall switch ICs, Hall ICs for linear position measurement, angular position sensor Hall ICs, Hall ICs for current sensing and 3D Hall sensor ICs. Depending on the product type, a Hall integrated sensor may include horizontal Hall elements, vertical Hall elements, or both. Horizontal Hall elements sense the strength of the magnetic field perpendicular to the silicon surface. They are used in numerous applications, in which it is sufficient to determine the magnetic field strength in one spatial dimension only. Examples are unipolar and bipolar Hall switch ICs and Hall sensor ICs for linear position measurement along one axis. Vertical Hall elements, which sense the strength of the magnetic field in a direction lying in the plane of the silicon surface, are used in angular position sensor Hall ICs and, together with a horizontal Hall element, in 3D Hall sensor ICs.

Hall sensors can be fabricated with standard CMOS manufacturing processes, so that the Hall sensor and the electronics for operation and readout may be integrated on the same chip. Alternatively, a dedicated Hall sensor wafer could be stacked on a second wafer containing the required circuitry. In WO 2020/104998 A1, in the name of the present Applicant, a method of stacking two wafers is disclosed to form such a Hall sensor IC product.

The magnetic sensitivity of Hall sensors depends on stress, temperature, aging and thermal shocks. Manufacturing imperfections such as photo alignment errors, non-uniform dopant densities or defects can give rise to offsets for the Hall voltage. More seriously, plastic packages used for Hall sensor ICs can cause stress in the silicon resulting in offsets for the Hall voltage as well. Hall sensor ICs therefore are subjected to extensive testing. For many products, e.g. for linear Hall ICs, each Hall sensor is calibrated, and the obtained calibration data is stored in the IC. To characterize the magnetic response of a Hall sensor, the packaged chip is placed in an external Helmholtz coil. 3D Hall sensor ICs need to be characterized, of course, in all three spatial dimensions. As is understood from above, the final test and calibration effort for Hall sensor ICs is significant and the associated costs make up a large fraction of the overall fabrication cost.

It has been proposed to equip Hall sensors ICs with integrated coils testing and calibration, see for example:

P. L. C. Simon, P. H. S. de Vries, S. Middelhoek, Autocalibration of silicon Hall devices, Transducers 95, 291-A12, pp. 237-240, 1995

R. S. Popovic, T. J. A. Flanagan, P. A. Besse, The future of magnetic sensors, Sensors and Actuators A56, pp. 39-55, 1996.

Integrated coils used for the final test and calibration of horizontal and/or vertical Hall sensors are required to induce large enough magnetic fields, in the range of several mT at least. The coil efficiency is defined as the ratio of the induced magnetic field strength divided by the coil current. Maximum coil currents to be applied to the integrated coil during the final test or the calibration procedure might be limited by the electromigration performance of CMOS metal layer used for coil. More importantly, the self-heating of the Hall sensor element during the test has to be considered. For these reasons, it is critical to achieve a high coil efficiency for the integrated coils.

In addition, the magnetic field induced by the integrated coil should be homogeneous in the region of the Hall sensor element under test. While this can be accomplished to some extent for horizontal Hall sensors (by using a standard metal layer for the formation of the coil), there is no method known to form inductor coils for a vertical Hall sensor such that a uniform and homogeneous magnetic field is induced in the Hall plate of the vertical Hall sensor.

DISCLOSURE OF INVENTION

The aim of the present invention is consequently to provide an improved Hall integrated sensor, in particular having at least an integrated coil for final test and calibration.

According to the present invention, a Hall integrated sensor and a corresponding manufacturing process are consequently provided, as defined in the appended claims.

BRIEF DESCRIPTION OF THE DRAWINGS

For a better understanding of the present invention, preferred embodiments thereof are now described purely by way of non-limiting example and with reference to the attached drawings, wherein.

BEST MODE FOR CARRYING OUT THE INVENTION

As will be discussed in detail in the following, the present solution envisages manufacturing of an integrated Hall sensor using fully CMOS-compatible process steps and materials.

Figure 1A:
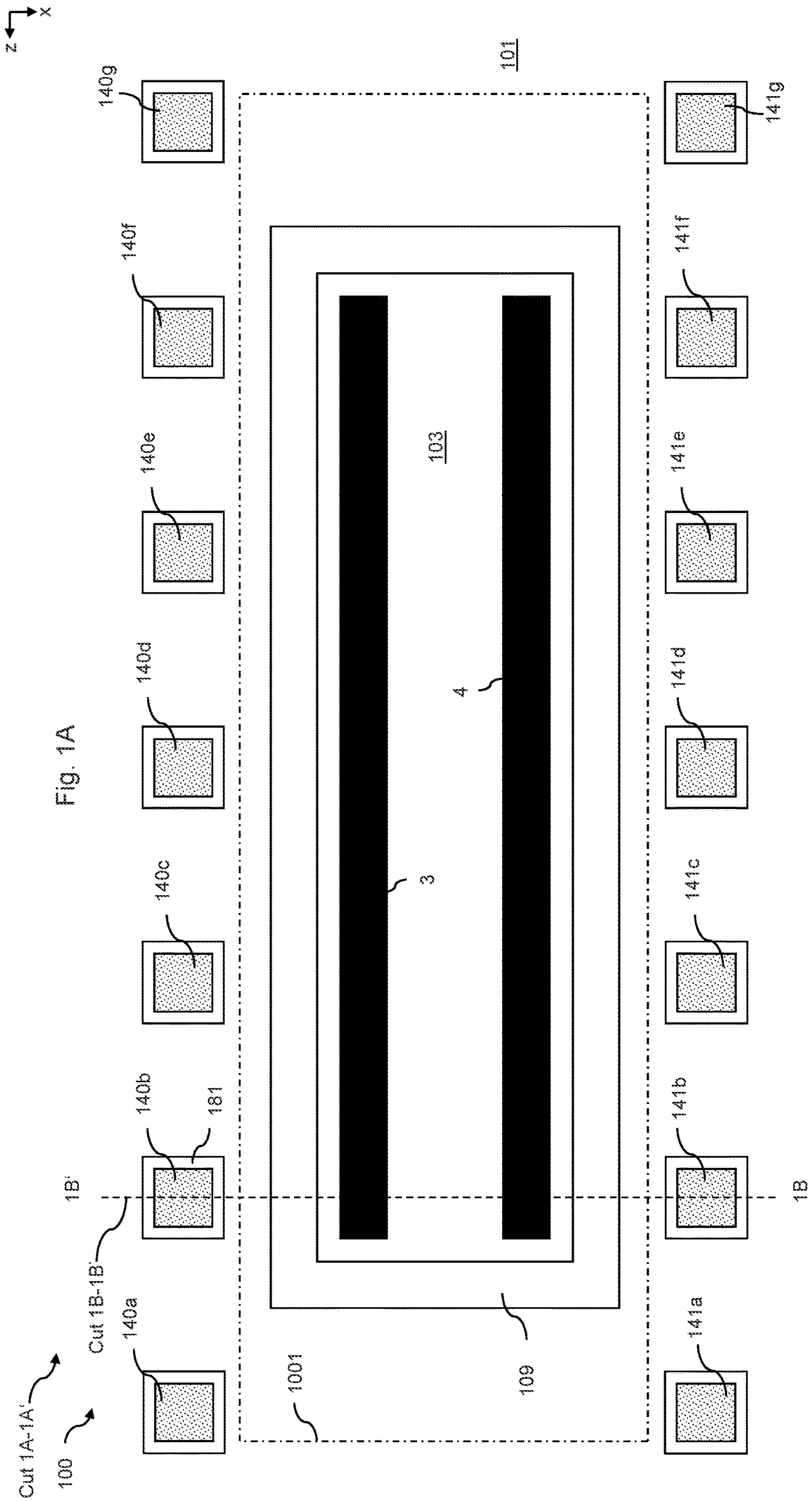
FIG. 1A is a plan view of a Hall integrated sensor, according to an embodiment of the present solution.
Figure 1B:
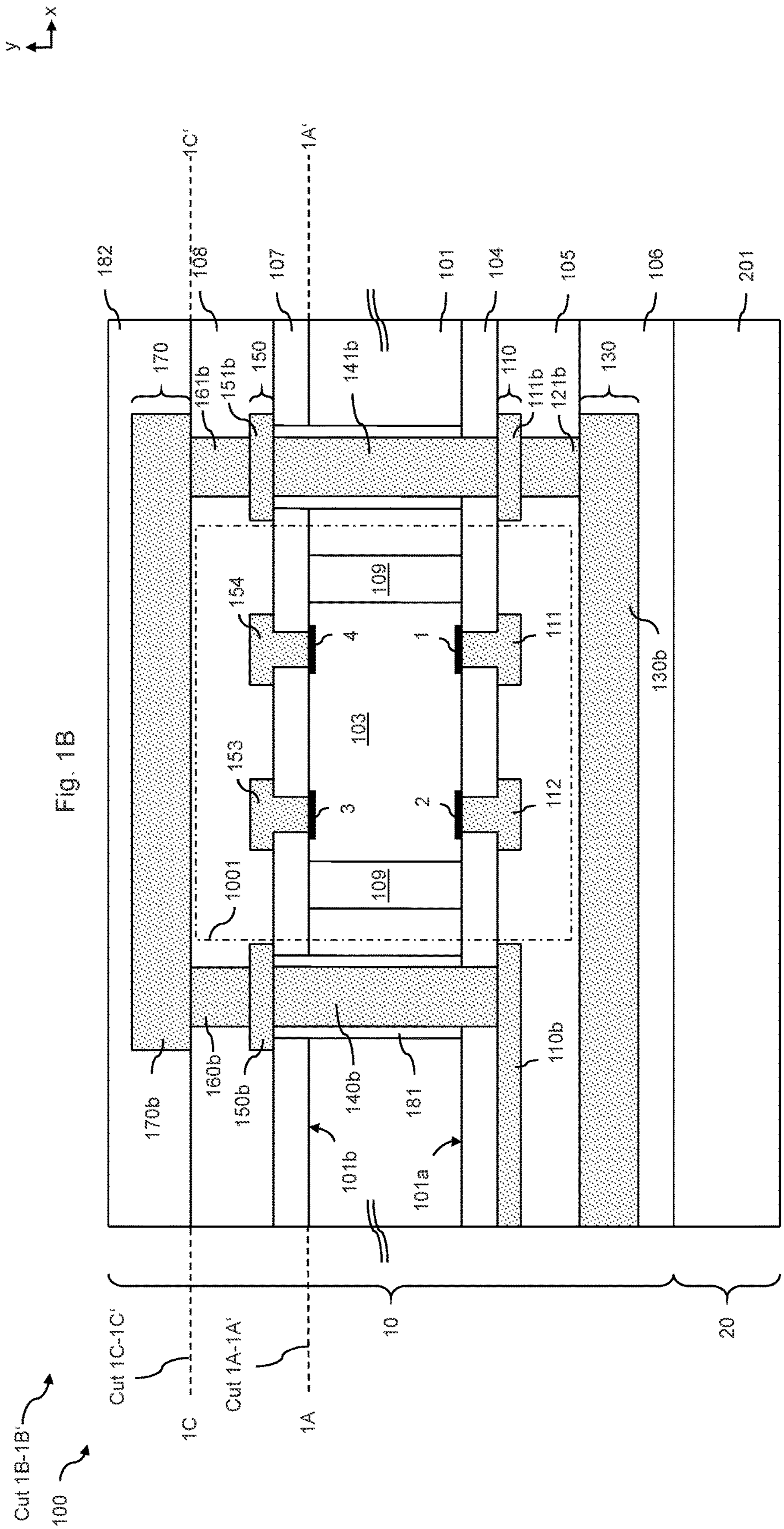
FIG. 1B is a cross-section of the Hall integrated sensor of FIG. 1A.
Figure 1C:
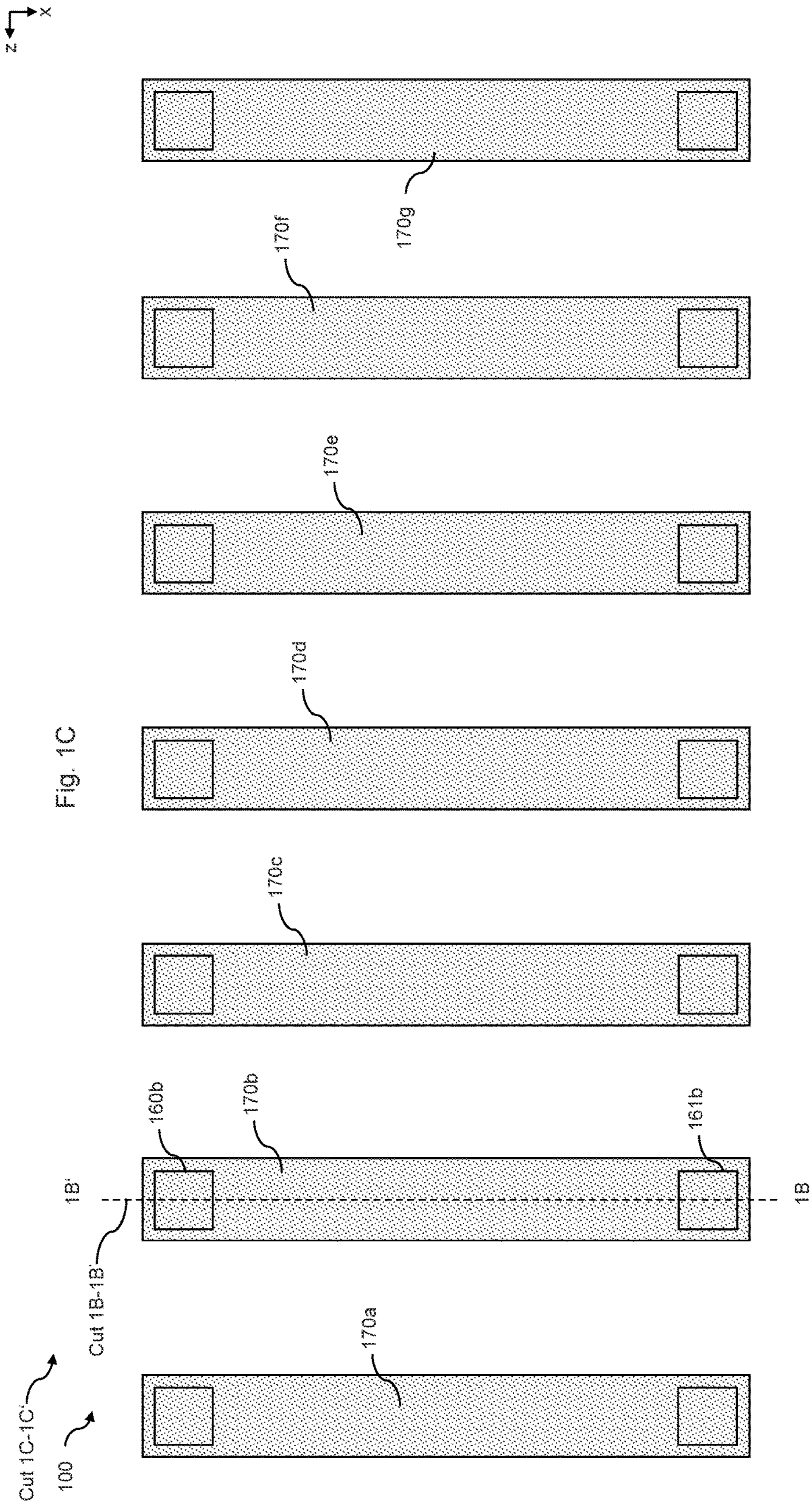
FIGS. 1C and 2 are further plan views of the Hall integrated sensor, according to the embodiment of the present solution.
Figure 2:
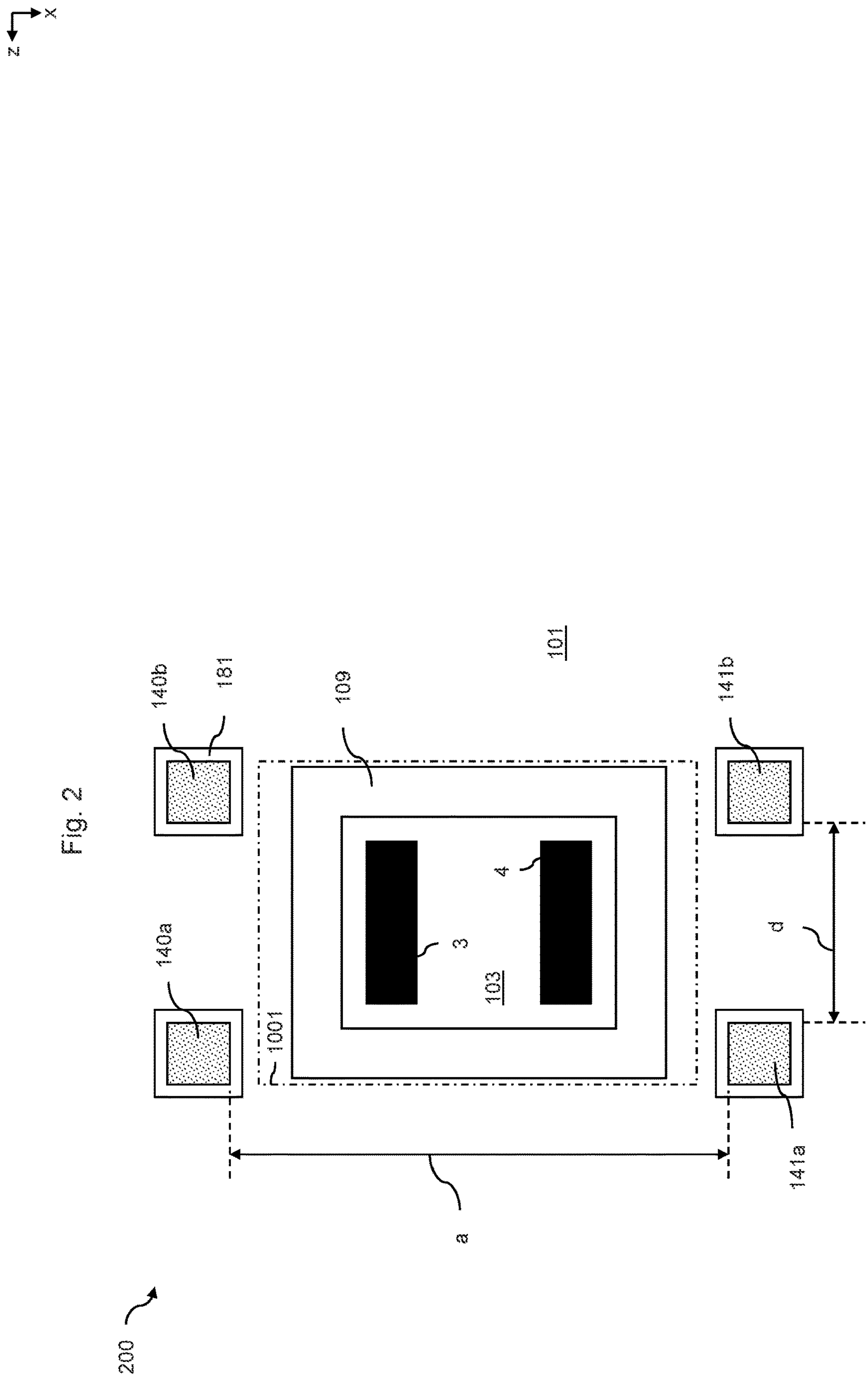

FIGS. 1A, 1B and 1C show a first embodiment of the present solution. The Hall sensor product 100 includes a vertical Hall sensor which is equipped with a coil for calibration and testing. FIG. 1A gives an aerial image of the Hall sensor product 100 in the x-z plane. A cut parallel to the x-direction from 1B to 1B' is indicated and denoted by 1B-1B'. FIG. 1B shows a cross-section of the Hall sensor product 100 along the cut 1B-1B'. In FIG. 1B two cuts are indicated. A first cut from 1A to 1A' denoted by 1A-1A' and a second cut from 1C to 1C' denoted by 1C-1C'. Each of the two cuts corresponds to a plane parallel to the x-z plane shifted from the origin along the y-direction. FIG. 1A shows the Hall sensor product 100 in the plane of cut 1A-1A'. FIG. 1C is another aerial image of Hall sensor product 100, this time in the plane of cut 1C-1C'. The Hall sensor product 100 comprises a vertical Hall element and an on-chip coil dedicated for testing and calibration of the vertical Hall element. Referring to FIG. 1B, the vertical Hall element is formed on a wafer 10 having a semiconductor substrate 101. The semiconductor substrate 101 is preferably a silicon substrate, but other semiconductor materials could be considered as well. The semiconductor substrate 101 has a first conductivity type, which is preferably n-type. Referring further to FIG. 2, the semiconductor substrate has a first surface denoted by 101*a*. At the first surface 101*a* two highly doped regions 1 and 2 are formed having the first conductivity type. The two highly doped regions 1 and 2 extend from the surface 101*a* into the semiconductor substrate 101. The highly doped regions 1 and 2 can be formed by common CMOS manufacturing techniques such as photo masked ion implantation and subsequent rapid thermal annealing. A dielectric layer 104 is disposed on the first surface 101*a*. The dielectric layer 104 constitutes a pre-metal dielectric layer and may consist of silicon nitride, silicon oxide, phosphosilicate glass, borophosphosilicate glass or other suitable dielectric materials. The dielectric layer 104 may also comprise a stack of dielectric layers with material compositions as given above. Within a portion of the surface 101*a* occupied by the highly doped region 1, the dielectric layer 104 has an opening extending down to the substrate surface 101*a*. In the same way, a second opening is provided in the dielectric layer 104, located within a portion of the semiconductor surface 101*a* occupied by the highly doped region 2. The second opening extends as well to the substrate surface 101*a*. A first metal layer 110 is disposed on the dielectric layer 104. The first metal layer 110 might be an aluminum-based metal layer as common in many CMOS manufacturing processes. As shown in FIG. 2, the aluminum-based metal layer fills the two openings in the dielectric layer 104. Alternatively, the two openings could also be filled by a tungsten-based layer, while the metal layer 110 is aluminum- or, alternatively copper-based. Different metallization schemes could be adopted for the metal layer 110 which are all well-known in the art. The metal layer 110 is structured leaving the portions 110*b*, 112, 111 and 111*b* as depicted in FIG. 1B. The metal portions 111 and 112 are in contact with the highly doped regions 1 and 2, respectively. The highly doped regions 1 and 2 define two terminals of the vertical Hall sensor, both formed at the first surface 101*a* of the substrate 101. The metal portions 111 and 112 provide the electrical contact and the wiring to access the Hall terminals 1 and 2, respectively. The metal wiring for each of the two Hall terminals, disposed on the dielectric layer 104, is oriented in x-direction within the area of the vertical Hall sensor and, also in vicinity of the vertical Hall sensor. The metal portions 110*b* and 111*b* are portions of a metal coil surrounding the vertical Hall sensor as will become more evident in the following. The metal layer 110 is embedded in a second dielectric layer 105 forming a first inter-metal dielectric. Suitable materials for the dielectric layer 105 are silicon oxide or a high-k dielectric material. A via 121*b* is formed in the dielectric layer 105. A second metal layer 130 is disposed on the dielectric layer 105 and is structured to leave the metal portion 130*b*. Common metallization schemes can be adopted for the second metal layer. The via 121*b* might be filled with a tungsten-based layer and the metal layer 130 might be aluminum-based or copper-based. The via 121*b* might also be filled with an aluminum-based metal layer 130 disposed on the inter-metal dielectric 105. Common manufacturing processes can be applied to form the metal structures depicted in FIG. 1B. The second metal layer is embedded in the dielectric layer 106, which might consist of silicon oxide or a stack comprising a high-k dielectric and silicon oxide. The via 121*b* is in contact with the metal portion 111*b*. Metal portion 110*b*, metal portion 111*b*, via 121*b* and metal portion 130*b* constitute a portion of the coil surrounding the vertical Hall element at the first surface of the substrate 101. The wafer 10 is attached with the top surface of the dielectric layer 106 onto a second wafer 20. The second wafer 20 might be carrier wafer, for example the second wafer 20 could be an inexpensive silicon wafer. Alternatively, the second wafer 20 could be a CMOS wafer containing the integrated circuits required for operating the vertical Hall element. In this case the wafer 20 comprise a silicon substrate, in which the CMOS devices are formed, and a metallization stack. The metallization stack on wafer 20 may comprise a plurality of metal layers embedded in dielectric layers. In this case the wafer 10 is attached with the top surface of dielectric layer 106 onto the top surface of the dielectric layers disposed on silicon wafer 20. Moreover, electrical contacts are provided between the metal layers formed on wafer 20 and on the first surface of wafer 10. Such electrical contacts could be accomplished by hybrid bonding or other methods known in the art. Using wafer 20 as carrier, the wafer 10 is thinned from the backside, i.e. from the side opposite to the first surface 101*a*. A large fraction of wafer material is removed such that only a thin layer of the semiconductor substrate 101 is remaining. The resulting second substrate surface, opposite to the first surface 101*a*, is denoted by 101*b* in FIG. 1B. The second surface 101*b* of the substrate layer 101 is a parallel to the first surface 101*a*. The thickness of the remaining semiconductor substrate 101 might be preferably in the range of 10 micrometers to 50 micrometers, but lower or higher thickness values could be conceived as well. Two highly doped regions 3 and 4 are disposed at the second surface 101*b* extending into the substrate 101. The highly doped regions 3 and 4 have the first conductivity type, which is the conductivity type of the substrate layer 101. For the vertical Hall element in product 100, the highly doped region 3 might be formed opposite to the highly doped region 2 at the first surface 101*a*, and the highly doped region 4 might be formed opposite to the highly doped region 1 at the first surface 101*a*. FIG. 1A shows the Hall sensor product 100 in the x-z plane of the second surface 100*b* along cut 1A-1A'. As can be seen on FIG. 1A, the highly doped regions 3 and 4 form stripes along the z-direction. For the vertical Hall element of product 100, the highly doped regions 1 and 2 on the first surface 100*a* form also stripes which are oriented in z-direction. Highly doped regions 1, 2, 3 and 4 may all have same lateral dimensions. The highly doped regions 3 and 4 at the second surface 100*b* can be formed by photo masked ion implantation followed by laser thermal annealing. Laser thermal annealing allows to activate the doping at the second surface without doing any harm to the metallization on the first surface. Highly doped regions 3 and 4 as well as highly doped regions 1 and 2 are enclosed by the dielectric structure 109. The dielectric structure 109 extend from the second surface 101*b* to the first surface 101*a* of the substrate layer 101. In FIG. 1A the lateral enclosure of the highly doped regions 3 and 4 by the dielectric structure 109 is depicted. The portion of the substrate layer 101, which is laterally enclosed by the dielectric structure 109 is denoted by 103 in FIGS. 1A and 1B. The portion 103 of the substrate layer 101 is the Hall sensor region (Hall plate) of the vertical Hall element of product 100. The dielectric structure 109 can be established by deep trench isolation process. The dielectric material of the dielectric structure 109 might be silicon oxide. Deep trench isolation processes are well-known in the art. Referring again to FIG. 1B, a first dielectric layer 107 is disposed on the second surface 101*b*. The dielectric layer 107 provides the pre-metal dielectric layer on the second side of the substrate layer 101. Similar materials or material compositions as used for the pre-metal dielectric layer 104 on the first side can equally be considered for dielectric layer 107. A first through silicon via 140*b* is formed extending from the top surface of dielectric layer 107 through the layer 107, through the substrate layer 101 and through the dielectric layer 104 on the first surface 101*a* to reach the metal portion 110*b* of the first metal layer disposed on layer 104. The through silicon via 140*b* is filled with a metal layer, which could be a tungsten-based metal layer or, more preferably, a copper-based metal layer. The metal filling of the through silicon via is electrically isolated from the semiconductor substrate 101 by the dielectric liner 181. The dielectric liner might consist of silicon oxide or other suitable insulating materials. A second through silicon via 141*b* is formed extending from the top surface of dielectric layer 107 through the substrate to the metal portion 111*b* of metal layer 110. The formation of through silicon vias is known by persons skilled in the art. Analogous to the first side, two contact openings are formed in the dielectric layer 107 extending to the surface 101*b* and providing access to the highly doped regions 3 and 4, respectively. Continuing with the description of FIG. 1B, a first metal layer 150 is disposed on the pre-metal dielectric layer 107 on the second substrate surface 101*b*. The two trenches are filled with the metal of layer 150. Similar processes and materials could be applied as for the metal layer 110 on the first surface. Four metal portions 150*b*, 153, 154 and 151*b* are shown in FIG. 1B. The metal portion 150*b* is in contact with the metal filling of the through silicon via 140*b*. The metal portion 151*b* is in contact with the metal filling of the through silicon via 141*b*. The metal portion 153 is in contact with the highly doped region 3 defining one of the two Hall terminals disposed on the second surface 101*b*. Metal portion 154 is in contact with the highly doped region 4 defining the other of the two Hall terminals disposed on the second surface 101*b*. Metal portions 153 and 154 include also the wiring for the two Hall terminals 3 and 4. The wirings are oriented in z-direction. The metal layer 150 is embedded in a first inter-metal dielectric layer 108. Similar processes and materials as for the first inter-metal dielectric 105 on the first side of the substrate 101 could be applied. A via 160*b* formed through the inter-metal dielectric 108 provides a contact to the metal portion 150*b*. A second via 161*b* through the dielectric layer 108 provides a contact to metal portion 151*b*. A second metal layer 170 is disposed on the inter-metal dielectric 108 and structured to connect electrically via 160*b* with via 161*b*. The electrical connection is established by the metal portion 170*b*. In FIG. 1*c* the metal portion 107*b* as well as the vias 160*b* and 161*b* are depicted in the x-z plane along the cut 1C-1C'. Processes and materials to fill the vias with metal and form the metal portion 170*b* could be similar as for the second metal layer on first side of the substrate. Finally, a dielectric layer 182 is disposed on the second metal layer 170 and on the inter-metal dielectric layer 108. The dielectric layer 182 serves as final passivation layer and may comprise a silicon nitride or silicon oxynitride layer.

The vertical Hall element has four terminals arranged on two opposing surfaces of the semiconductor substrate layer 101 in such a way that a four-fold symmetry is obtained. In operation, a drive current can be forced from terminal 1 to terminal 3. The current flows through the semiconductor layer 101 in diagonal direction, wherein the current flow is confined by the dielectric structure 109. A Hall voltage can be captured between the terminals 2 and 4. The measured Hall voltage is representative for a component of a magnetic field in z-direction. Likewise, a drive current can be forced from terminal 2 and terminal 4 and a Hall voltage can be captured between Hall terminals 3 and 1. Again, the measured Hall voltage is representative for a magnetic field component in z-direction. Moreover, the drive currents can be reversed, so that in total four different phases of operation can be established determining all the same component of the magnetic field in z-direction. The operation of the vertical Hall sensor requires complex circuitry for the conditioning and the amplification of the voltage signals. The needed integrated circuits could be formed on the first surface 101*a* of the semiconductor wafer 10 or could be provided on the second semiconductor wafer 20. In any case, further through silicon vias may be required to access the Hall terminals 3 and 4 arranged on the second surface 101*b* from the first side. These vertical connections as well as the required integrated circuits are not shown in FIGS. 1A and 1B.

As shown in FIG. 1B, a rectangular coil is formed in the wafer 10 around the vertical Hall element. The coil comprises the metal wire and pad 110*b*, the through silicon via 140*b*, the metal pad 150*b*, the via 160*b*, the metal wire 170*b*, the via 161*b*, the metal pad 151*b*, the through silicon via 141*b*, the metal pad 111*b*, the via 121*b* and the metal wire 130*b*. The rectangular coil lies in the x-y plane. If a current is fed into the coil to flow counterclockwise through it, a magnetic field will be induced, which is—in the interior of the coil—directed in z-direction. The strength of the induced magnetic field depends on the feed current and the geometry of the inductor coil. The magnetic field induced by the coil can be measured by the vertical Hall element, which is sensitive to the magnetic field component in z-direction.

What is apparent from FIG. 1B, the coil can be arranged in the x-y plane such that a nearly homogeneous magnetic field is induced inside of the Hall plate 103 of the vertical Hall element. The thicknesses of the dielectric layers 107 and 108 on the second surface can be chosen to have equal thickness values as the dielectric layers 104 and 105, respectively. In this way, the metal portion 170*b* has the same vertical distance to the Hall plate 103 as the metal portion 130*b*. Moreover, the through silicon vias 140*b* and 141*b* can be placed such that they have an equal lateral distance to the Hall plate 103. Moreover, the distance of the through silicon vias 140*b* and 141*b* to the Hall plate could be such that it is equal to the combined layer thickness of 104 and 105.

As indicated in FIG. 1A, the vertical Hall element of product 100 could be equipped—by way of example—with seven inductor coils arranged in a row in z-direction. Each coil lies in a plane parallel to the x-y plane as shown in FIG. 1B. In FIG. 1A, which gives a representation of the vertical Hall element with the coils in the x-z plane along cut 1A-1A', the through silicon vias belonging to the coils are shown. As already discussed in conjunction with FIG. 1B, the through silicon vias 140*b* and 141*b* belong to a coil (the one shown in FIG. 1B). The through silicon vias 140*a* and 141*a* belong to another coil, the through silicon vias 140*c* and 141*c* belong to the yet another coil, and same for the through silicon vias 140*d* and 141*d*, the through silicon vias 140*e* and 141*e*, through silicon vias 140*f* and 141*f*, and through silicon vias 140*g* and 141*g*. The seven coils can be connected in series in such a way that the current direction within the x-y plane is identical for all seven single coils (i.e. counterclockwise or clockwise). In this way the seven individual coils form the windings of one combined coil. Moreover, the magnetic field induced by the single coils or windings has the same direction. Each single coil or winding is arranged parallel to x-y plane and the series connections of the single coils is established at some distance of the vertical Hall element. A skilled person will understand how to provide the series connections between the single coils. The series connections can be formed with the means of first and second metal layer 110 and 130 and respective vias. As seen in FIG. 1A, the seven windings are equally spaced. The windings can be arranged such that a magnetic field is induced which is nearly homogeneous in z-direction over the region occupied by the Hall plate 103.

In the Hall sensor product 100 the Hall plate 103 of the vertical Hall element lies in the interior of a multi-winding coil. The interior (inner volume) of a coil is understood as the volume in space, which is enclosed by the coil windings. In FIG. 1B, the interior of the coil, as seen in this cut parallel to the x-y plane, is indicated and denoted by 1001. As shown, the Hall plate 103 is placed entirely inside of the inner volume 1001 of the coil. The same is true for a cut parallel to the x-z plane as given in FIG. 1A. The Hall plate 103 is placed entirely inside of the inner volume (denoted again by 1001) of the (multi-winding) coil.

FIG. 2 represents another Hall sensor product, denoted by 200, having a vertical Hall element equipped with a coil for test and calibration. FIG. 2 provides two-dimensional cut of the Hall sensor product parallel to the x-z plane along the second surface 101*b* of substrate 101 (like FIG. 1B of Hall sensor product 100). The highly doped regions 3 and 4 defining two terminals of the vertical Hall sensor are indicated. The Hall sensor region 103 is confined laterally by the dielectric structure 109. Compared to the vertical Hall sensor of product 100, the vertical Hall sensor of product 200 has a lower width in z-direction. In FIG. 2 two pairs of through silicon vias are shown. A first pair, comprising the through silicon vias 140*a* and 141*a*, belong to a first winding. A second pair, comprising the through silicon vias 140*b* and 141*b*, belong to a second winding of the coil. Both the first and the second windings lie in the x-y plane. As in Hall sensor product 100, the windings are connected such that a current fed into the coil flow through each winding in the identical direction (i.e. either clockwise or counterclockwise in the x-y plane).

In FIG. 2 the spacing between the through silicon vias 140*a* and 141*a* is denoted by a. The length a is the inner length of the rectangular inductor coil in x-direction. The spacing of the two rectangular windings in z-direction is denoted by d in FIG. 2. If the spacing d is chosen to be close to a/2, a Helmholtz configuration is obtained approximately. As known by skilled persons, for quadratic windings with a length a, nearly Helmholtz characteristics are obtained, if the distance d between the two windings is chosen to be 0.544*a. As is further known, a homogeneous magnetic field is induced in the interior of any Helmholtz coil, if a current is fed through it. As shown in FIG. 2, the Hall plate 103 of the vertical Hall element of product 200 lies entirely in the interior 1001 of the two coils.

Figure 3A:
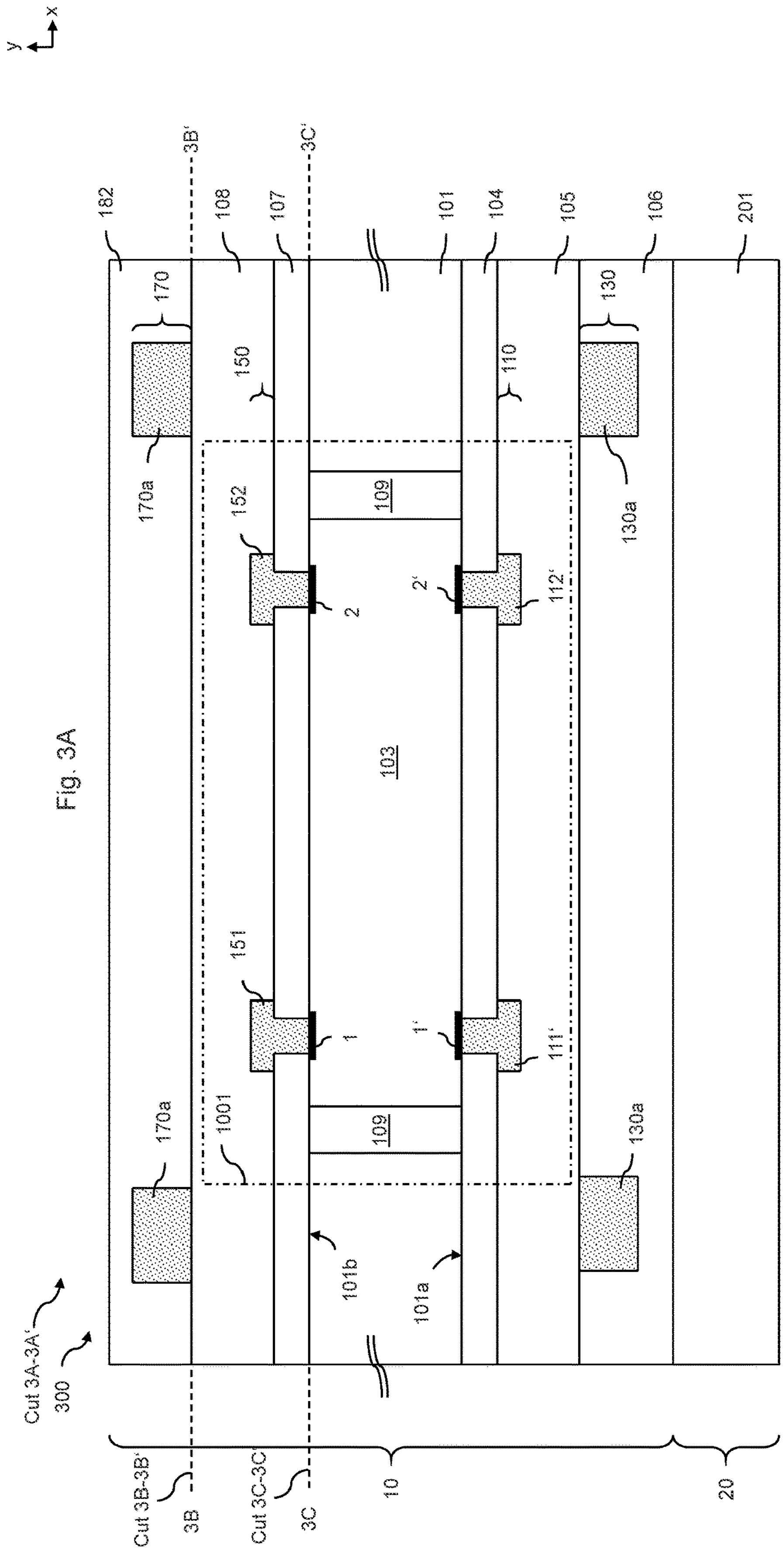
FIG. 3A is a cross-section of a Hall integrated sensor, according to a further embodiment of the present solution.
Figure 3B:
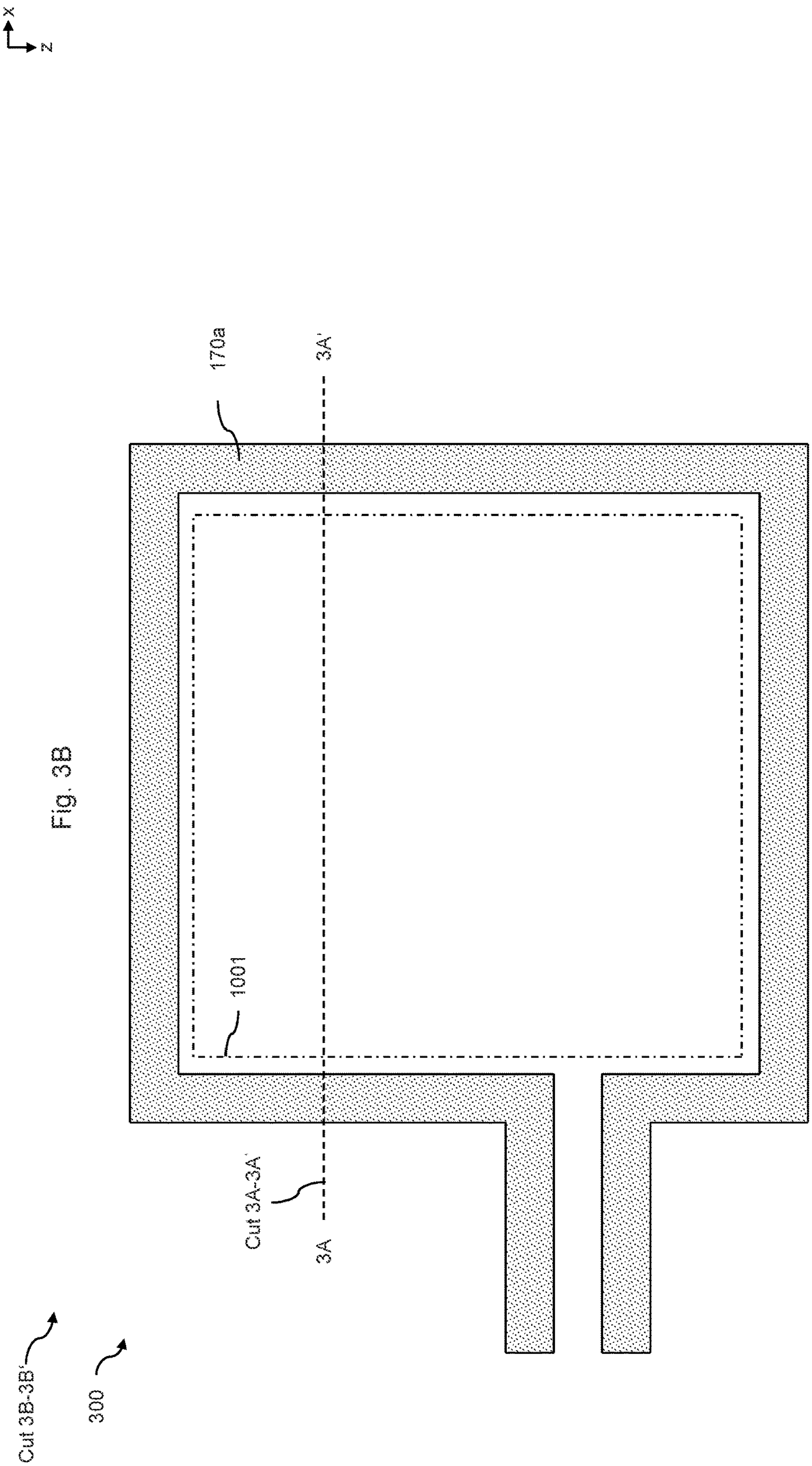
FIGS. 3B and 3C are plan views of the Hall integrated sensor of FIG. 3A.
Figure 3C:
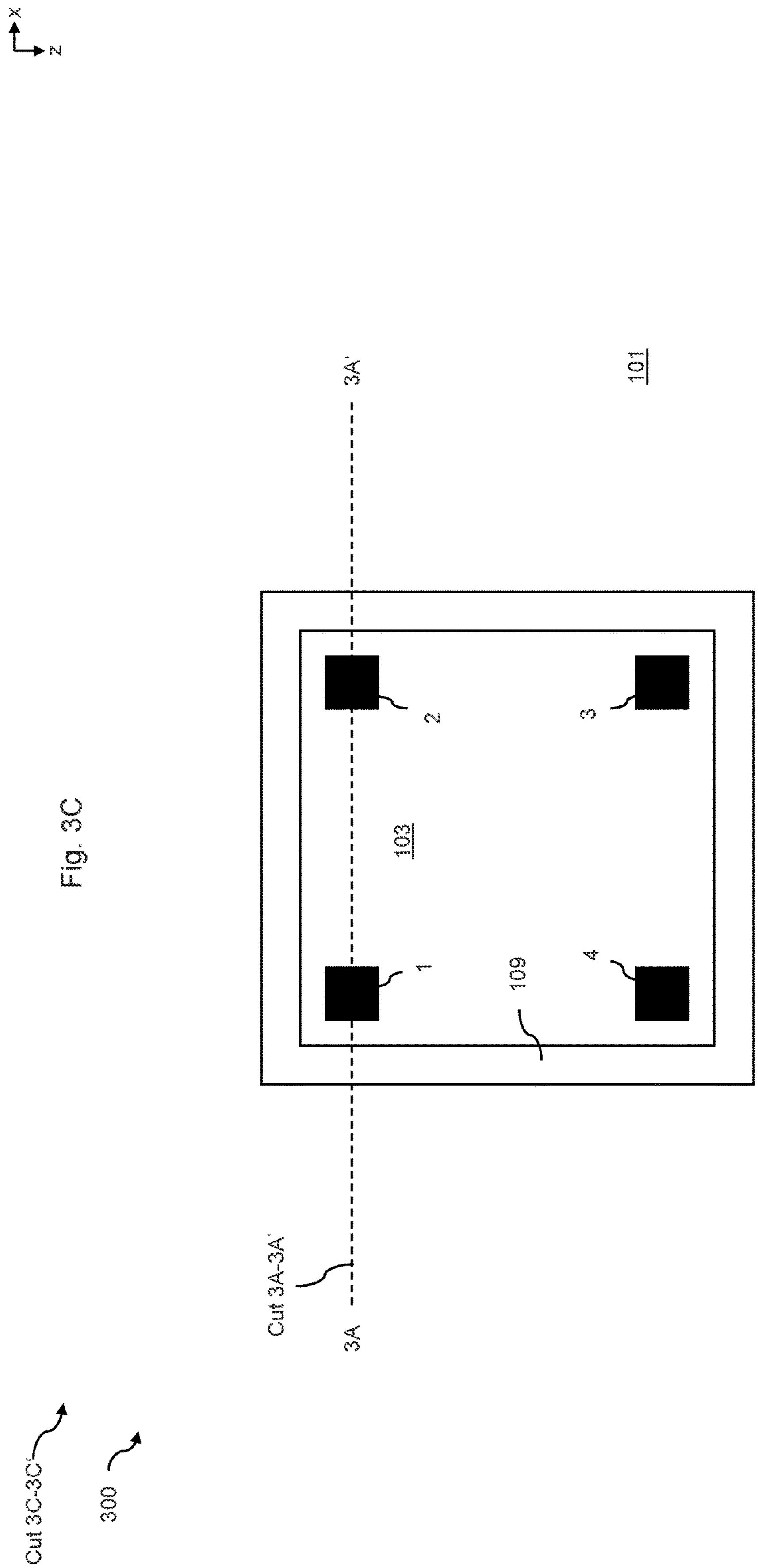

A further Hall sensor product 300 is shown in FIGS. 3A, 3B and 3C. The Hall sensor product 300 comprises a horizontal Hall sensor which is equipped with a coil for calibration and test. FIG. 3A provides a cross-sectional image of the Hall sensor product 300 parallel to the x-y plane. FIGS. 3B and 3B are aerial images of the Hall sensor product 300 at two different positions along the y-direction. FIG. 3B shows the product 300 in the x-z plane at the second surface 101*b* of the substrate. This cut is denoted by 3C-3C' and is indicated in FIG. 3A. FIG. 3C shows a second cut parallel to the x-z plane, which is denoted by 3B-3B'. In FIGS. 3B and 3C, a cut line from 3A to 3A' is indicated. The cut 3A-3A' is shown in FIG. 3A. Referring to FIG. 3*c*, four highly doped regions 1, 2, 3, and 4 are formed at the second surface 101*b* of the substrate 101. Likewise, four highly doped regions 1', 2', 3' and 4' are formed at the first surface

101*a* of substrate 101. As can be seen from FIG. 3A, the highly doped regions 1 and 1', formed at the two opposing surfaces of substrate 101, have the identical position in the x-y plane. As can be seen further, the highly doped regions 2 and 2' have the same position in the x-z plane. The highly doped regions 3 and 3' have also the same position in the x-z plane and the same is valid for the highly doped regions 4 and 4'. Referring further to FIG. 3A, electrical contacts and wiring portions 151, 111', 152 and 112' are established to access the highly doped regions 1, 1', 2 and 2' respectively. Similar electrical contacts and wiring portions are provided also for the highly doped regions 3, 3', 4 and 4'. A dielectric structure 109 is disposed extending from the second surface 101*b* to the first surface 101*a* of the substrate. As is shown in FIG. 3C, the dielectric structure encloses a portion 103 of the substrate 101, the portion 103 defining the Hall plate of the horizontal Hall element. All highly doped regions are formed in the Hall plate 103. The highly doped regions 1 and 1' are electrically connected by means of the wiring portions 151 and 111' and by means of a through silicon via, which is not shown in FIGS. 3A, 3B and 3C. By looking at FIG. 1B, the skilled person will readily understand how vertical electrical connections between highly doped regions 1 and 1' can be established. In the same way, also the highly doped regions 2 and 2' are electrically connected. And in the same, also the highly doped regions 3 and 3' are electrically connected; the highly doped regions 4 and 4' are electrically connected in this way as well. The required four through silicon vias are located outside of the Hall plate 103 confined by the dielectric structure 109. The pair (1, 1') constitutes a first Hall terminal of the horizontal Hall element. The pair (2, 2') constitutes a second Hall terminal of the horizontal Hall element. The pair (3, 3') constitutes a third Hall terminal of the horizontal Hall element and the pair (4, 4') constitutes a fourth Hall terminal of the horizontal Hall element. Referring further to FIG. 3*c*, the Hall plate 103 of the horizontal Hall element has a square shape. The highly doped regions 1, 2, 3 and 4 are placed at the four corners of the square shaped Hall plate 103. Different layouts for the horizontal Hall element could be considered. Particularly, the Hall plate could have the shape of a Greek cross with the four terminals placed at the four ends of the cross.

In operation, a drive current can be fed from Hall terminal (1, 1') to Hall terminal (3, 3'). In the x-z plane this drive current flows diagonally through the quadratic shaped Hall plate 103. A Hall voltage is then captured between the Hall terminals (2, 2') and (4, 4'). The Hall voltage is representative for magnetic field in y-direction. In another mode of operation, a drive current can be fed from Hall terminal (2, 2') to Hall terminal (4, 4') and a Hall voltage can be detected between the terminals (1, 1') and (3, 3'). Again, the measured hall voltage is representative of a magnetic field oriented in y-direction. Reversing the current directions in the above modes of operations gives two further modes of operation.

Turning back to FIG. 3A, at least two metal layers are applied on the first side of the substrate 101 facing the carrier wafer 20. The first metal layer 110 is used to provide electrical connections to the Hall terminals formed at the first surface 101*a* as discussed in the above. Also, at least two metal layers are applied on the second side 101*b* of the substrate 101. The first metal layer 150 is used to provide electrical connections to the Hall terminals formed at the second surface 101*b*. Two coils are formed surrounding the region occupied by the Hall plate 103. A first coil 130*a* is formed with the second metal layer 130 on the first side of wafer 10. A second coil 170*a* is formed by the second metal layer 170 on the second side of wafer 10. In FIG. 3B the coil 170*a* is shown in the x-z plane (cut 3B-3B'). The coil may have a square shape as shown in FIG. 3B, however, other shapes are also possible, for instance a hexagonal shape or a circular shape. The coil 170*a* in FIG. 3B has only one winding, however, the coil may have more than one winding. It is preferred that the first coil 130*a* and the second coil 170*a* are formed in an identical fashion. In detail, the first inductor coil 130*a* and the second coil 170*a* can preferably be formed such that they face each other, have the same number of windings, the same linewidth, the same inner radius and the same outer radius. Moreover, preferably identical processes and materials are used on both sides of the substrate layer 101 for the formation of the second metal layers 130 and 170, so that the series resistance of both inductor coils is approximately the same. Moreover, preferably the combined thicknesses of the dielectric layers 104 and 105 are the same as the combined thicknesses of the dielectric layers 107 and 108. By means of a through silicon via (not shown), the two coils are connected in series such that they form two windings of one coil. The connection is established in such way, that the current direction in the x-z plane is same for both windings. If a current is fed through the coil counterclockwise, a magnetic field is induced, which is oriented in y-direction. In this way, the coil creates a magnetic field, which is measured by the horizontal Hall element. The Hall plate 103 of the horizontal Hall element lies again in the interior of the coil comprising the windings 130*a* and 170*a*. For reference, the inner volume of the coil is indicated in FIGS. 3A and 3B, denoted by 1001.

Figure 4A:
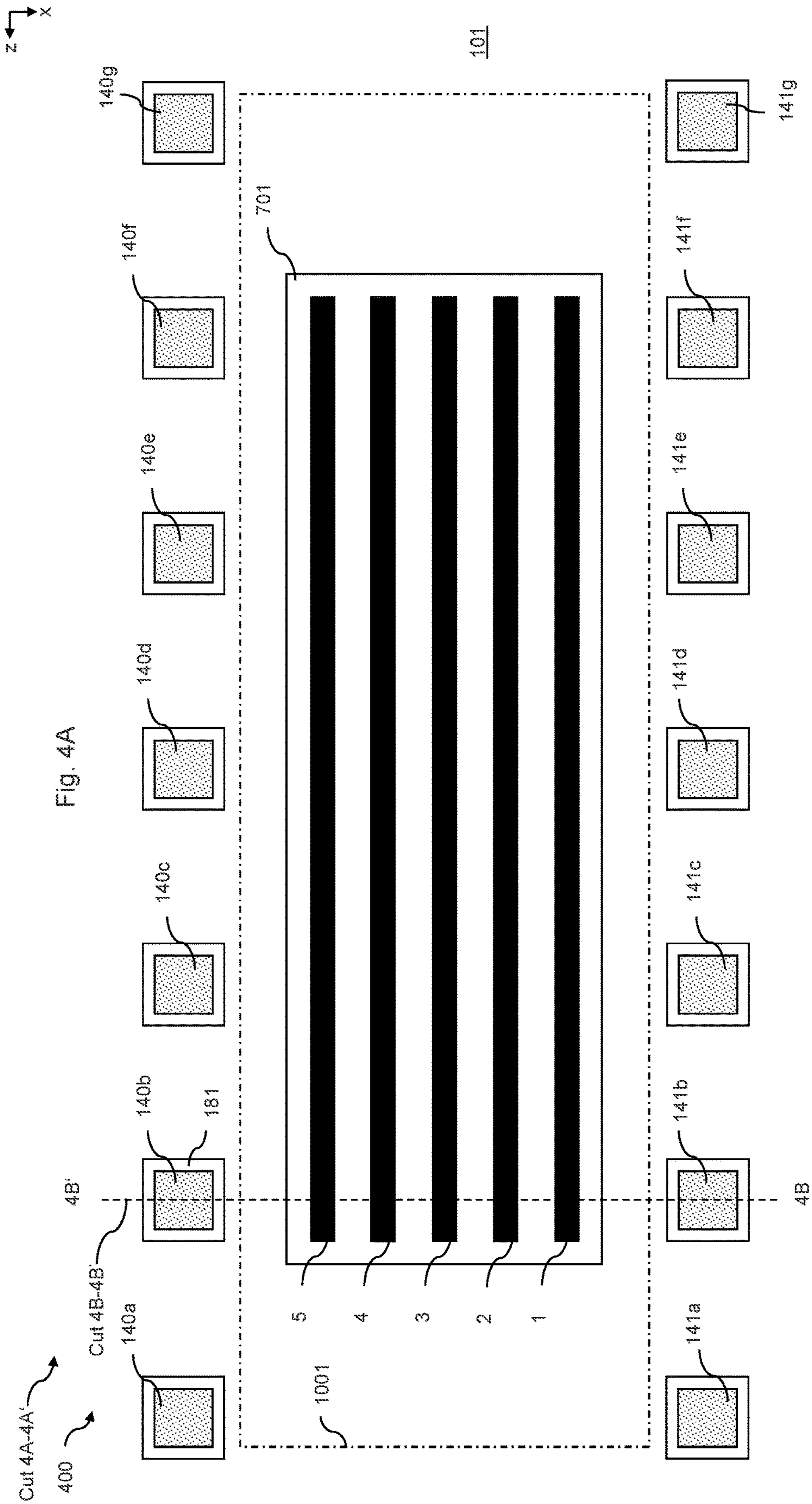
FIG. 4A is a plan view of a Hall integrated sensor, according to still a further embodiment of the present solution.
Figure 4B:
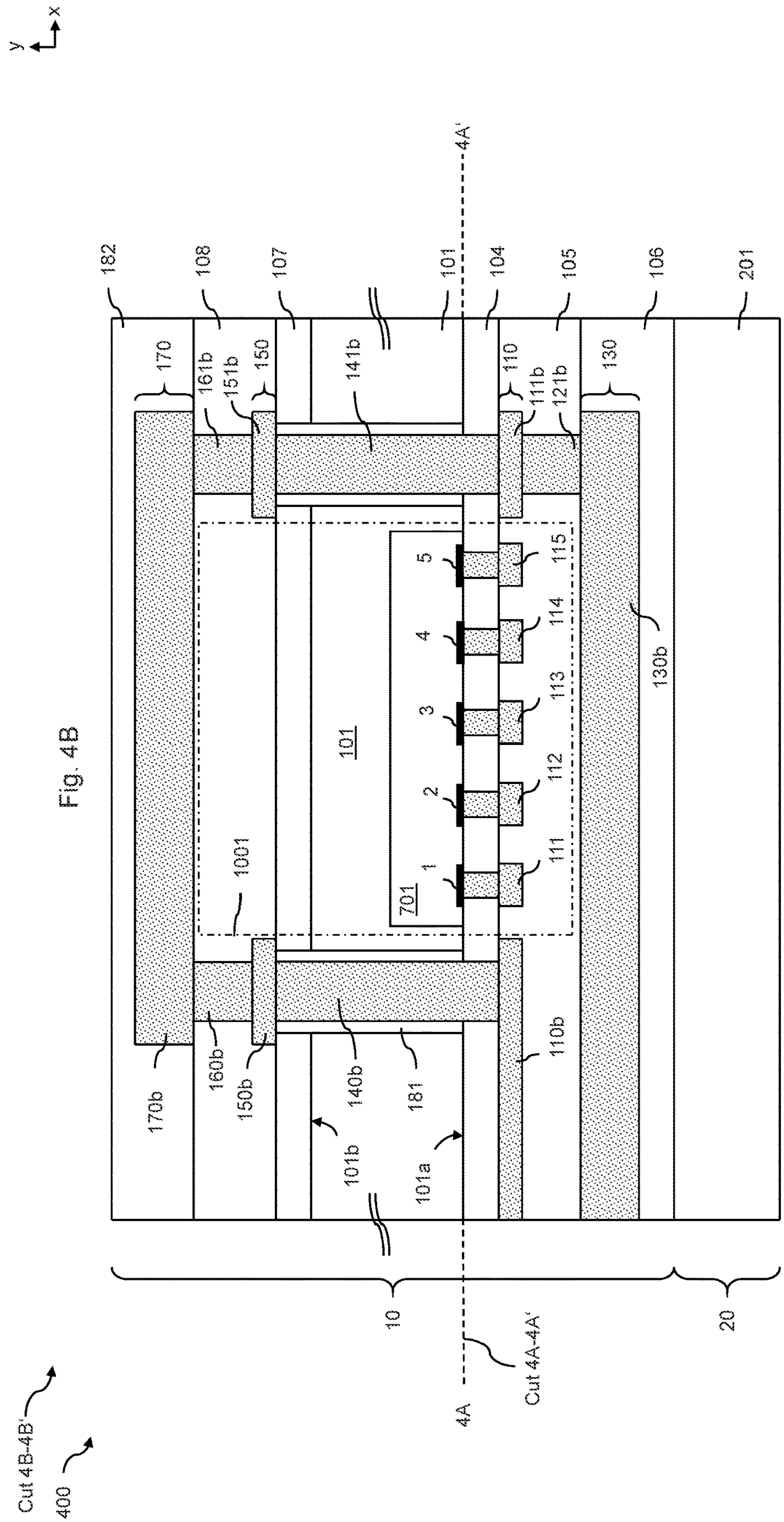
FIG. 4B is a cross-section of the Hall integrated sensor of FIG. 4A.

As shown in FIGS. 4A and 4B, the Hall sensor product 400 comprises a vertical Hall element equipped with an on-chip coil for test and calibration. FIG. 4A is an aerial image of the Hall sensor product while FIG. 4B is a cross-sectional image. The cut position for the aerial image is this time along the first surface 101*a* of the substrate 101 (cut 4A-4A'). The cut position for the cross-sectional image is indicated in FIG. 4A. The Hall sensor product 400 is formed preferably on substrate having the second conductivity type (p-type). A well 701 is formed extending from the first surface 101*a* into the substrate. The well 701 has the conductivity type opposite to the conductivity type of the substrate, i.e. it has the first conductivity type (n-type). A plurality of highly doped regions 1, 2, 3, 4 and 5 having the first conductivity type are formed at the first surface 101*a* extending into the substrate. The highly doped regions 1, 2, 3, 4 and 5 are disposed entirely within the region of well 701. Electrical contacts and wiring portions (111, 112, 113, 114, 115) are formed using a first metal layer 110. The well 701 constitutes the Hall plate (previously denoted with 103) of the vertical Hall element and the highly doped regions 1, 2, 3, 4 and 5 define the Hall terminals of the vertical Hall element. As shown in FIG. 4A, the Hall terminals 1, 2, 3, 4 and 5 are formed in row along the x-axis. Such vertical Hall elements are known in the art. Their operation does not need to be discussed here. As is known, these kind of vertical Hall elements can have a different number of Hall elements such as 3, 4 or more than 5. In any case, the vertical Hall element depicted in FIG. 4B is sensitive for a magnetic field in z-direction. A coil for test and calibration of the vertical Hall element is established in the same manner as for the Hall sensor product 100. Again, the Hall plate of the Hall element (here, the well 701) lies entirely inside of the inner volume 1001 of the coil.

Figure 5A:
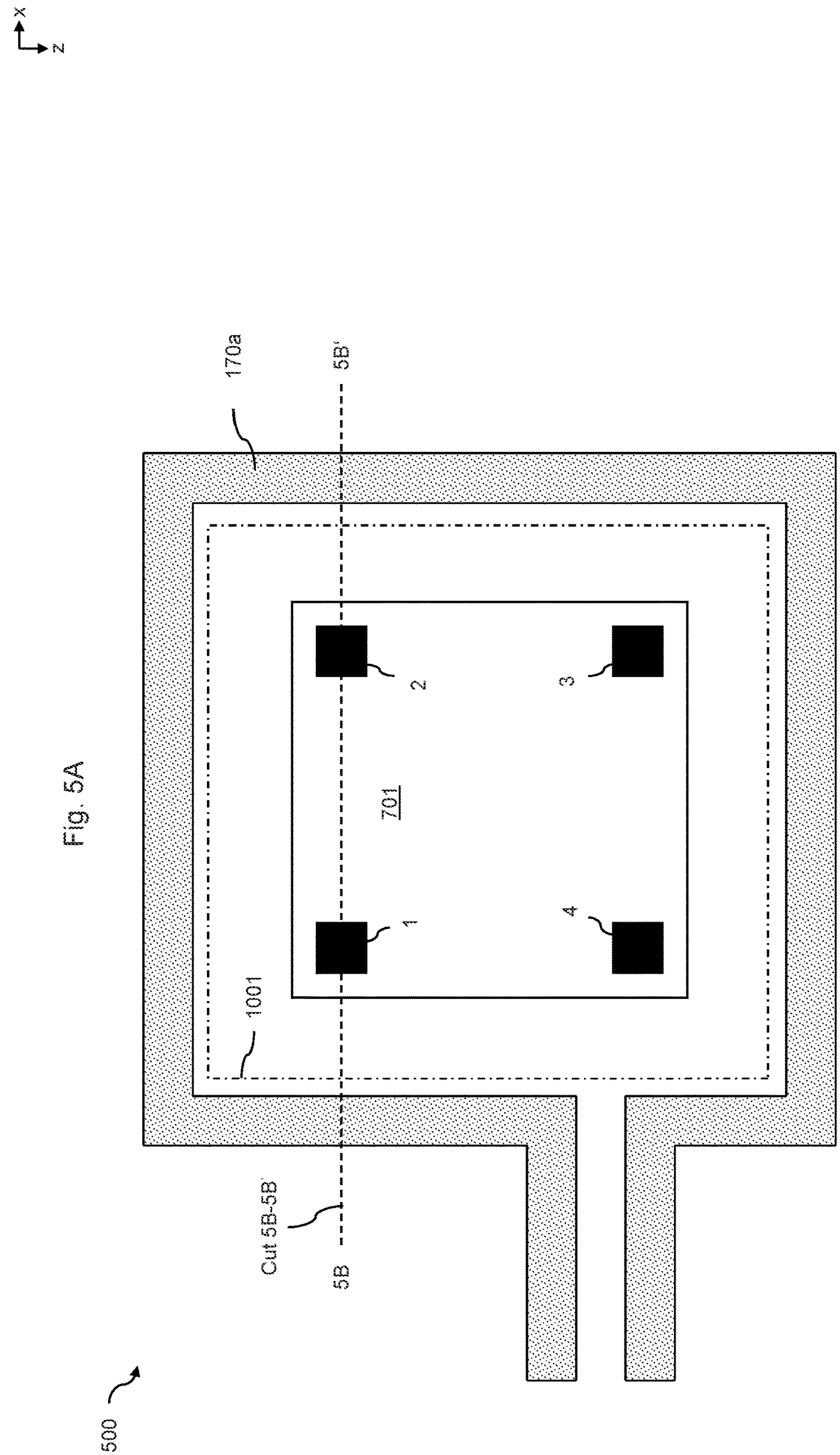
FIG. 5A is a plan view of a Hall integrated sensor, according to still a further embodiment of the present solution.
Figure 5B:
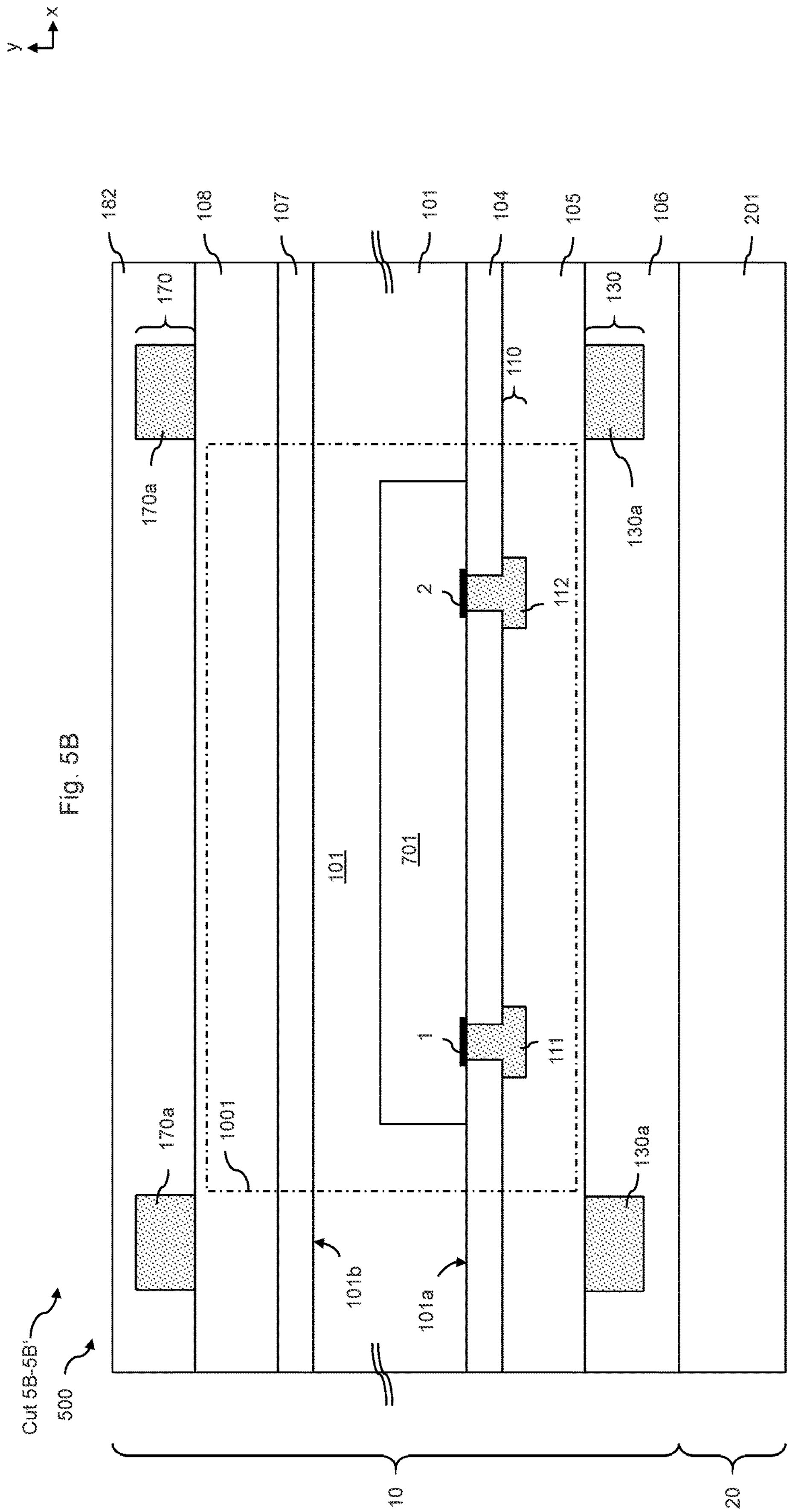
FIG. 5B is a cross-section of the Hall integrated sensor of FIG. 5A.

Another Hall sensor product denoted by 500 is depicted in FIGS. 5A and 5B. The Hall sensor product 500 comprises a horizontal Hall element equipped with an on-chip coil for test and calibration. The Hall sensor product 500 is formed on a substrate 101 have the second conductivity type (p-type). A well 701 having the first conductivity type is formed in the substrate extending from the first surface 101*a*. Four highly doped regions 1, 2, 3 and 4 having the first conductivity type are formed at the first surface 101*a* extending into the well 701. In the x-z plane, the well 701 may have a square shape as shown in FIG. 5A. Furthermore, the four highly doped regions 1, 2, 3 and 4 defining the Hall terminals may be located at the four corners of the square shaped well 701. Other layouts are known in the art, for instance, the well 701 may have the shape of a Greek cross and the four Hall terminals located at the four corners of the cross. The horizontal Hall element depicted in FIGS. 5A and 5B is sensitive to a magnetic field oriented in the z-direction. A coil dedicated for test and calibration of the horizontal Hall element of Hall sensor product 500 is formed in the same manner as in Hall sensor product 300. The Hall plate of the horizontal Hall sensor is placed entirely inside of the inner volume 1001 of the coil.

Figure 6:
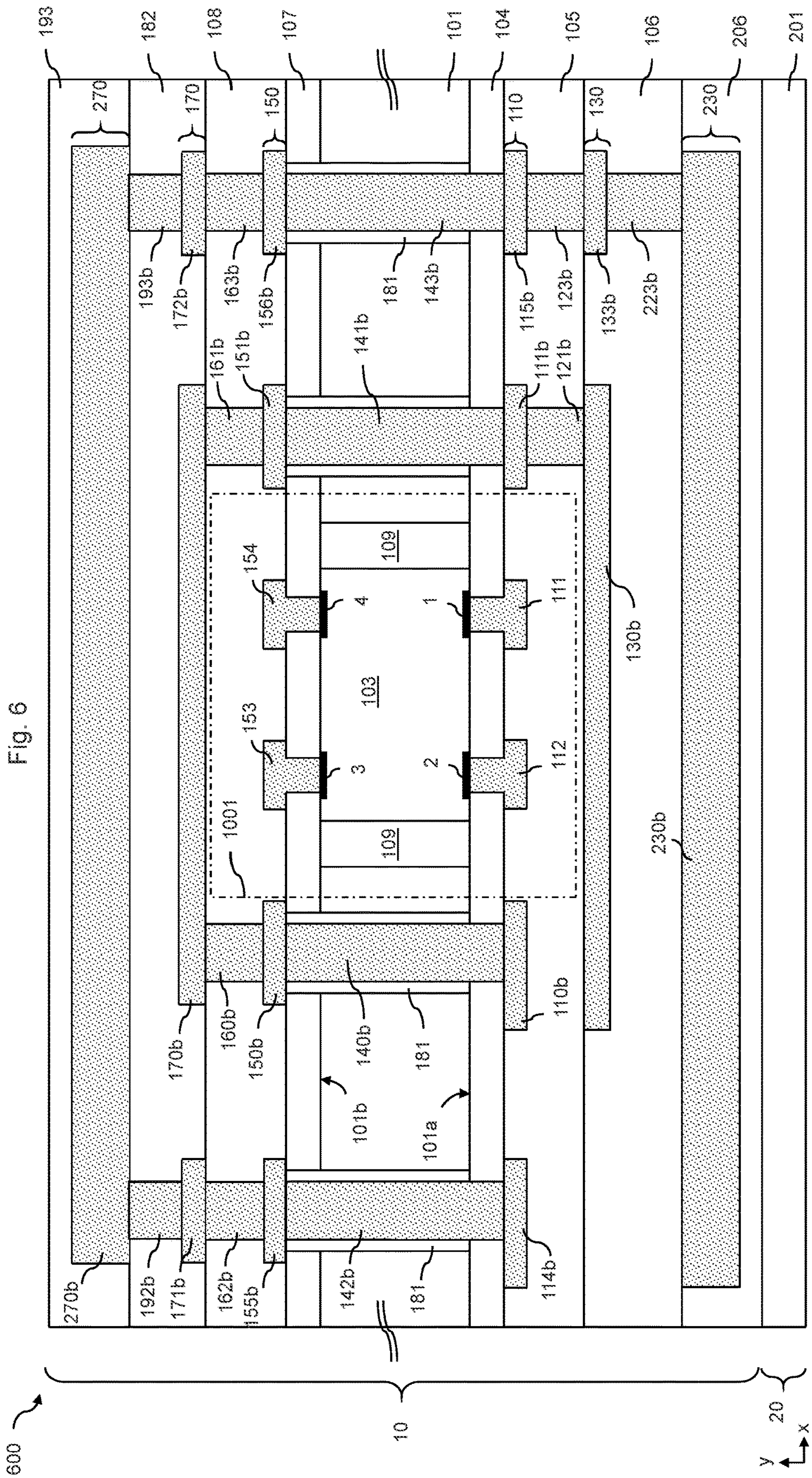
FIG. 6 is a cross-section of a Hall integrated sensor, according to still a further embodiment of the present solution.

FIG. 6 shows a Hall sensor product 600, which comprises a vertical Hall element which might be identical to the vertical Hall element of Hall sensor product 100. FIG. 6 gives a cross-sectional representation of the Hall sensor product. The vertical Hall element with Hall plate 103 and Hall terminals 1, 2, 3 and 4 is surrounded by two coils, an inner coil and outer coil. The inner coil is formed by the metal portion 110*b*, the through silicon via 140*b*, the metal portion 150, the via 160*b*, the metal line 170*a*, the via 161*b*, the metal portion 151*b*, the through silicon via 141*b*, the metal portion 111*b*, the via 121*b* and the metal line 130*b*. This inner coil is identical to the coil depicted in FIG. 1*b* with reference to Hall sensor product 100. As shown in FIG. 6, the outer coil is formed by the metal structures 114*b*, 142*b*, 155*b*, 162*b*, 171*b*, 192*b*, 270*b*, 193*b*, 172*b*, 163*b*, 156*b*, 143*b*, 115*b*, 123*b*, 133*b*, 223*b* and 230*b*. In order to form the outer coil, a further metal layer 230 is added on the first side of the substrate facing the carrier wafer 20. The metal layer 230 is disposed on the top surface of the dielectric layer 106 and is itself embedded in a dielectric layer 206. Vertical connections to the metal layer 130 are provided, such as the via 223*b*. Along the same line, a further metal layer 270 is added on the second side of substrate 101. The metal layer 270 is disposed on the dielectric layer 182 and vias such as 192*b* and 193*b* are provided. The metal layer 270 is embedded in a final passivation layer 193. Inner and outer coils are connected in series in such a way that, if a current is fed into them, the current direction is same for the inner coil and the outer coil (clockwise or counterclockwise in the x-y plane). The required electrical connection between inner and outer coil is not shown in FIG. 6. As a result, a coil is created having one inner and one outer winding. Analogous to Hall sensor product 100, a plurality of such coils may be disposed along the z-direction, each comprising an inner winding and of an outer winding lying both in the x-y plane. If the plurality of coils is connected in series, a multi-winding coil is established with inner and outer winding loops. The Hall plate 103 of the vertical Hall element is situated in the interior of the resulting coil, the interior being denoted again by 1001 in FIG. 6.

Figure 7:
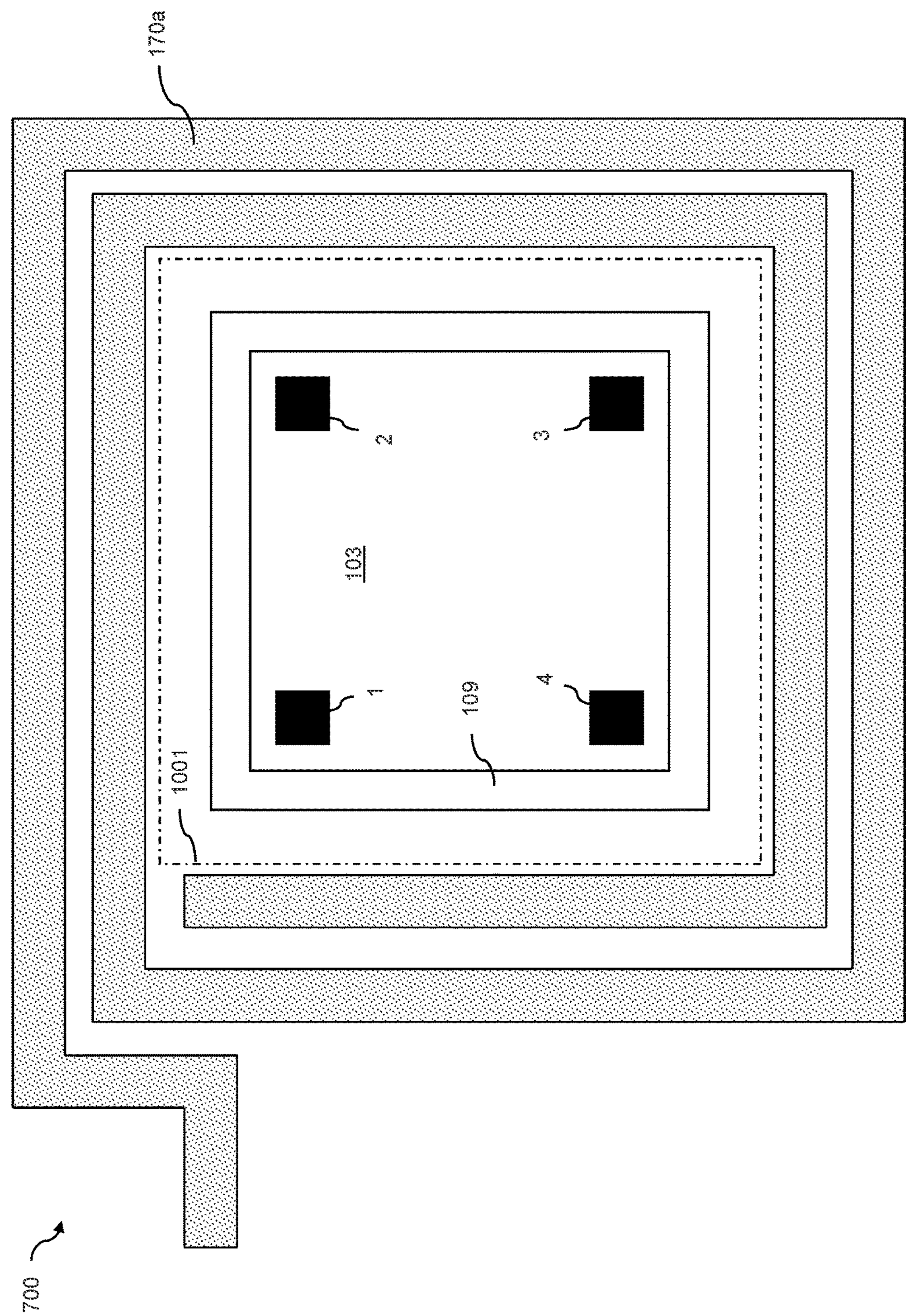
FIG. 7 is a plan view of a Hall integrated sensor, according to still a further embodiment of the present solution.

FIG. 7 is an aerial image of a Hall sensor product 700. Hall sensor product 700 differs from Hall sensor product 300 in that the coil winding 130*a* (here not shown), disposed on dielectric layer 105, is established as a spiral coil with multiple windings and in that the coil winding 170*a*, disposed on dielectric layer 108, is established as a spiral coil with multiple windings. In the above FIG. 7 the spiral coil 170*a* is depicted. The spiral coil 130*a* may have the same or similar layout and number of windings. Like in Hall sensor product 300, the two coils 130*a* and 170*a* are connected in series such that the current direction in the x-z plane is identical for the two spirals. The series connection requires a through silicon via and possible underpasses for the inner ports or endings of the spiral coils 130*a* and 170*a*. The underpasses could be formed by the first metal layers 110 and 150, respectively. A person skilled in the art will easily understand how to establish the series connections. In FIG. 7 also the horizontal Hall element is indicated. The horizontal Hall element is shown through a cut along the second surface 101*b*. In FIG. 7 the spiral coil 170*a* and the horizontal Hall element belong two to different cut positions along the y-axis. 1001 denotes the volume enclosed by the spiral coils 130*a* and 170*a*. The Hall plate 103 is entirely inside of the inner volume 1001.

Figure 8A:
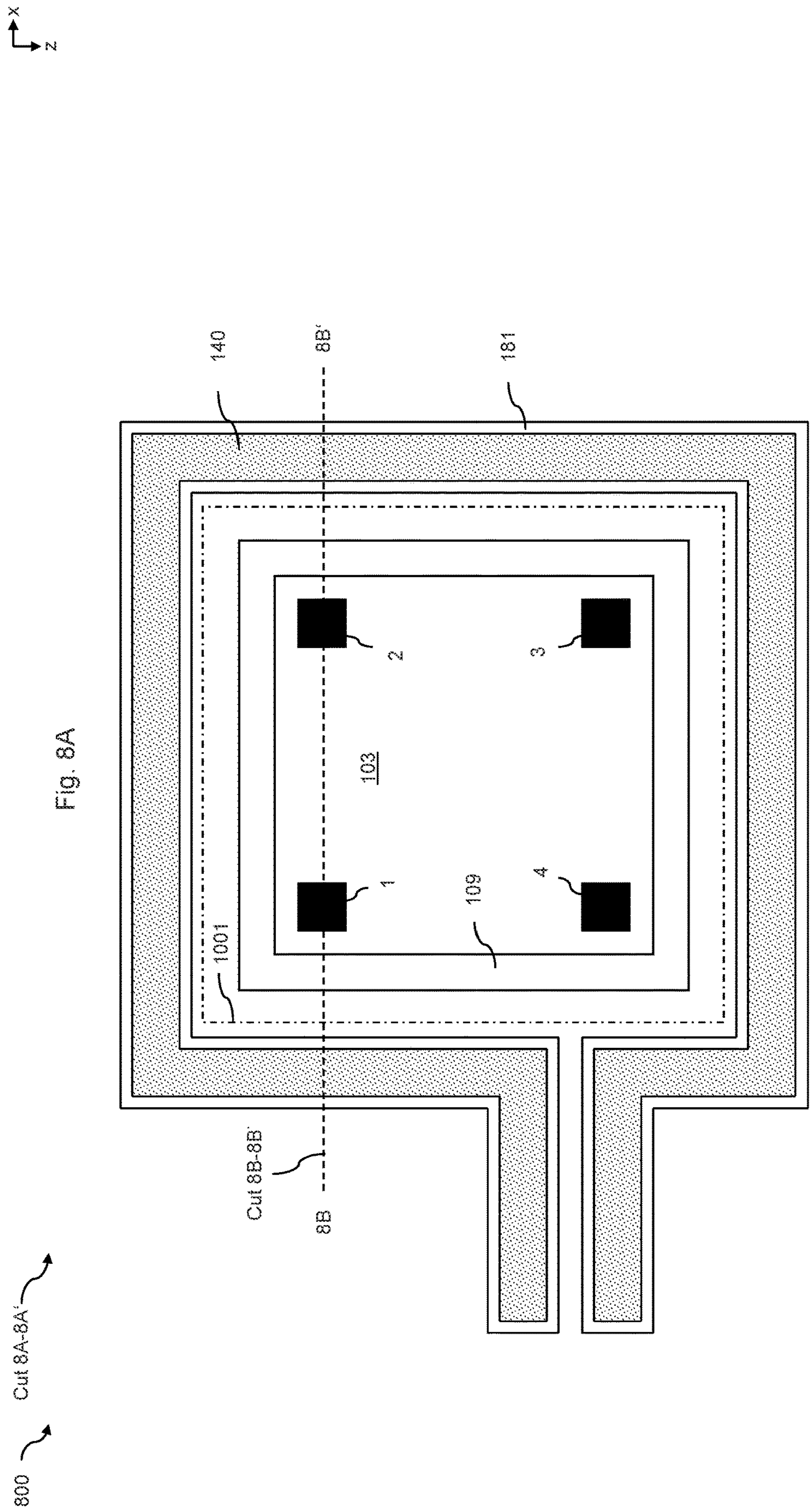
FIG. 8A is a plan view of a Hall integrated sensor, according to still a further embodiment of the present solution.
Figure 8B:
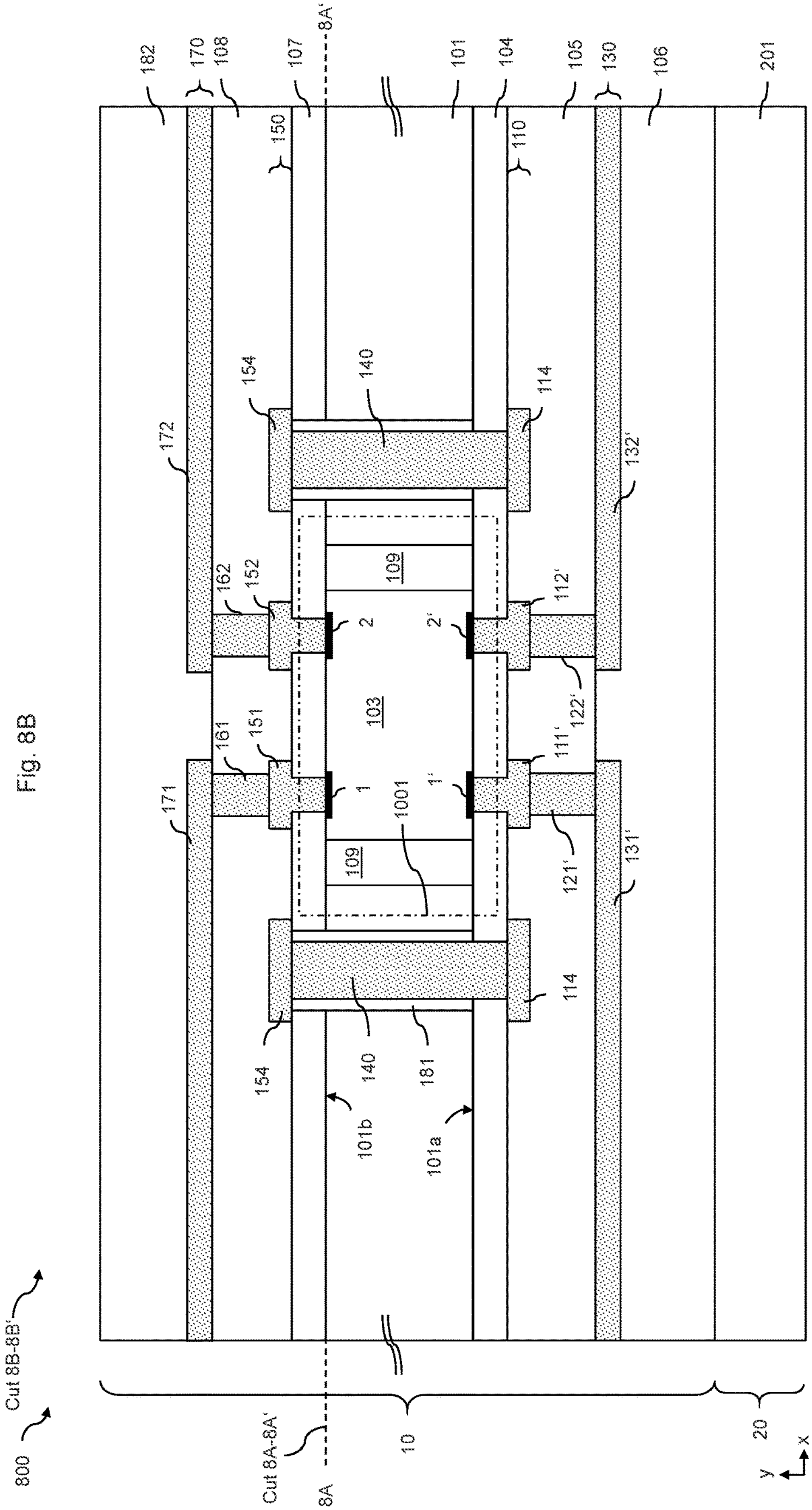
FIG. 8B is a cross-section of the Hall integrated sensor of FIG. 8A.

Hall sensor product 800 shown in FIGS. 8A and 8B is another product with a horizontal Hall element, which is, for instance, similar to the one of Hall sensor product 300. An on-chip coil for test and calibration is formed by means of through silicon via 140 laterally enclosing the horizontal Hall element. FIG. 8B gives a cross-sectional image of the horizontal Hall element and the surrounding coil. A cut 8A-8A' is indicated, which lies in the plane of the second surface 101*b*. In FIG. 8A, the horizontal Hall element and surrounding coil are depicted in x-z plane of cut 8A-8A'. As shown in FIG. 8B, the coil comprises a metal portion 114 of metal layer 110 on the first side of the substrate, the through silicon via 140 through the substrate 101 and the metal portion 154 of metal layer 150 on the second side of the same substrate. The through silicon via 140 is isolated from the substrate 101 by dielectric liner 181. In FIG. 8A the through silicon via 140 is shown to enclose laterally the horizontal Hall element with Hall plate 103. If a current is fed into the coil, a homogenous magnetic field is induced in the interior of the coil. In the interior of coil, the direction of the induced magnetic field is perpendicular to x-z plane. The coil has a square shape; however, also other shapes are possible such a circular shape, octagonal shape or hexagonal shape. Since the coil extends from the first metal layer 110 on the first side of the substrate to the first metal layer 150 on the second side of the substrate, and since further coil encloses the Hall element laterally, a second metal layer on the first side and a second metal layer on the second side of the substrate is required in order to access the Hall terminals from outside of the coil. In FIG. 8B, the metal line 171 and the via 161 provide the access to metal portion 151 and thus to Hall terminal 1. Similarly, the metal line 172 and the via 162 provide the access to metal portion 152 and thus to Hall terminal 2. On the first side of the substrate 101 facing the carrier wafer 20, the metal line 131' and the via 121' provide access to metal portion 111' and thus Hall terminal 1'. Similarly, the metal line 132' and the via 112' provide the access to metal portion 112' and thus to Hall terminal 2'. The coil of Hall sensor product 800 could also have more than one winding, i.e. a spiral coil could be established my means of metal portion 154, through silicon via 140, and metal portion 114. In that case, at least one underpass is required. As is obvious from FIG. 8B, such underpass can be accomplished by the metal layer 130 and corresponding vias. Underpasses could also be formed by metal 170 and corresponding vias. As can be seen from FIGS. 8A and 8B, the Hall plate 103 of the horizontal Hall element lies entirely inside of the volume 1001 enclosed by the coil integrated in the same wafer 10.

Figure 9A:
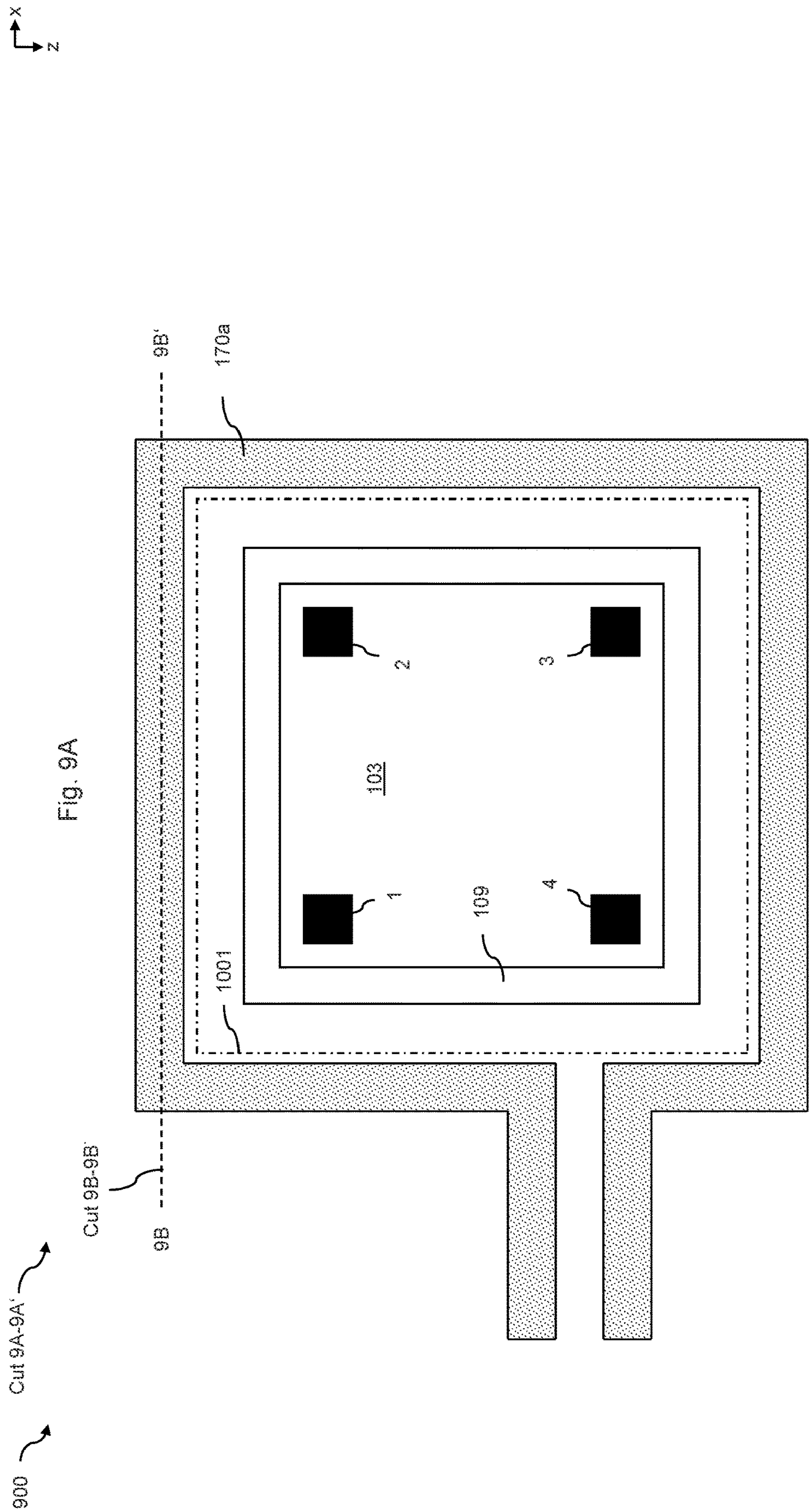
FIG. 9A is a plan view of a Hall integrated sensor, according to still a further embodiment of the present solution.
Figure 9B:
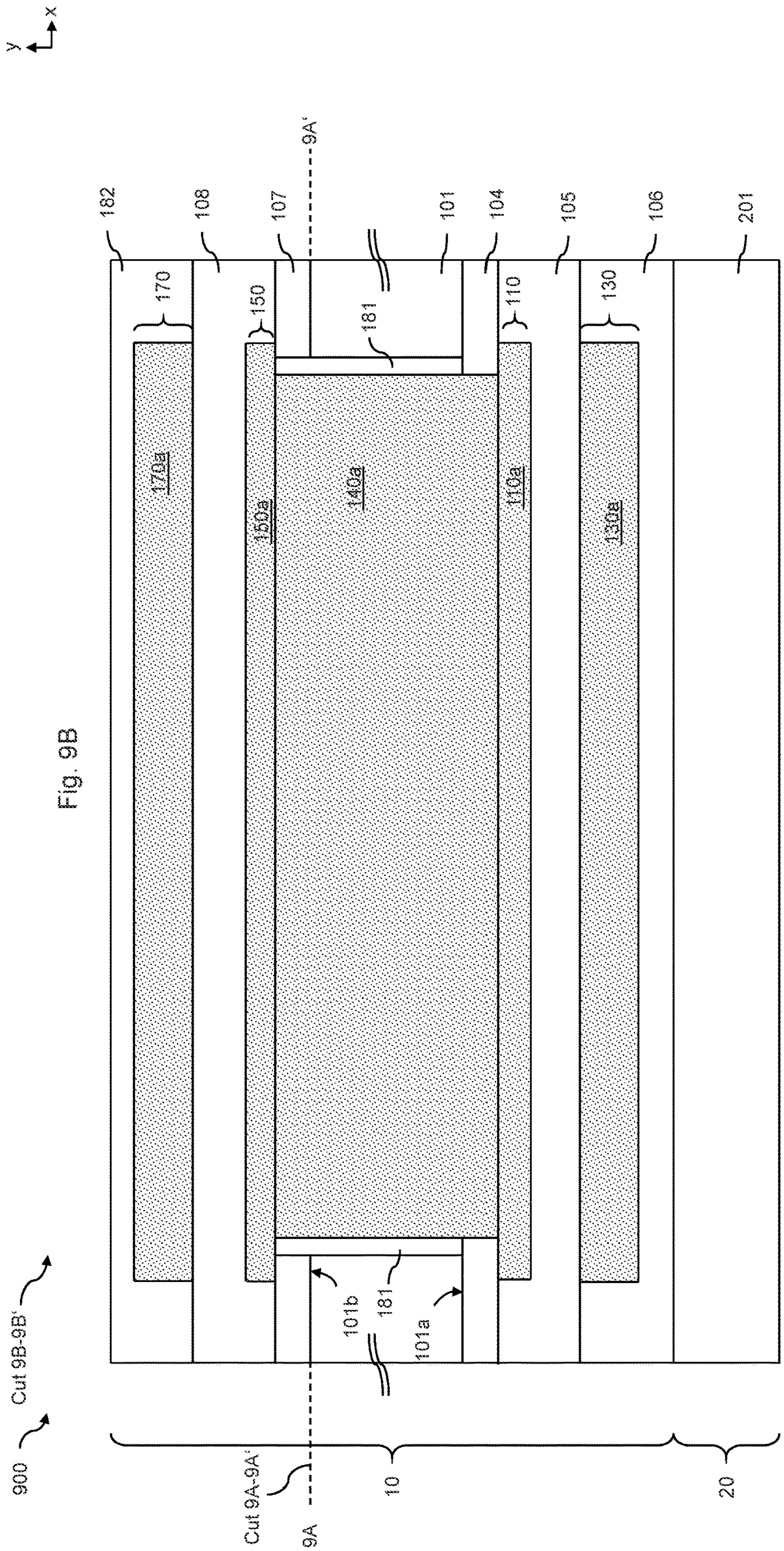
FIG. 9B is a cross-section of the Hall integrated sensor of FIG. 9A.

Hall sensor product 900, shown in FIGS. 9A and 9B comprises a horizontal Hall element equipped with coil for test and calibration, which comprises three coil windings oriented in the x-z plane. The first coil winding is formed by the metal portion 130*a*. This coil winding might be identical to the coil winding 130*a* of the Hall sensor product 300. The second coil winding comprises the metal portion 110*a*, the through silicon via 140*a* and the metal portion 150*a*. This coil winding might be identical to the coil of Hall sensor product 800. The third coil winding is formed by metal portion 170*a*. This coil winding might be identical to the coil winding 170*a* of again Hall sensor product 300. The first, the second and the third coil windings are connected in series such that the current direction is same in the x-z plane, if current is fed into them.

Figure 10A:
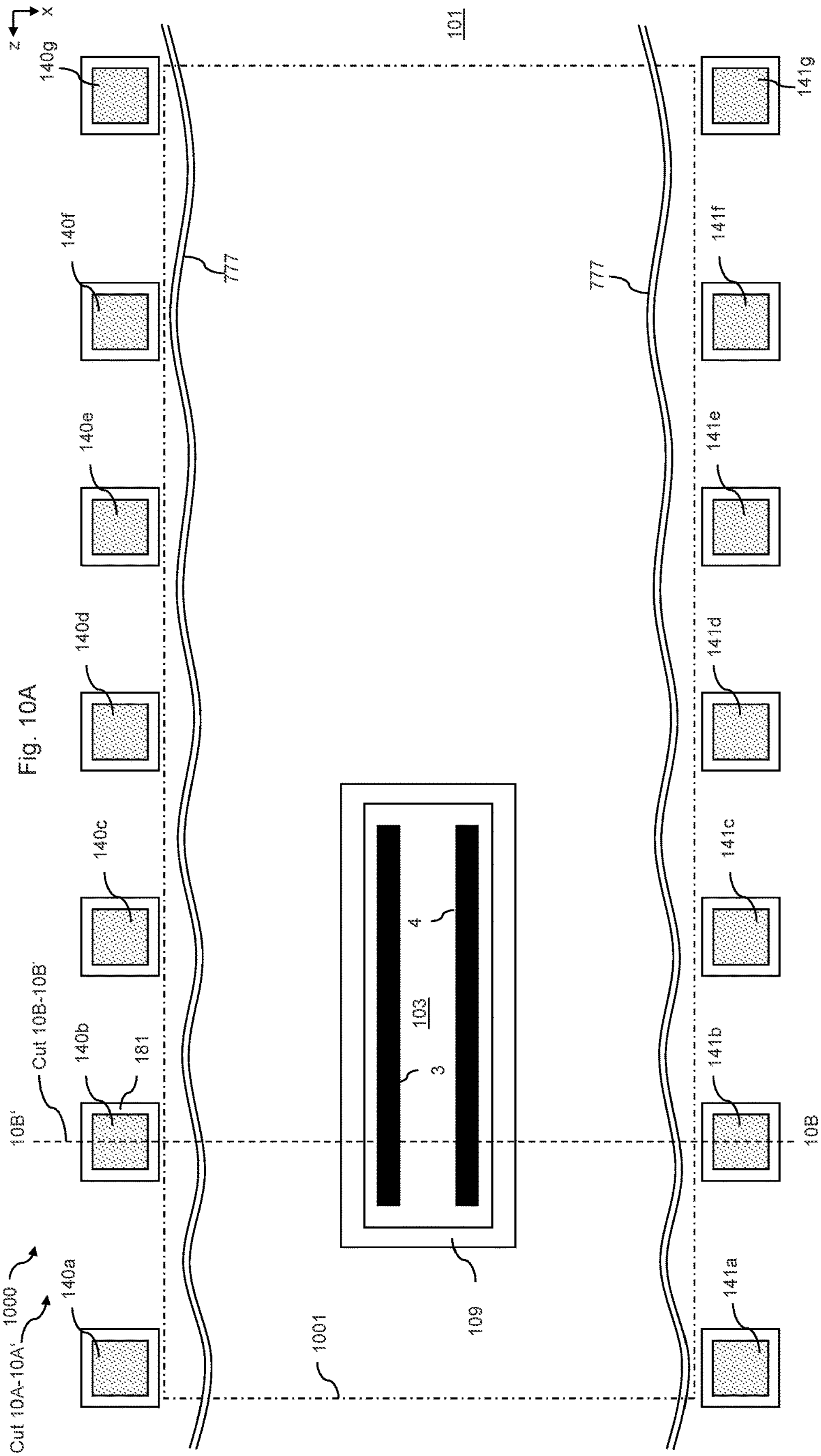
FIG. 10A is a plan view of a Hall integrated sensor, according to still a further embodiment of the present solution.
Figure 10B:
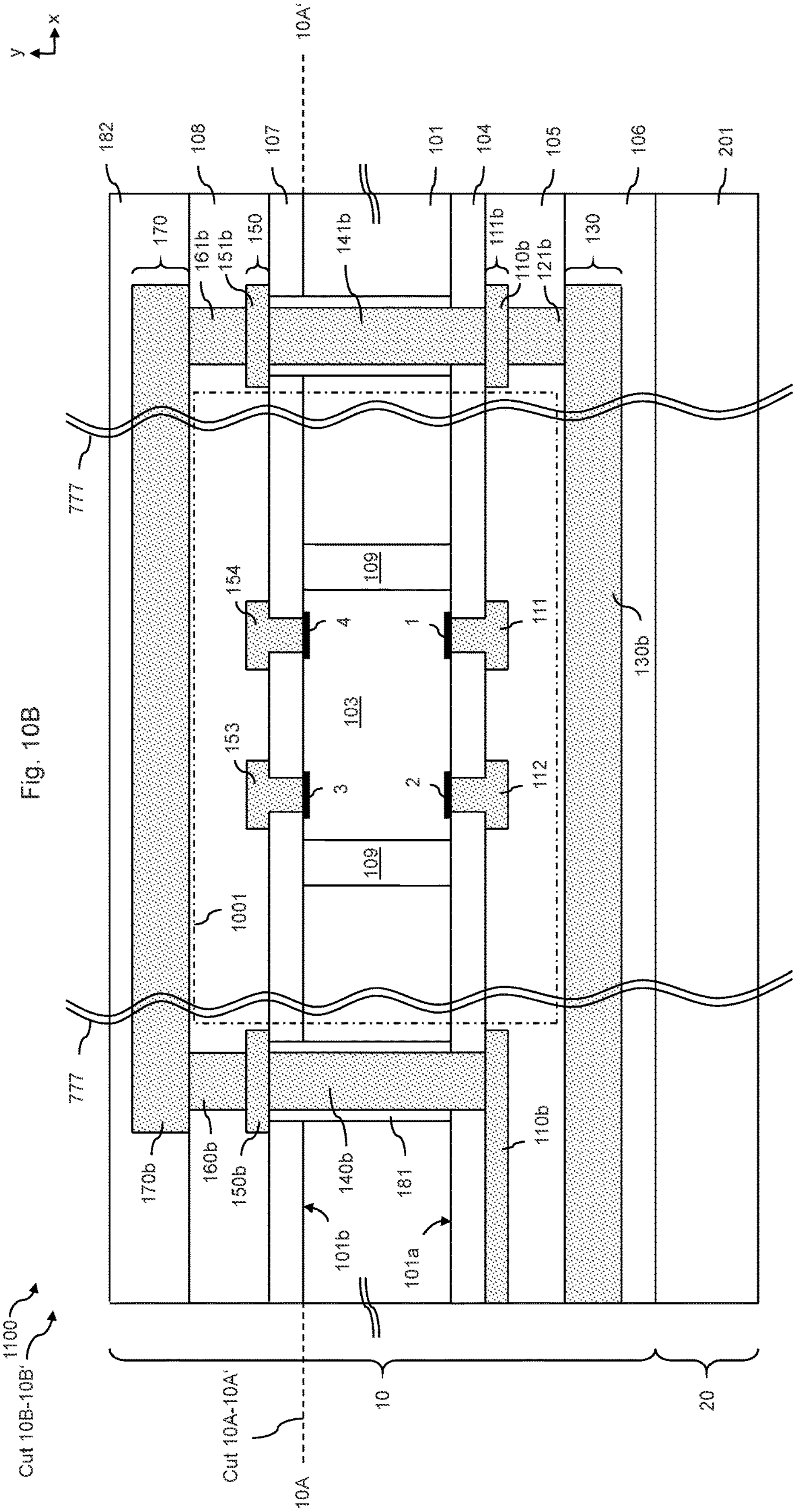
FIG. 10B is a cross-section of the Hall integrated sensor of FIG. 10A.

FIGS. 10A and 10B show a Hall sensor product 1000 with a vertical Hall element and a coil for testing and calibrating of said Hall element. It differs from Hall sensor product 100 only in that the through silicon vias 140*a-g*, 141*a-g* are placed far away (i.e. at a greater distance) from the Hall plate 103. This is indicated by the symbol 777. As a consequence, if a current is fed into the multi-winding coil, the magnetic field induced in the Hall plate 103 is to a large extent created by the lateral segments of the coil windings only, i.e. the metal portions 130*a*, 170*a*, 130*b*, 170*b* and so on. As is known in the art, also with this configuration, a uniform magnetic field can be created in the interior of the coil, provided that the sum of thicknesses of the dielectric layers 107 and 108 on the second side of the substrate 101 is equal to the sum of the thicknesses of the dielectric layers 104 and 105 on the first side of the substrate facing the carrier wafer 20. In other words, a homogeneous magnetic field in the Hall plate 103 can induced, if the vertical distance between metal line 170*b* and the Hall plate 103 is equal to vertical distance between Hall plate 103 and the metal line 130*b*.

Figure 11A:
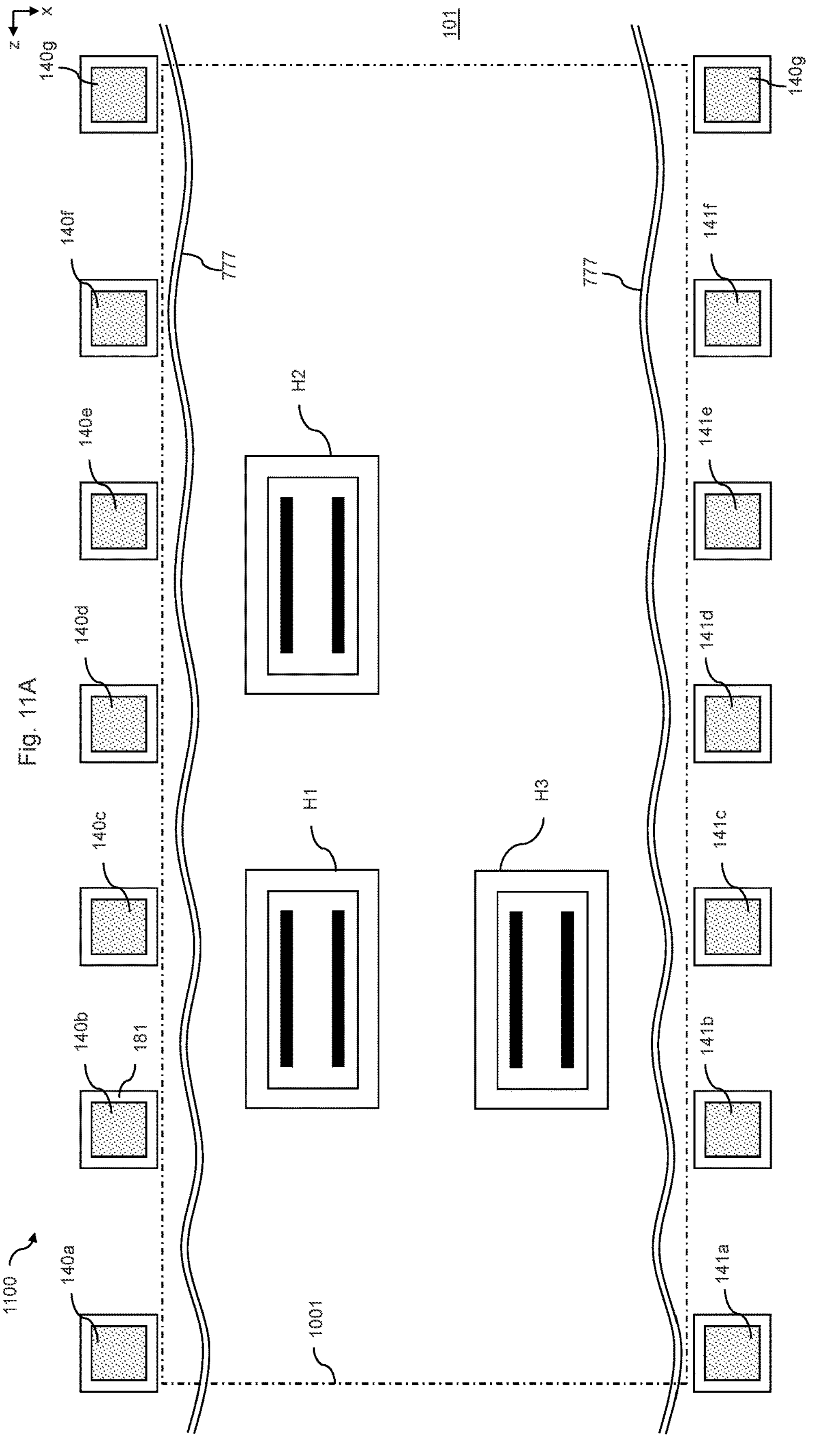
FIGS. 11-14 are plan views of Hall integrated sensors, according to still further embodiments of the present solution.

Hall sensor product 1100 shown in FIG. 11A is equipped with the same coil configuration as Hall sensor product 1000, however, more than one vertical Hall element is placed in the interior of the coil. In FIG. 11A three vertical Hall elements, denoted by H1, H2 and H3, are shown to be placed inside of volume 1001 denoting the interior of the multi-winding coil. FIG. 11A shows a cut along the second surface 101*b* of the substrate 101. The vertical Hall elements H1, H2 and H3 are all placed such that their distance to the through silicon vias 140*a-g*, 141*a-g* is large. The large spacing is indicated by the symbol 777. The vertical Hall elements H1, H2 and H3 are oriented such that they are sensitive to a magnetic field component on z-direction. The Hall plates of the vertical Hall elements H1, H2 and H3 lie entirely in the interior of the multi-winding coil. The multi-winding coil is oriented such that in the interior of the coil a magnetic field can be induced that is homogeneous and directed in z-direction. In FIG. 11A, three vertical Hall elements are shown. This is just by way of example. Generally speaking, a plurality of vertical Hall elements, oriented such that they are sensitive to a magnetic field component in z-direction, could be placed in the interior 1001 of the multi-winding coil, which is itself oriented such that the magnetic field that is induced in its interior, is directed in z-direction. Analogously, a plurality of vertical Hall elements, oriented such that they are sensitive to a magnetic field component in x-direction, could be placed in the interior 1001 of the multi-winding coil, which is itself oriented such that the magnetic field that is induced in its interior, is directed in x-direction. In this way, for each of the two directions, a plurality of vertical Hall elements can be tested and calibrated by one single multi-winding coil. This approach can be extended to the case of the horizontal Hall element. The inner radius of the coil windings 130*a* and 170*a* in Hall sensor product 300 (FIG. 3*a*) can be set large enough, so that a plurality of horizontal Hall elements can be placed inside the two coil windings.

Figure 11B:
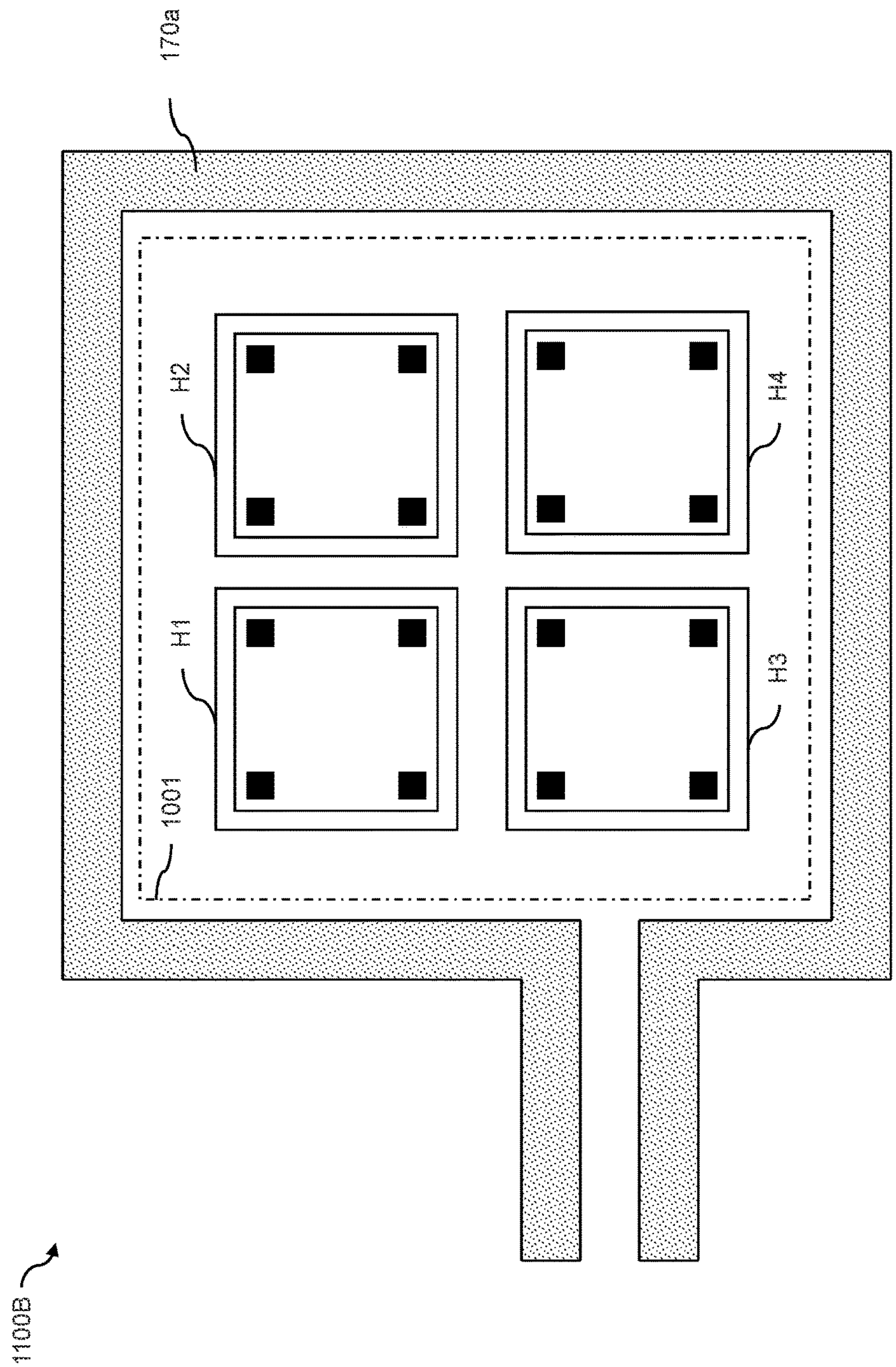

This is shown in FIG. 11B, where, by way of example, four horizontal Hall elements, denoted by H1, H2, H3 and H4, are placed in the interior 1001 of the test and calibration coil. The coil for test and calibration has the winding 170*a* and the winding 130*a* (not shown).

In this way, also a plurality of horizontal Hall elements can be tested and calibrated by one single coil.

Figure 12A:
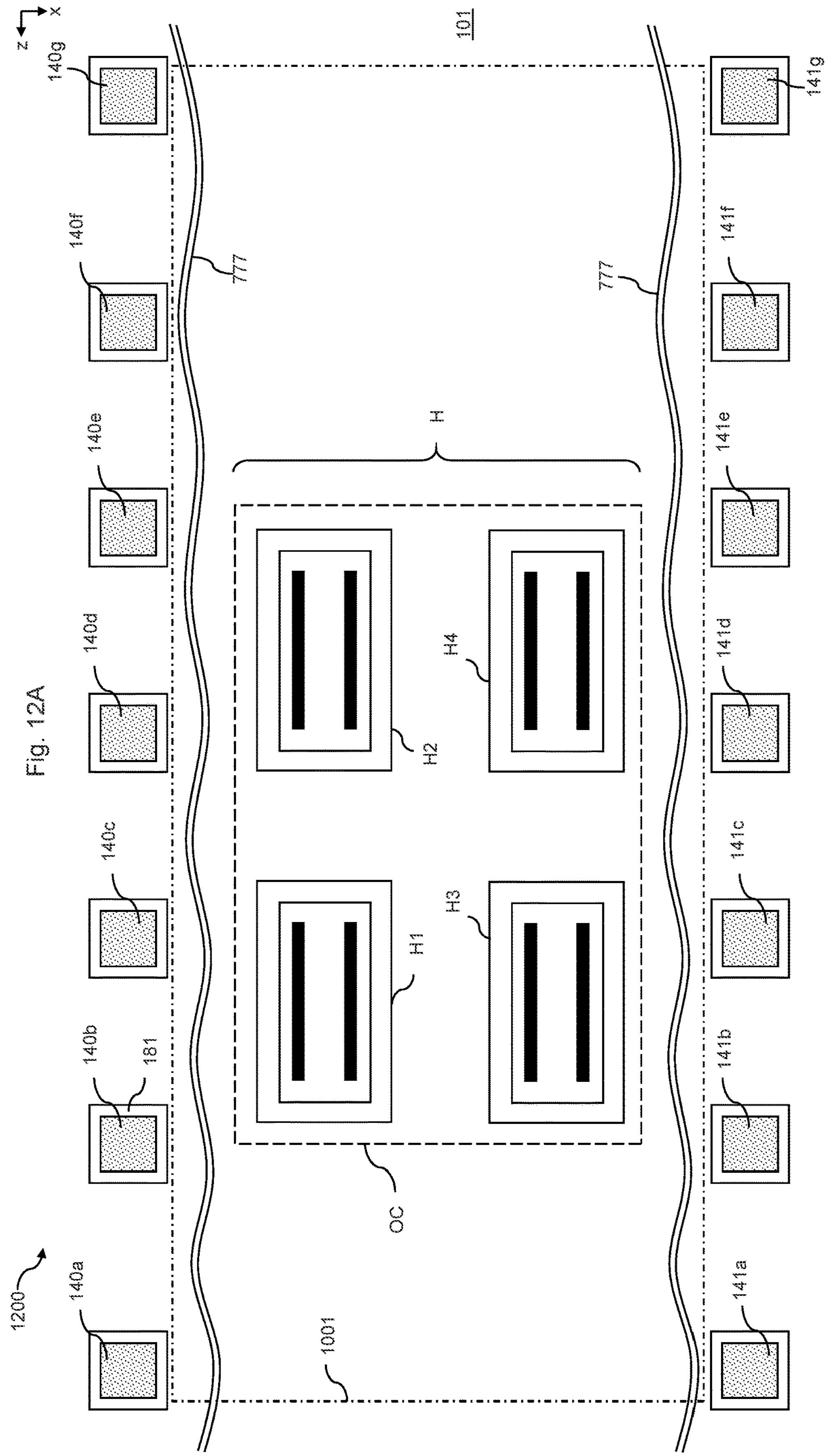
Figure 12B:
Figure 12B:
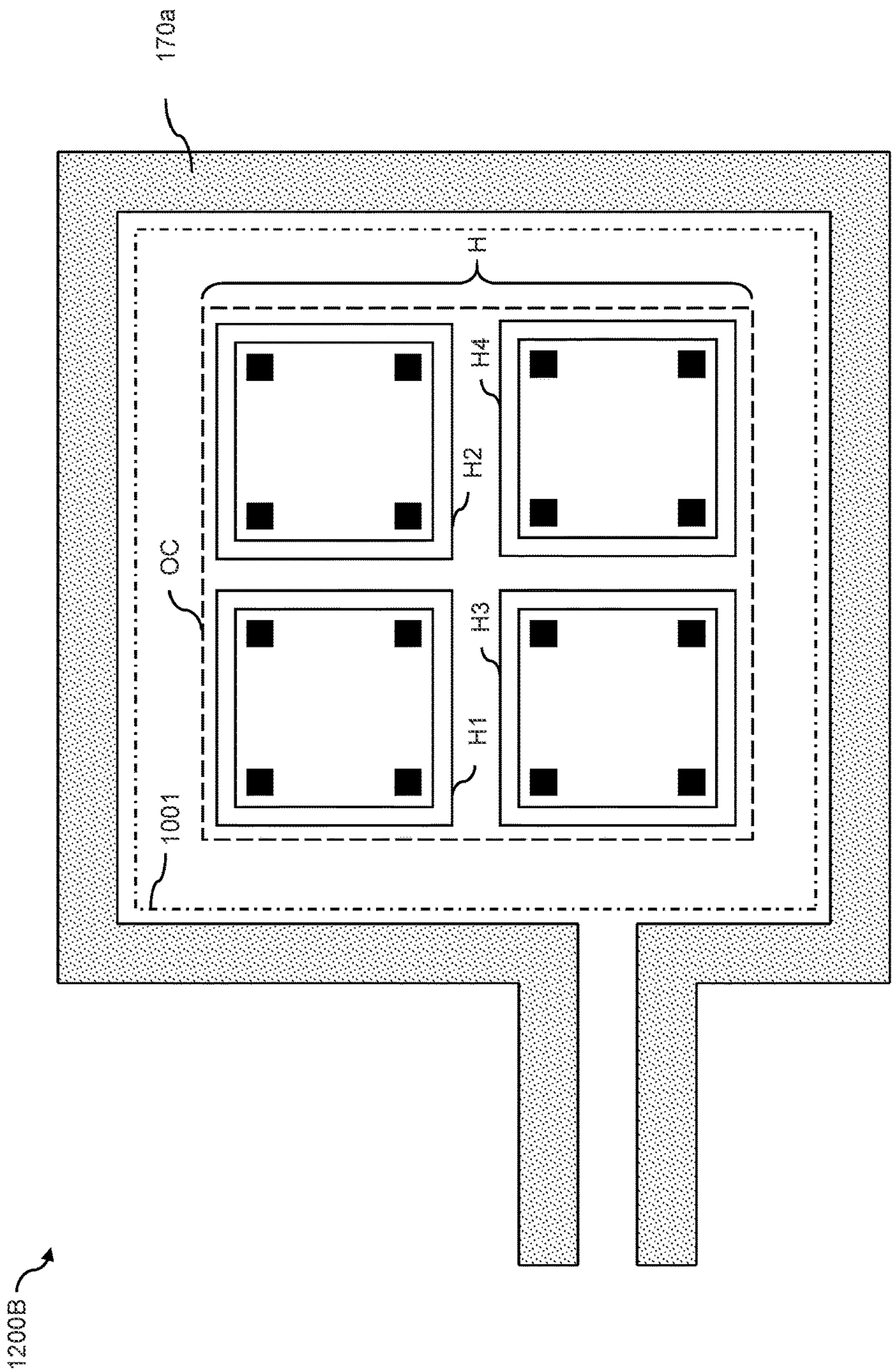

In the Hall sensor product 1200 of FIG. 12A, four vertical Hall elements, denoted by H1, H2, H3 and H4 are placed in the interior 1001 of a multi-winding coil such that they have all large distance to any of the through silicon vias 140*a-g*, 141*a-g*. The four Hall elements H1, H2, H3 and H4 are orthogonally coupled. In FIG. 12A, the orthogonal coupling of the Hall elements H1, H2, H3 and H4 is denoted by OC. The orthogonal coupling results in new Hall element or Hall sensor H. The orthogonal coupling of the four Hall elements H1, H2, H3 and H4 requires a variety of electrical connections including electrical connections between metal layers on the first side of the substrate facing the carrier 20 and metal layers on the second side of the substrate. A portion of the electrical connections may be formed outside of the multi-winding coil. However, the Hall plates 103 of all four Hall elements are placed inside of the interior 1001 of the multi-winding coil. The Hall sensor H is tested and calibrated by this multi-winding coil. In FIG. 12A, vertical Hall elements are depicted that are sensitive to a magnetic field component in z-direction. This is only by way of example. In FIG. 12A, four Hall elements are orthogonally coupled, however, also only two Hall elements could be orthogonally coupled to results in a new Hall element or Hall sensor H. Moreover, two or four horizontal Hall elements could be orthogonally coupled and be tested and calibrated by a suitable coil as discussed above. This is shown in FIG. 12B.

Figure 13:
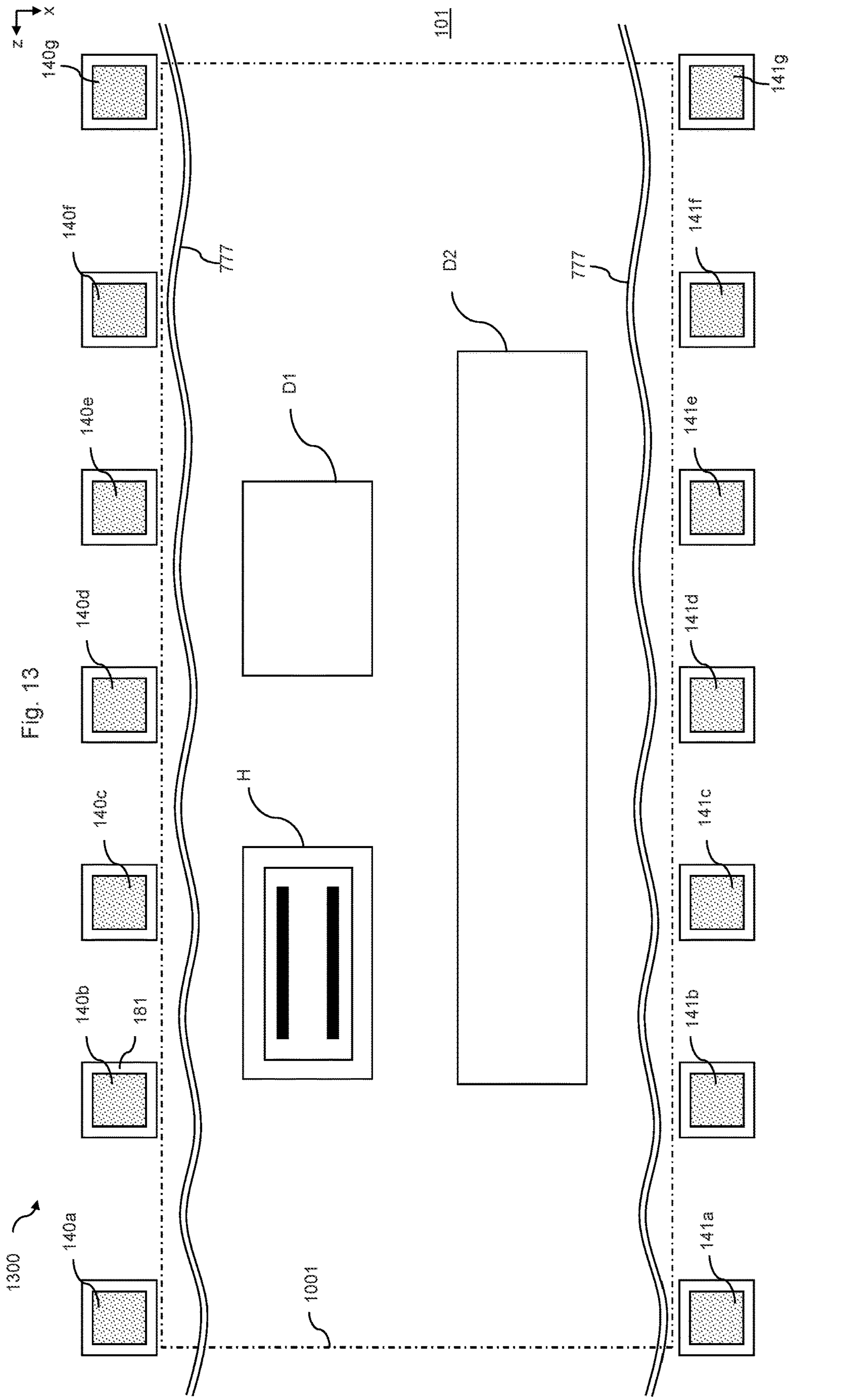

In Hall sensor product 1300 of FIG. 13, other devices are placed inside of the multi-winding coil together with the Hall element H. By way of example, a vertical Hall element H is depicted in FIG. 13, which is oriented such that Hall element is sensitive to a magnetic field component along the z-axis. The through silicon vias 140*a-g*, 141*a-g* belong to multi-winding coil suitable to induce in its interior a homogeneous magnetic field in z-direction. The Hall plate of the Hall element H lies in the inner volume 1001 of that multi-winding coil. D1 and D2 denote further semiconductor devices other than Hall elements. In the Hall sensor product 1300, the space inside of a large multi-winding coil dedicated for test and calibration of Hall elements is used for other devices as well.

Figure 14:
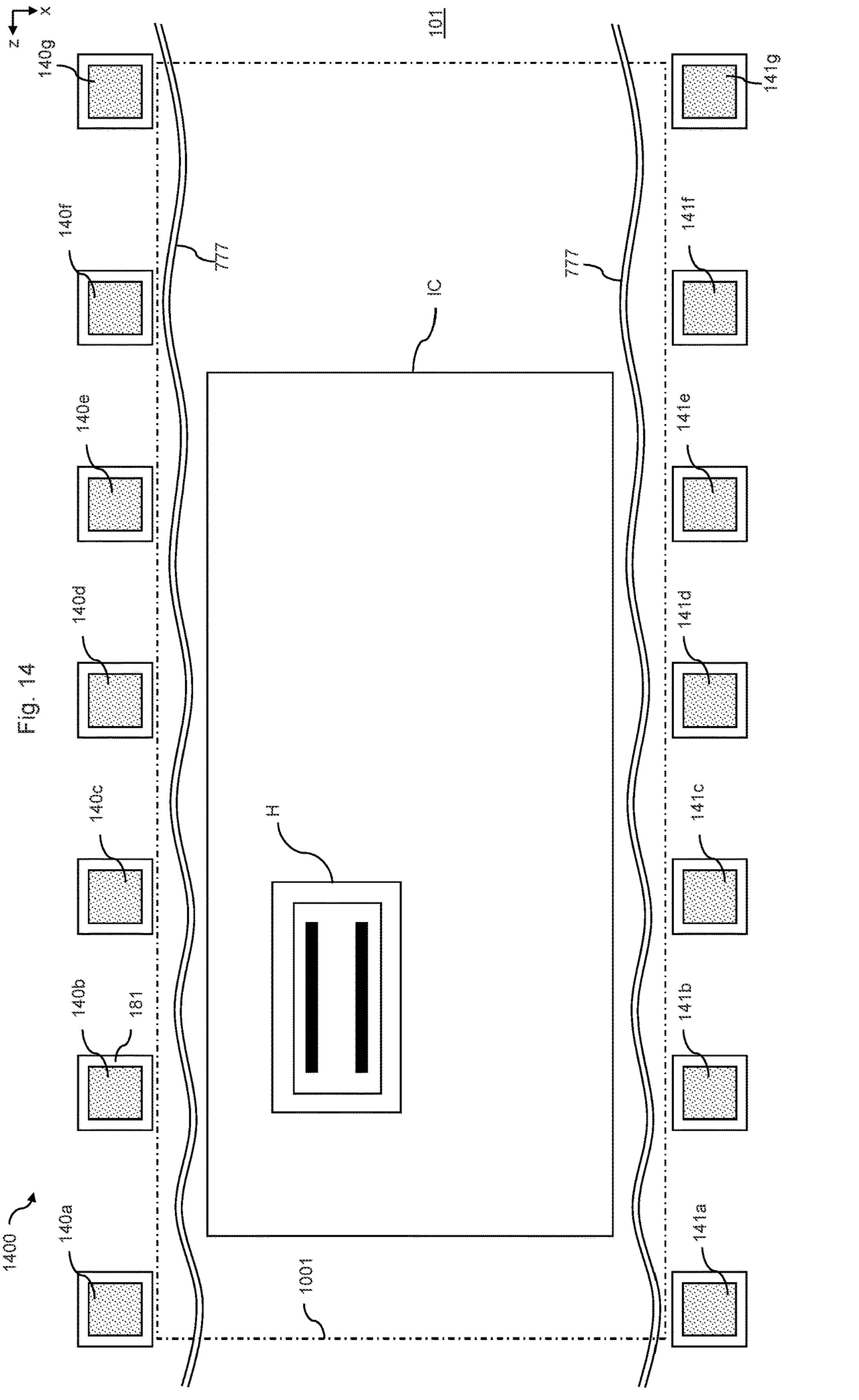

In Hall sensor product 1400 of FIG. 14, an entire Hall IC is placed inside of a multi-winding coil. In FIG. 14, the Hall IC, denoted by IC, comprises a vertical Hall element H oriented such that vertical Hall element is sensitive to the z-component of a magnetic field. Hall IC and Hall element H are placed in the interior 1001 of a multi-winding coil, which is oriented such that in its interior a homogeneous magnetic field in z-direction is induced. The Hall IC may comprise more than one vertical Hall element sensitive for the z-component of a magnetic field. The underlying idea of Hall sensor product can be extended also to the case of a Hall IC comprising a horizontal Hall element and a coil for test and calibration thereof.

Figure 15A:
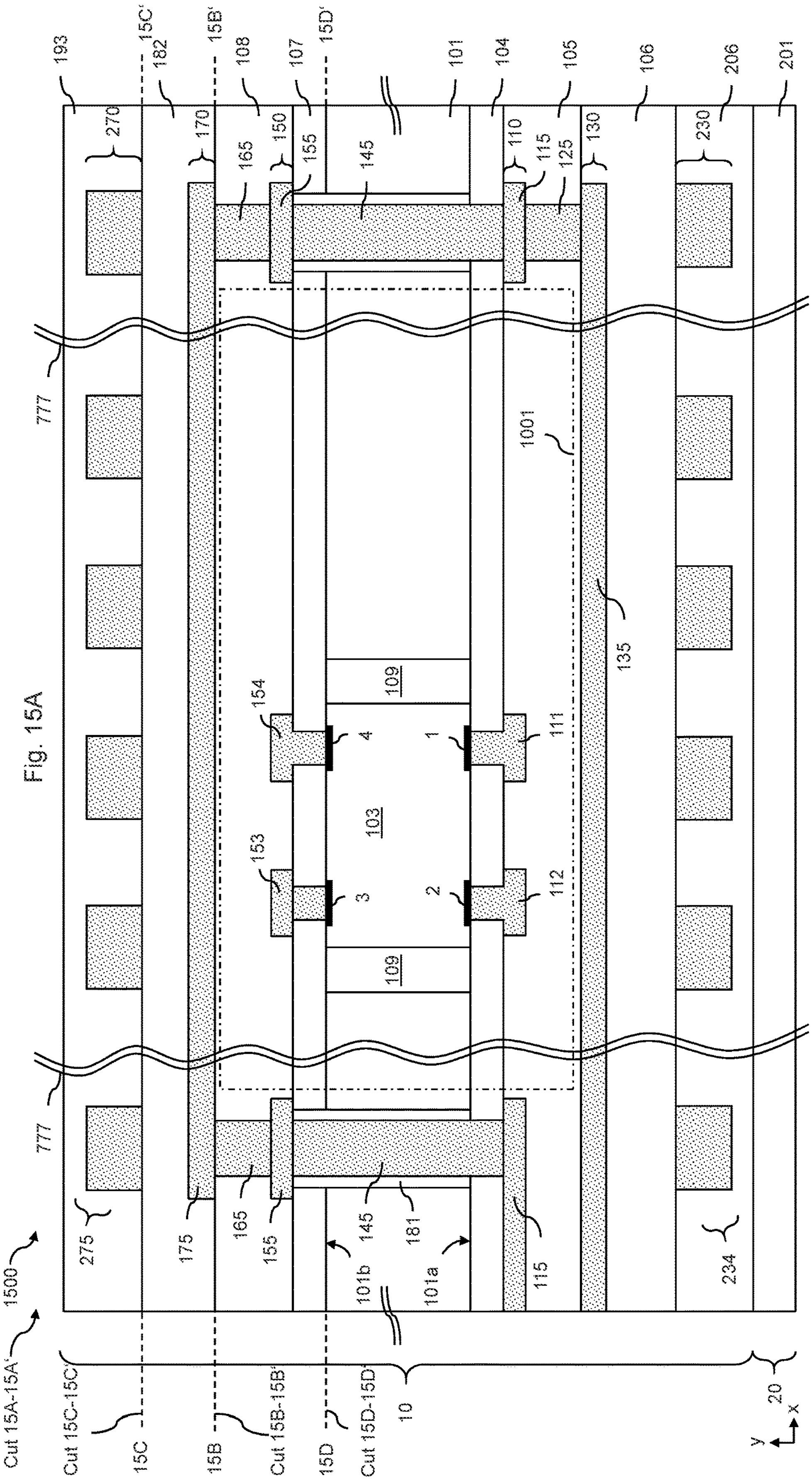
FIG. 15A is a cross-section of a Hall integrated sensor, according to still a further embodiment of the present solution.
Figure 15B:
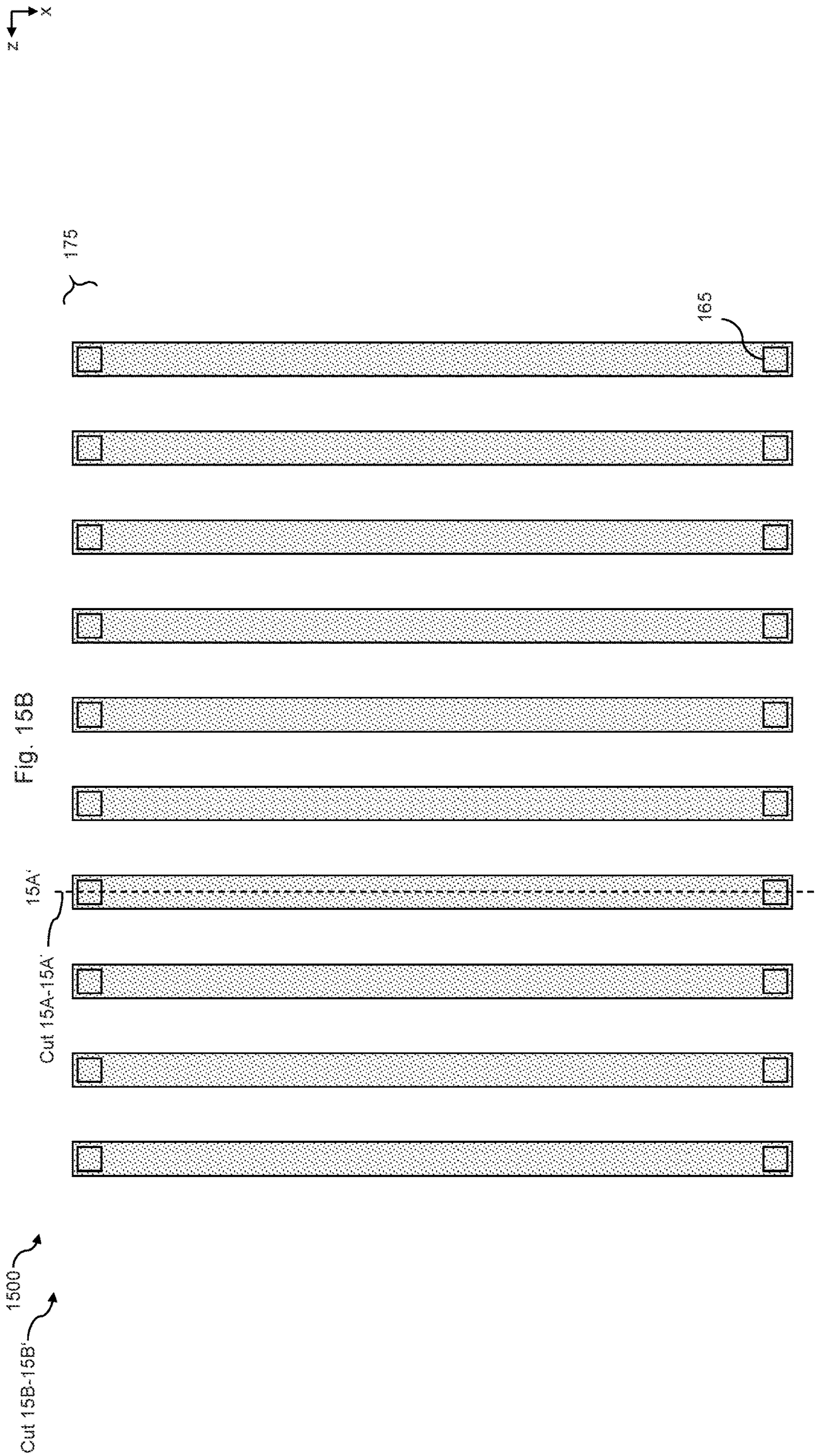
FIGS. 15B-15D are plan views of the Hall integrated sensor of FIG. 15A.
Figure 15C:
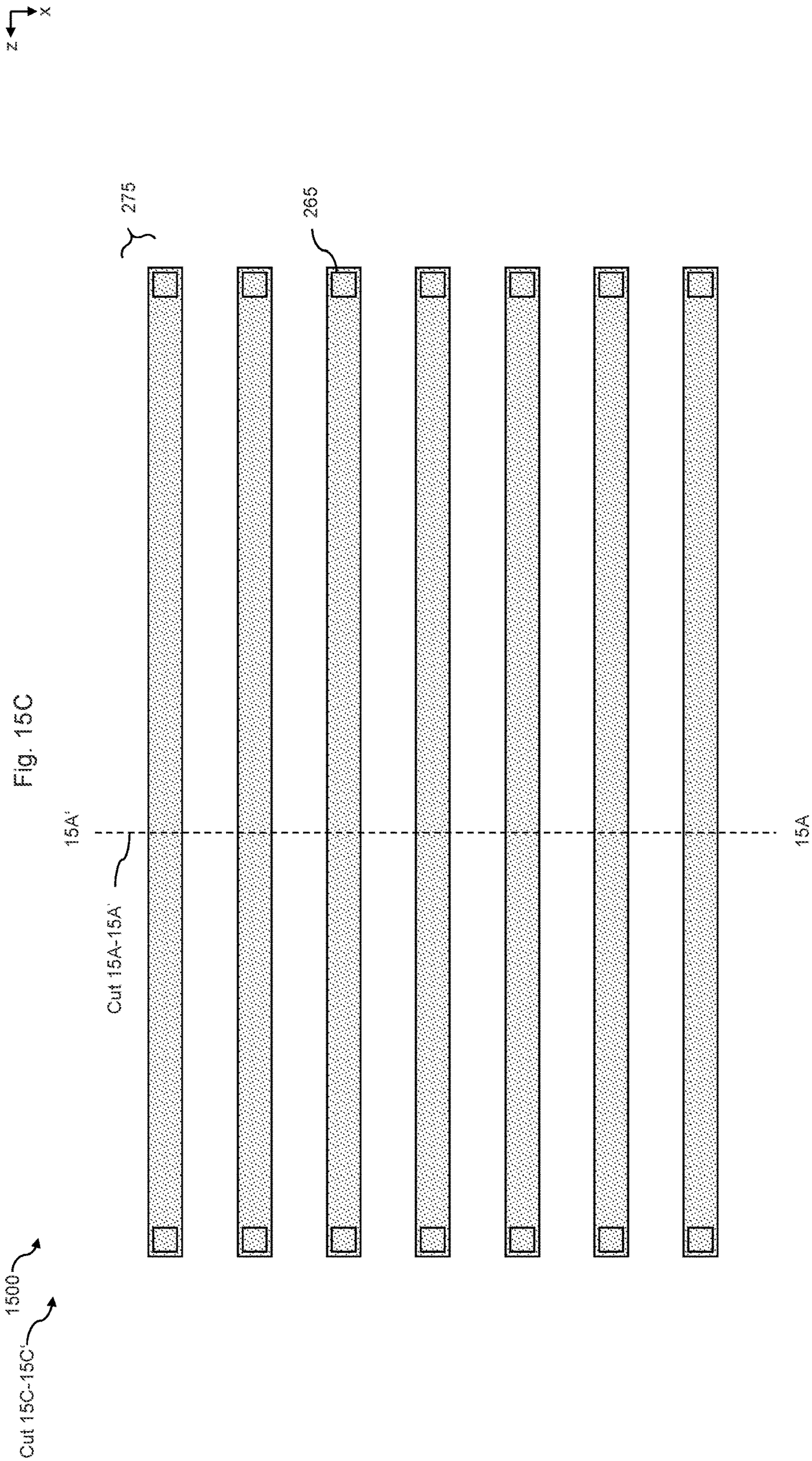
Figure 15D:
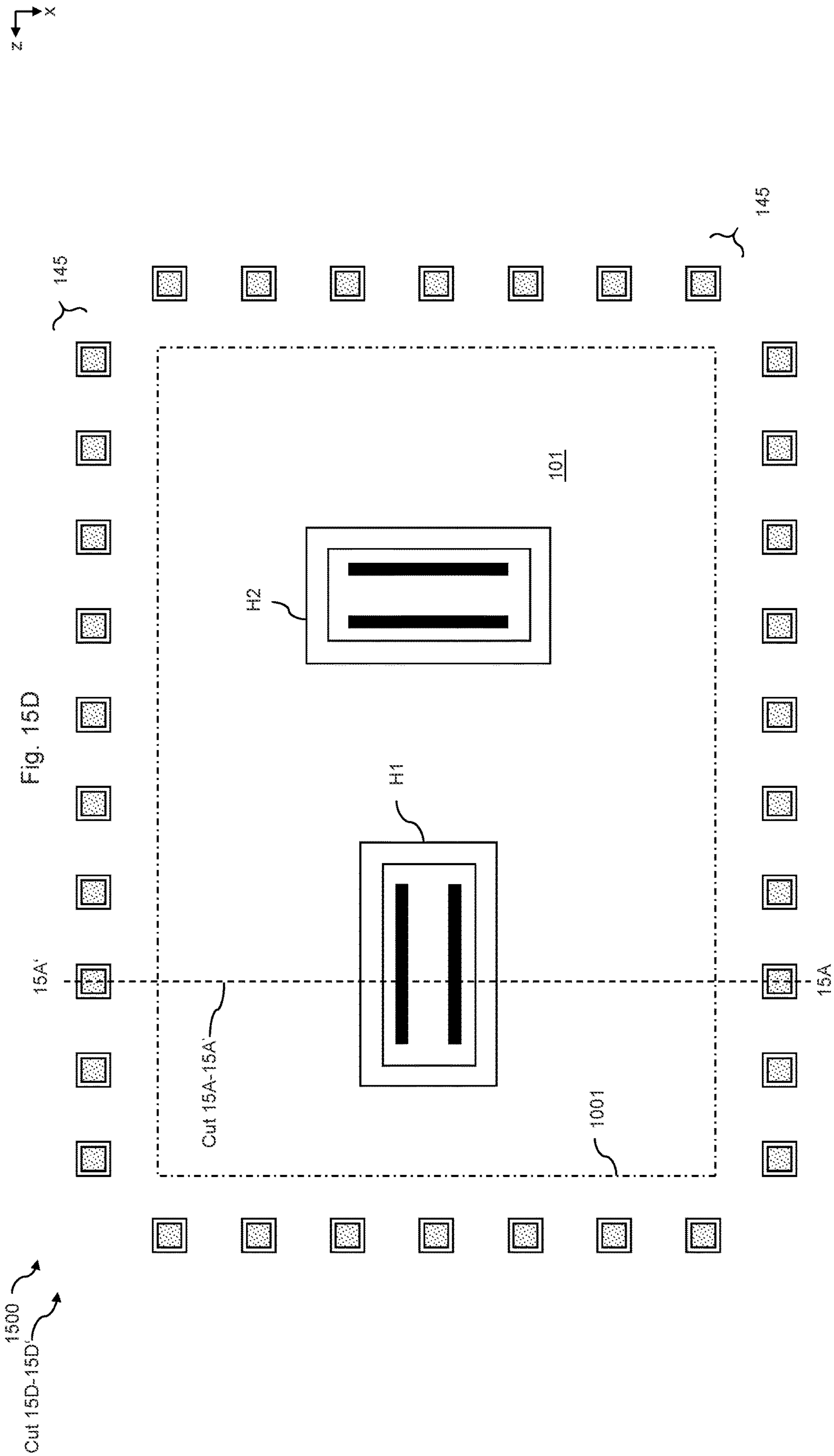

Another Hall sensor product 1500 is shown in FIGS. 15A, 15B, 15C and 15D. In FIG. 15A, which is a cross-sectional image of Hall sensor product 1500 parallel to the x-y plane, a vertical Hall element is shown with the Hall plate 103 disposed in the substrate 101 and with Hall terminals 1, 2, 3, and 4. The depicted vertical Hall element is sensitive to the z-component of an external magnetic field. A winding loop of a first coil is shown, which is formed by the metal portions 115 (left and right), the through silicon vias 145 (left and right), the metal portions 155 (left and right), the vias 165 (left and right), the via 125, and the metal bars 175 and 135. As indicated by 777, the vertical segments of the first coil are spaced at a great distance, i.e. far away, from the vertical Hall element depicted in FIG. 15A. If a current is fed through this coil, whose windings are, as shown, parallel to the x-y plane, a magnetic field in z-direction is induced in the interior of the coil. Moreover, at the location of the depicted vertical Hall element, i.e. far away from the through silicon vias 145, the magnetic field is induced predominantly by current flow through the metal bars 135 and 175. A third metal layer 230 is disposed on the first side of the substrate 101 facing the carrier 20, and also on the second side of the substrate a third metal layer 270 is disposed. By means of metal layers 230 and 270 a second multi-winding coil is formed, whose orientation in the x-z plane is rotated by 90 degree with respect to the first coil. FIG. 15B is an aerial image showing the orientation of the metal bars 175 parallel to the x-z plane (cut 15B-15B'). FIG. 15C is an aerial image showing the orientation of the metal bars 275 parallel to the x-z plane (cut 15C-15C'). The vertical segments of the second coil are not shown in any figure, however, from FIG. 6 it is obvious, how these vertical segments can be established. In FIG. 15A, 1001 denotes the inner volume shared by the first (inner) and the second (outer) multi-winding coil. If a current I1 is fed into the first coil, a magnetic field in z-direction is induced in volume 1001. If a current I2 is fed into the second coil, a magnetic field in x-direction is induced in volume 1001. By proper adjustment of the currents I1 and I2, the absolute value of the magnetic field in z-direction and absolute value of the magnetic field in x-direction can be equal. FIG. 15*d* gives another cut of Hall sensor product 1500 parallel to the x-z plane, this time along the second surface 101*b* (cut 15D-15D'). Two vertical Hall elements H1 and H2 are placed in the interior 1001 of the two multi-winding coils, one oriented such that it sensitive to a magnetic field in z-direction (H1) and one oriented such that it is sensitive to a magnetic field in x-direction (H2). The vertical Hall element H1 is tested and calibrated by the first (inner) coil and the vertical Hall element H2 is tested and calibrated by the second (outer) coil.

Figure 16:
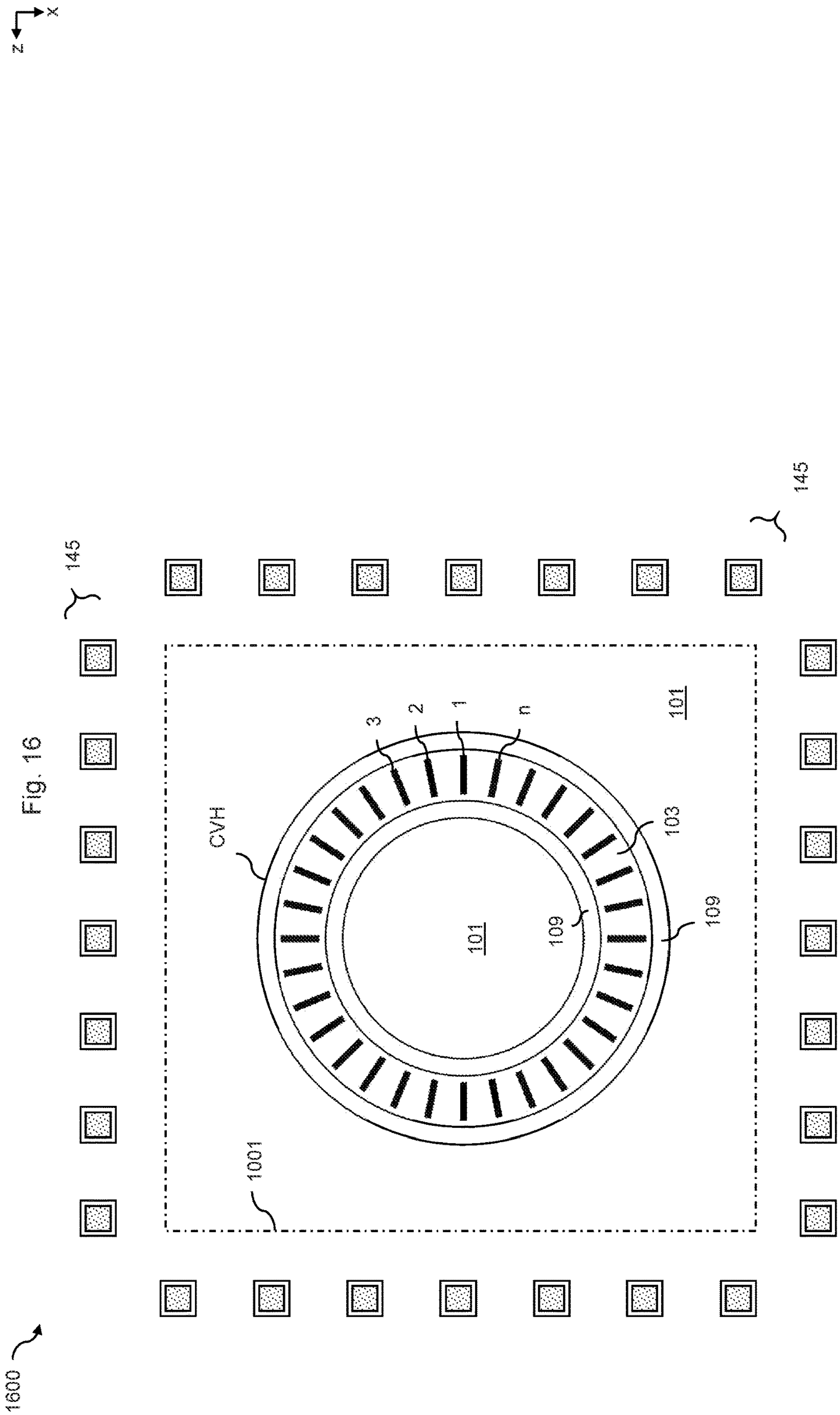
FIGS. 16-18 are plan views of a Hall integrated sensor, according to still a further embodiment of the present solution.

The coil configuration of Hall sensor product 1500 is used in Hall sensor product 1600, see FIG. 16, to test and calibrate a circular vertical Hall element. FIG. 16 shows a cut of Hall sensor product 1600 along the second surface 101*b*. 145 denote the plurality of through silicon vias belonging to the first (inner) and the second (outer) multi-winding coil. The inner volume shared by the two coils is denoted by 1001. A circular vertical Hall element CVH is placed inside of the two coils such that the Hall plate 103 lies entirely within the volume 1001. The Hall plate 103 has a ring shape and is laterally confined by two dielectric structures denoted both by 109. A plurality of n Hall terminals 1, 2, 3, . . . , n is formed in the Hall plate on the second surface 101*b* of substrate 101 as shown. A second plurality of Hall terminals 1', 2', 3', . . . , n' might be formed on the first surface 101*a* of the substrate. The circular vertical Hall element CVH is sensitive to an external magnetic field in the x-z plane, i.e. parallel to the surfaces 101*a* and 101*b* of the substrate. This type of vertical Hall element is particularly useful for angular position measurement applications. The circular vertical Hall element CVH is tested and calibrated by the combined operation of the first (inner) and second (outer) multi-winding coil.

Figure 17:
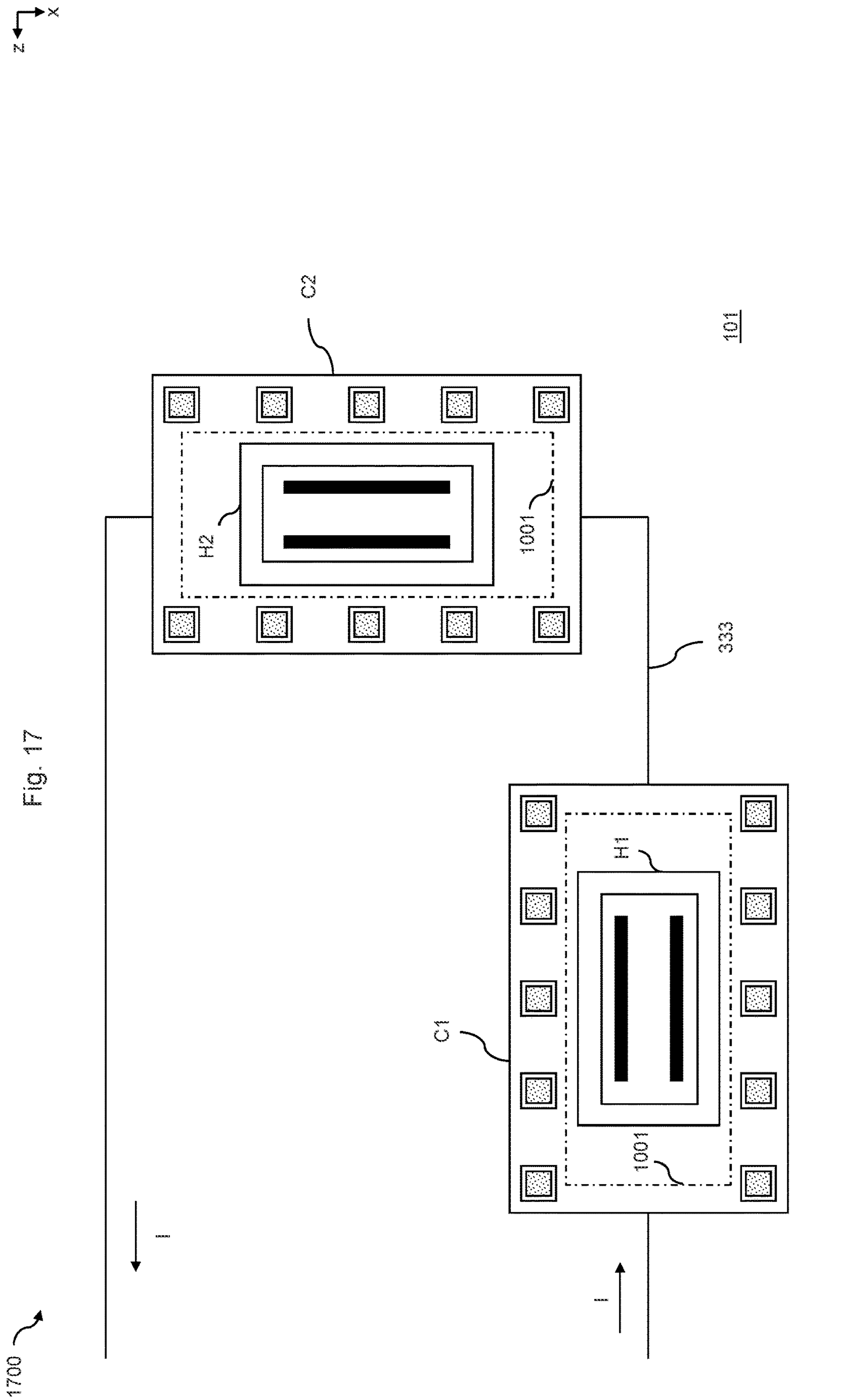

In Hall sensor product 1700 of FIG. 17 two coils for test and calibration of Hall elements are put in series. Referring to FIG. 17, a first coil denoted by C1 is shown. A vertical Hall element H1 C1 is placed in the interior 1001 of coil C1. The vertical Hall element is oriented such that it is sensitive to an external magnetic field in z-direction. The coil C1 is dedicated to test and calibrate the vertical Hall element. As such, the coil windings of coil C1 are oriented such that a magnetic field in z-direction is induced its interior 1001. C2 denotes a second coil. A second vertical Hall element H2 is depicted, which is placed in the interior 1001 of coil C2. The vertical Hall element H2 is oriented such that it is sensitive to an external magnetic field in x-direction. The coil C2 dedicated to test and calibration of vertical Hall element H2 is oriented accordingly. The two coils C1 and C2 are in series and the Hall elements H1 and H2 can be tested or calibrated simultaneously. The underlying idea of Hall sensor product 1700 applies to the case of three or more coils for test and calibration in series. In particular, it could be considered to have three coils C1, C2 and C3, wherein C1 are C2 are used to test and calibrate two vertical Hall elements as shown in FIG. 17, and C3 is used to test and calibrate a horizontal Hall element. In this way, a 3D Hall sensor can be tested and calibrated by a coil set up consisting of a series connection of three coils C1, C2, and C3, one for each direction in space.

Figure 18:
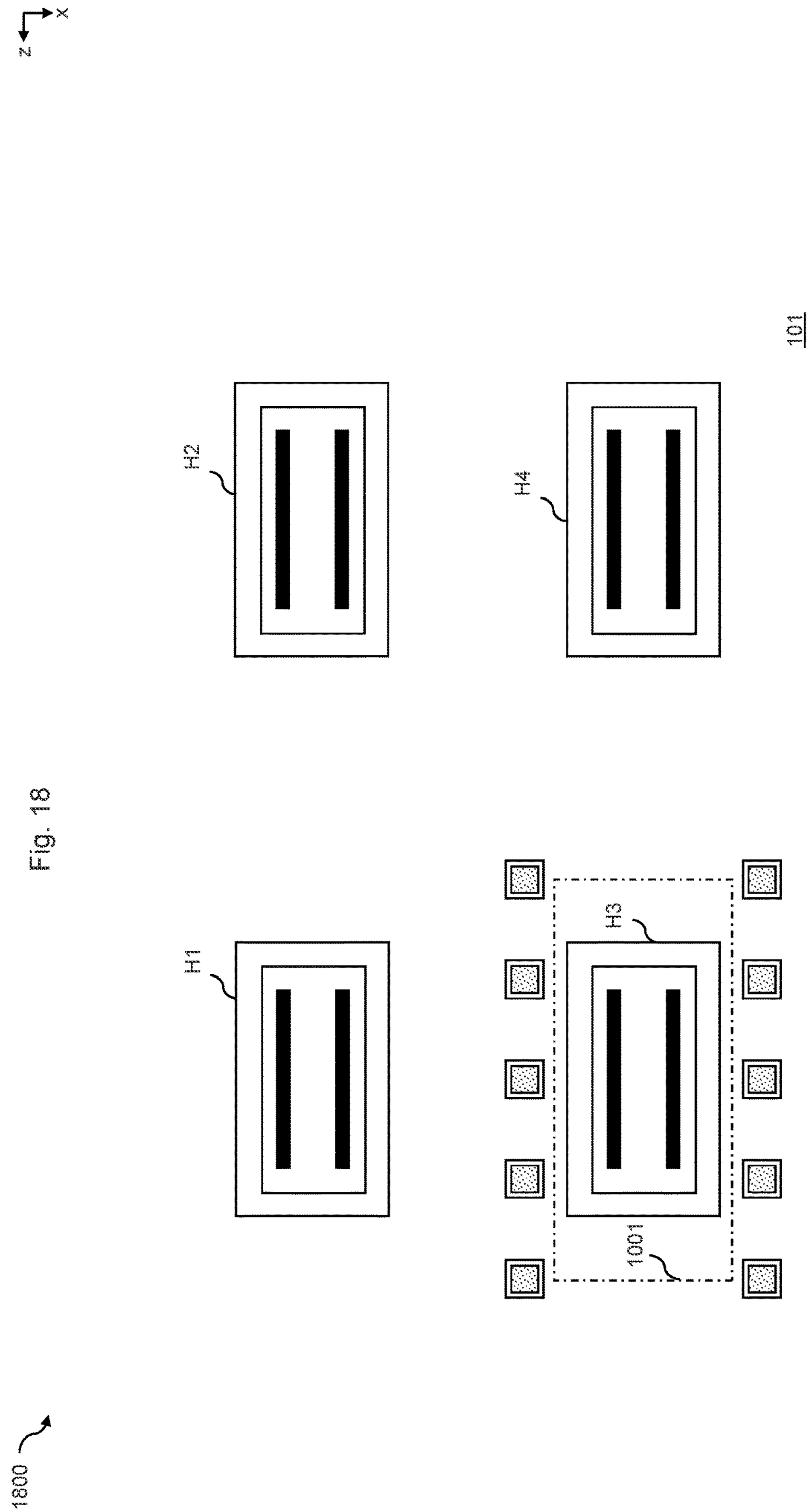

Hall sensor product 18 shown in FIG. 18 comprises a plurality of identical Hall elements, where only a subset of the identical Hall elements is equipped with on-chip coils for test and calibration. Referring to FIG. 18, four vertical Hall elements H1, H2, H3 and H4 are shown by way of example. Only the vertical Hall element H3 is placed in the interior 1001 of a multi-winding coil. The underlying concept applies also to a plurality of identical horizontal Hall elements.

Figure 19:
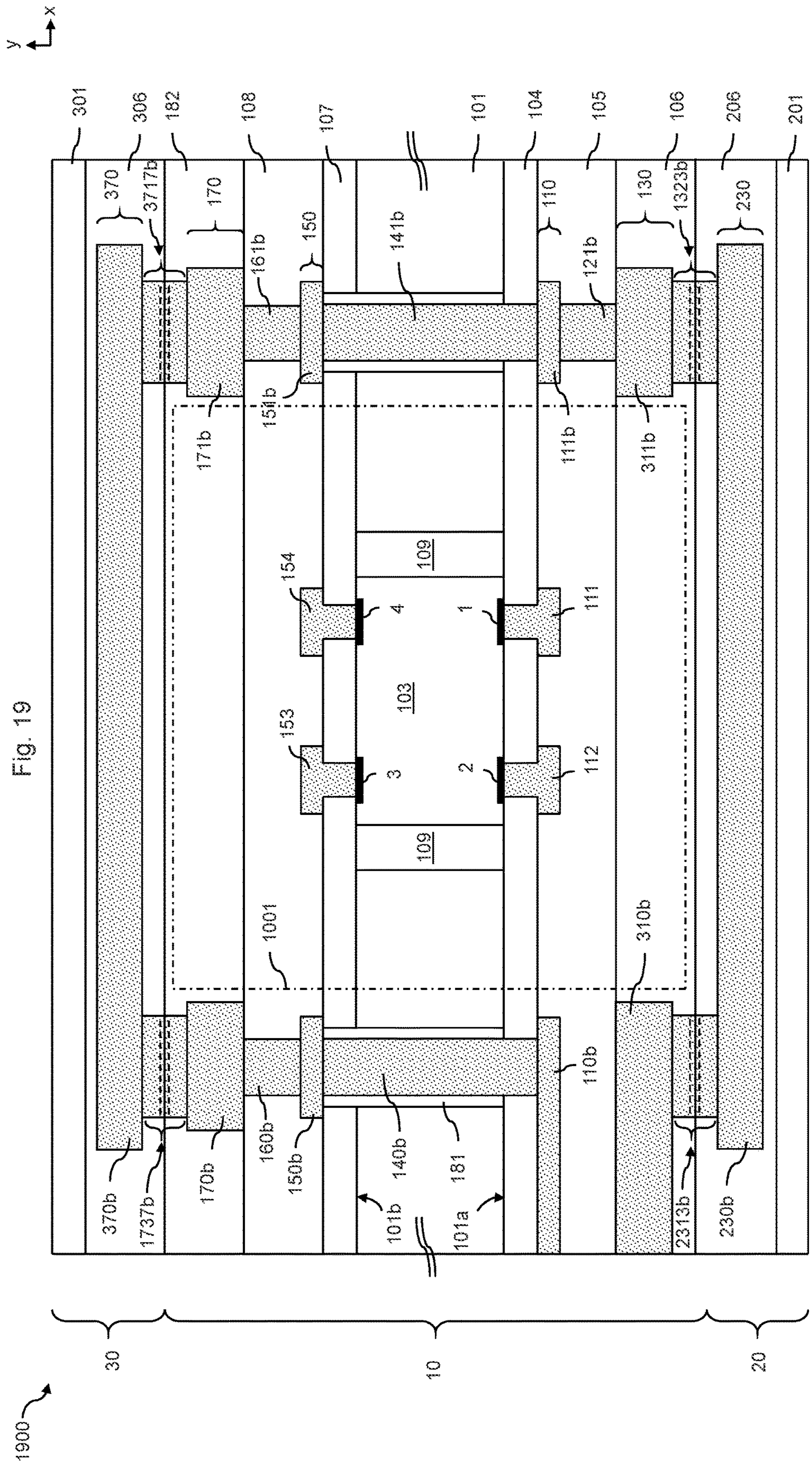
FIGS. 19-20 are cross-sections of a Hall integrated sensor, according to still further embodiments of the present solution.

Another Hall sensor product 1900 is shown in FIG. 19, which is a cross-sectional image. A vertical Hall element is formed on a substrate 101 belonging to the wafer 10. The Hall plate 103 is disposed in the substrate 101. The dielectric structure 109 confines the Hall plate laterally. Hall terminals 1 and 2 are formed at the first surface 101*a* and Hall terminal 3 and 4 are formed on the second surface 101*b* of substrate 101. Wafer 10 with is attached onto wafer 20 with its first surface 101*a* facing the carrier 20. In Hall sensor product 1900 the carrier 20 is a structured wafer as well, for instance, 20 is a CMOS wafer. In FIG. 19, the wafer 20 comprises a substrate 201 and at least one metal layer 230 disposed in the dielectric layer 206. Electrical connections between metal layer 130 of substrate 101 and metal layer 230 of substrate 201 can be established by way of hybrid bonding. By this technique known in the art, a direct bonding between dielectric layers (oxide) 106 and 206 is achieved, while electrical connections are established by copper-to-copper bonding. In FIGS. 19, 2313*b* and 1323*b* denote such copper-to-copper bonds. Other techniques for wafer-stacking are known in the art and could be use in Hall sensor product 1900 as well. A third wafer 30 is provided, which has the substrate 301 and at least one metal layer 370 embedded in dielectric layer 306. The wafer 30 is attached onto wafer 10 which the dielectric layer 306 facing the dielectric layer 182 of wafer 20. Electrical connections between wafer 30 and wafer 20 are established preferably in the same fashion as the electrical connections between wafer 20 and wafer 10, so for instance again by the hybrid bonding technique as shown in FIGS. 19. 1737*b* and 3717*b* denote copper-to-copper bonds between substrates 101 and 301. As is further shown in FIG. 19, a coil for test and calibration of the vertical Hall element is formed, which extends over all three wafers 10, 20, and 30. In particular, the lateral segments 370*b* and 230*b* of the coil are formed by metal layers of wafers 30 and 20, respectively. The Hall plate 103 of the vertical Hall element lies in the interior 1001 of the multi-winding coil extending of the three wafers 10, 20 and 30. The underlying concept of Hall sensor product 1900 can be applied also to case of horizontal Hall element. In this case a first spiral coil would be formed by metal layer 230 of substrate 201. As second spiral coil would be formed by metal layer 370 of substrate 301. In order to connect the two spiral coils in series, electrical connections between the wafer are required as well as a through silicon via. It could be the same kind of structure shown and discussed in conjunction with FIG. 19.

Figure 20:
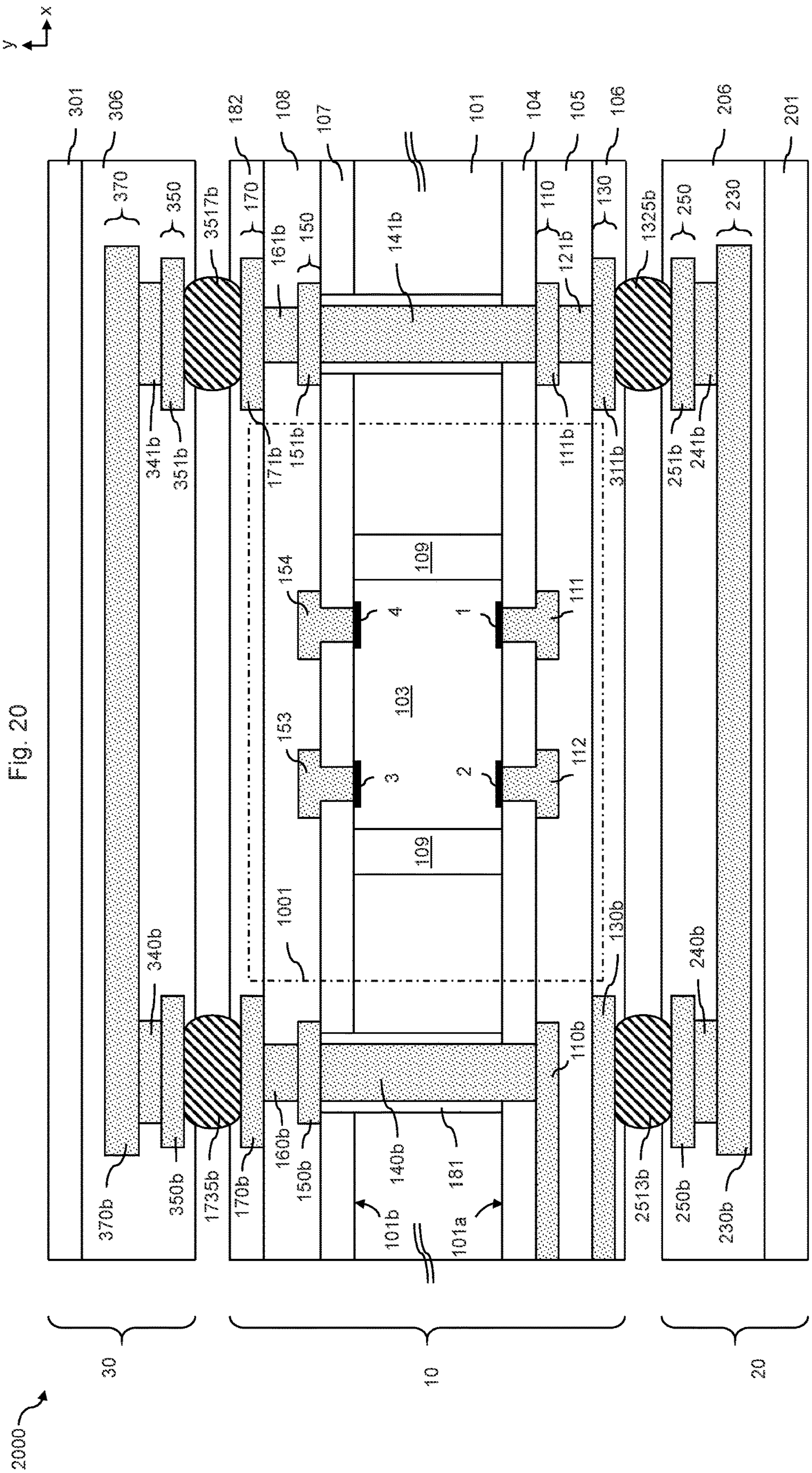

Hall sensor product 2000 of FIG. 20 is another Hall sensor product, where the coil for test and calibration of a Hall element extends over three substrates. However, in contrast to Hall sensor product 1900, the three substrates are not stacked on a wafer-level, but on a die-level. In other words, the connections are accomplished after singulation in the assembly process. Referring to FIG. 20, a vertical Hall element is formed on a substrate 101. The Hall plate 103 is disposed in the substrate 101. The dielectric structure 109 confines the Hall plate laterally. Hall terminals 1 and 2 are formed at the first surface 101*a* and Hall terminal 3 and 4 are formed on the second surface 101*b* of substrate 101. The processing on the second side of the substrate 201 requires a carrier wafer. However, this carrier wafer is a temporary carrier and as such not part of the final Hall sensor product. In FIG. 20, the temporary is not shown anymore. After completion of the manufacturing process of substrate 101, substrate 101 is singulated into dies. In FIG. 20, 10 denotes a single die comprising at least one vertical Hall element. Another die 20 is provided comprising a substrate 201 and at least two metal layers 230 and 250 embedded in the dielectric layer 206. Further, another die 30 is provided comprising a substrate 201 and at least two metal layers 370 and 350 embedded in the dielectric layer 306. The electrical connections between die 10 and die 20 are established by copper or solder bumps such as the bumps 2513*b* and 1325*b* shown in FIG. 20. Similarly, the electrical connections between die 30 and die 20 are established by copper or solder bumps such as the bumps 1735*b* and 3517*b* shown in FIG. 20. Such assembly processes are known in the art and may deviate in a couple of aspects and details from the foregoing discussion. Referring again to FIG. 20, a coil for test and calibration of the vertical Hall element is formed, which extends over die 30, die 10 and die 20. In particular, the lateral segments of the coil 230*b* and 370*b* are formed by metal layers of substrate 201 and 301, respectively. Like in Hall sensor product 1900, the underlying concept of Hall sensor product 2000 can be applied also to case of horizontal Hall element. In this case a first spiral coil would be formed by metal layer 230 of substrate 201 (die 20). A second spiral coil would be formed by metal layer 370 of substrate 301 (die 30). The electrical series connection of the spiral coils would have the same structure as the vertical segments of the coil shown in FIG. 20.

Manufacturing process steps of the Hall sensor product 100 of FIGS. 1A-1C are now disclosed by way of example, with reference to FIGS. 21A to 22M.

Figure 21A:
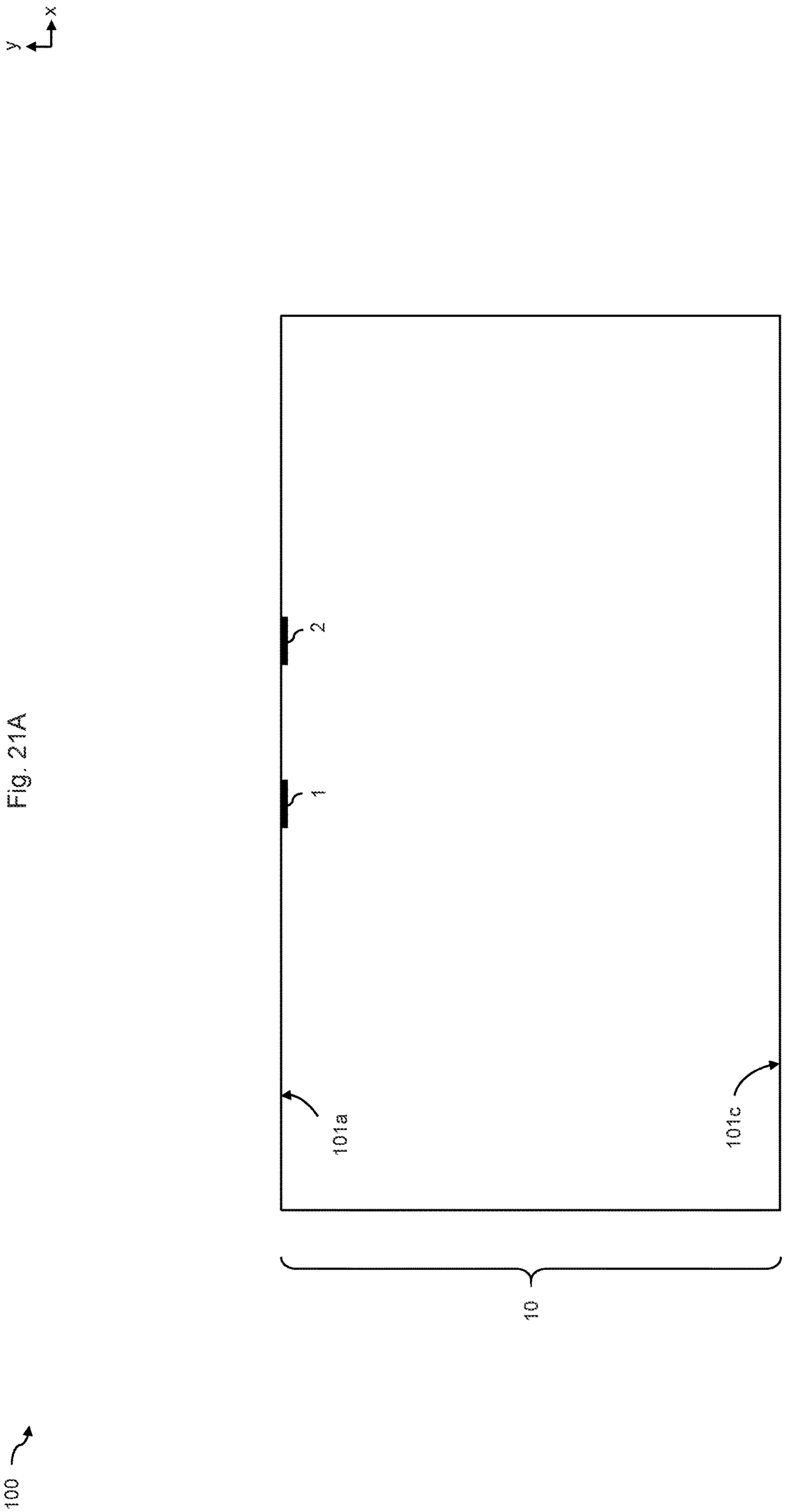
FIGS. 21A-21M are cross-sections of the integrated Hall sensor in successive steps of a corresponding manufacturing process.

As shown in FIG. 21A a wafer 10 is provided comprising a semiconductor substrate 101, having a first surface 101*a* and a second surface 101*c*. The substrate 101 is preferably a silicon substrate of the first conductivity type, which is preferably n-type. At the first surface 101*a* two shallow and highly doped regions 1 and 2 are formed having the first conductivity type. The two highly doped regions 1 and 2 extend from the surface 101*a* into the semiconductor substrate 101. The highly doped regions 1 and 2 are created by a photo-masked implantation followed by resist removal and laser thermal annealing. The highly doped regions 1 and 2 have n-type conductivity and extend to the surface 10*b*. The doping concentration might be in the range of 1020 atoms/cm3 to 1022 atoms/cm3. In laser thermal annealing, the wafer is subjected to very short heat pulses so that the heat can penetrate in the silicon only to a limited depth depending on the pulse time, energy dose and wavelength. The depth of the highly doped region might be in the range of 50 nanometers to 200 nanometers.

Figure 21B:
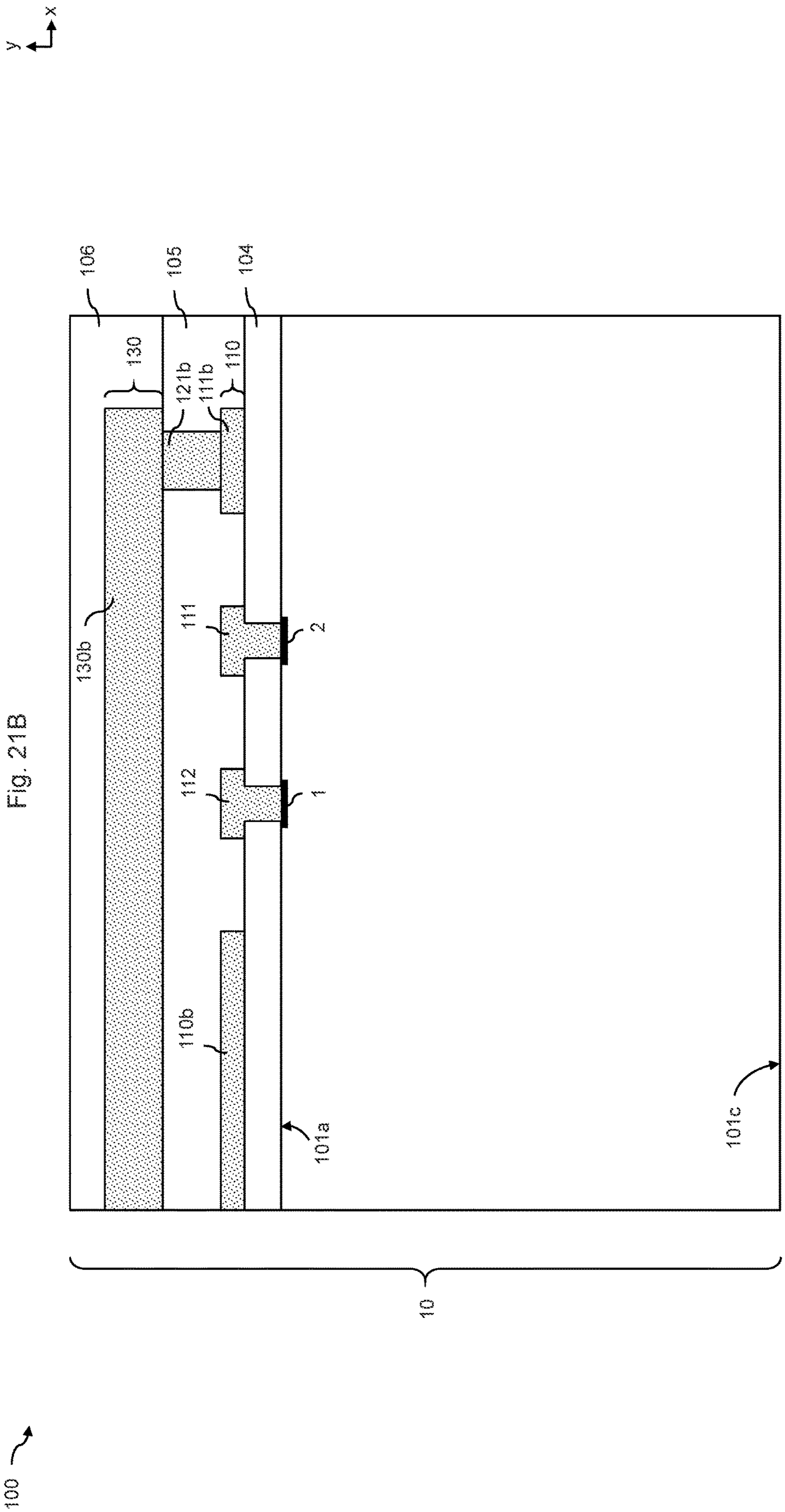

As depicted in FIG. 21B, a dielectric layer 104 is deposited on the surface 10*b*. The dielectric layer might be tetraethyl orthosilicate (TEOS) deposited by plasma enhanced chemical vapor deposition (PECVD). By a photo-masked etching process, a first and a second openings are etched through the oxide layer 104 such that the highly doped region 1 becomes exposed. A first metal layer 110 is deposited on the dielectric layer 104. The first metal layer 110 is structured by a photo-masked etching step as shown in FIG. 21B leaving the portions 110*b*, 112, 111 and 111*b* and filling the two openings underneath the portions 111 and 112, such that the metal is in contact with the exposed highly doped silicon regions 1 and 2. The metal layer is preferably an aluminum-based metal stack typically comprising a titanium adhesion layer, a titanium nitride barrier layer, an aluminum layer and titanium nitride cap layer. A second dielectric layer 105 is deposited on top of the metal structure 110 and the exposed oxide layer 104. The second dielectric layer 105 is planarized by chemical-mechanical polishing (CMP). A silicon via 121*b* is etched by anisotropic dry etch through the dielectric layer 105 stopping selectively at the titanium nitride barrier layer of the metal structure 111*b*. The silicon via is filled with a tungsten-based layer. A second metal layer 130, preferably of aluminum-based or copper-based layer, is deposited on the dielectric layer 105 and is structured to leave the portion 130*b*. Then a third dielectric layer 106 is deposited on top of the second metal layer 130*b* and of the exposed second dielectric layer 105. The third dielectric layer 106 is planarized by chemical-mechanical polishing (CMP).

Figure 21C:
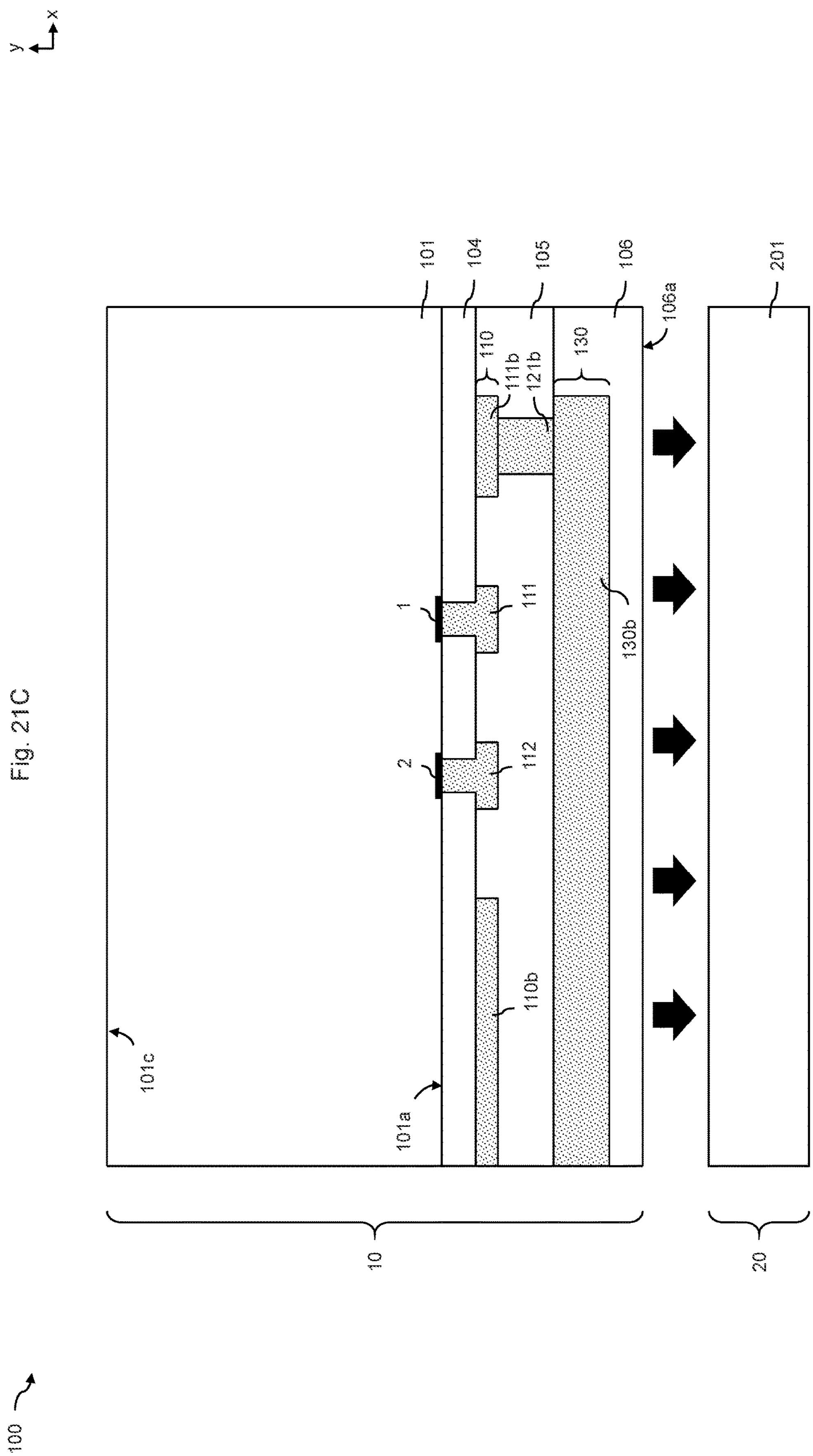
Figure 21D:
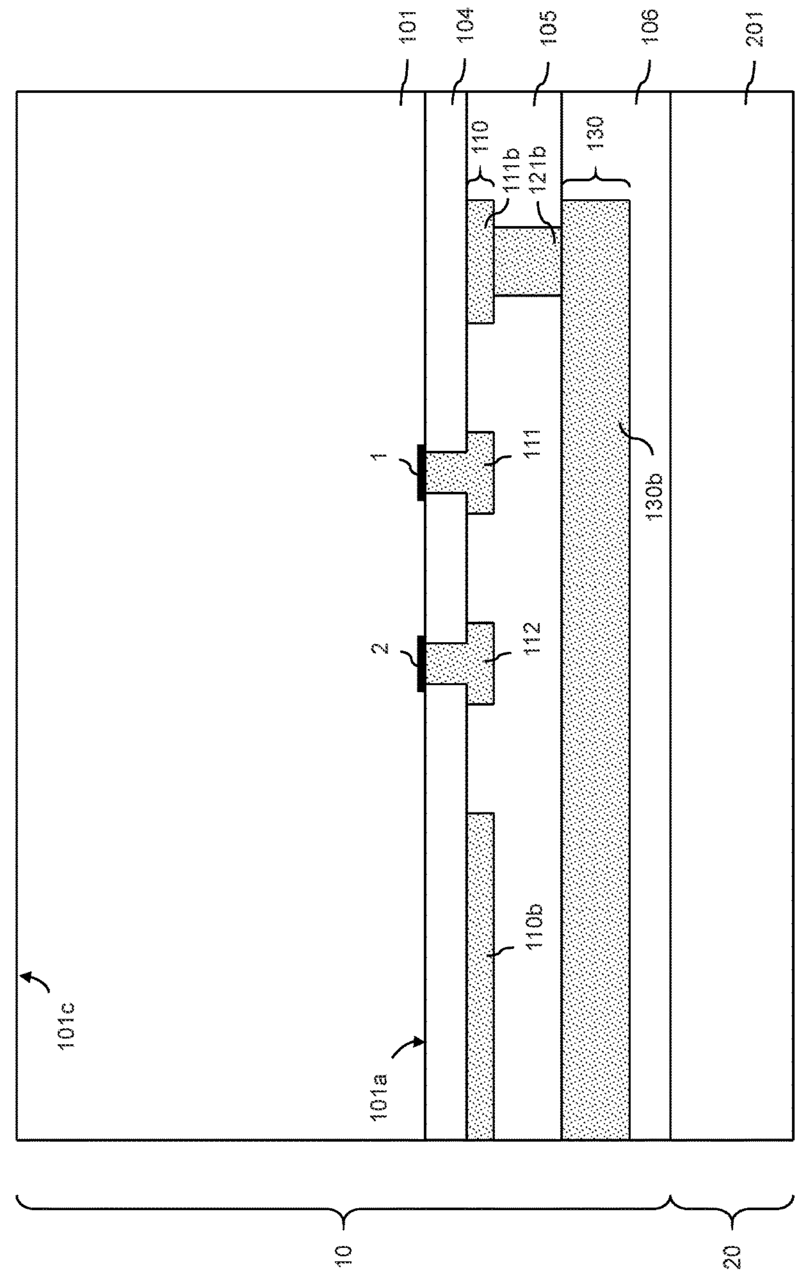

Turning to FIGS. 21C and 21D, the wafer 10 is flipped and attached with the third dielectric layer surface 106*a* onto the surface of a second wafer 20. The second wafer 20 may be a carrier wafer, or a CMOS wafer containing the integrated circuits required for operating the vertical Hall element. A permanent bond is achieved between wafer 10 and wafer 20. There are several methods for permanent wafer bonding known in the art. One example of a bonding process is described in the above mentioned international application WO 2020/104998 A1 in the name of the present Applicant. Using the CMOS wafer 20 as a carrier wafer, the Hall sensor wafer 10 is processed from its rear surface 101*c*.

Figure 21E:
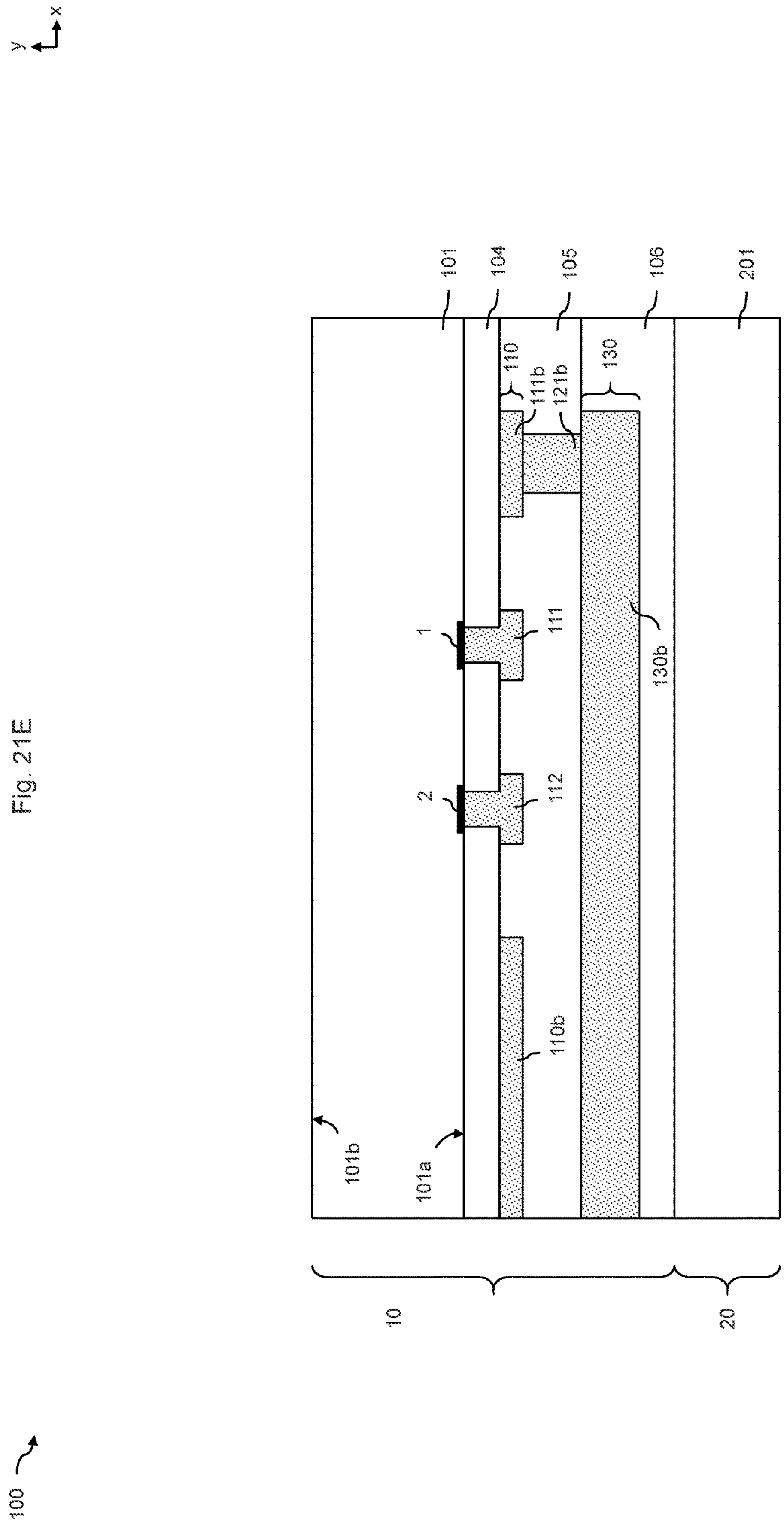

As shown in FIG. 21E, the wafer 10 is thinned from the rear side removing most of the silicon material. The resulting second substrate surface of wafer 10 after thinning is denoted by 101*b*. The thickness of the remaining semiconductor substrate 101 might be preferably in the range of 10 to 50 micrometers.

Figure 21F:
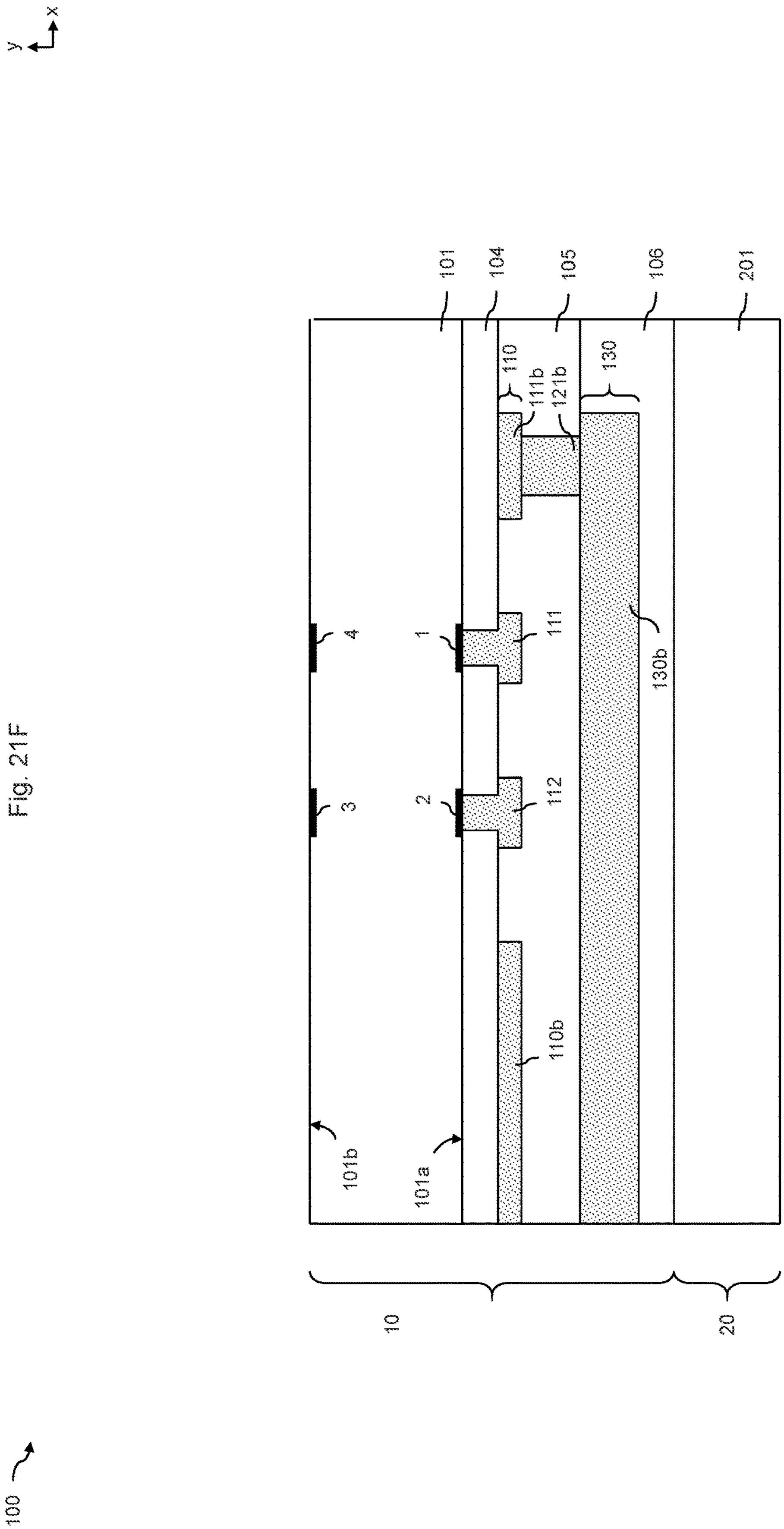

Continuing with FIG. 21F, shallow and highly doped regions 3 and 4 having n-type conductivity are formed on the second surface 101*b* in the identical fashion as the highly doped region 1 and 2 on the first surface. Particularly, the same implant species, implant dose and energy are used as were used on the first surface to create the doping region 1 and 2. More particularly, the same laser thermal annealing condition is applied after resist removal as was applied on the first surface for activating doping regions 1 and 2. As will be understood by a skilled person in the art, by using laser thermal annealing for the dopant activation on the second surface, the aluminum-based metallization on the first surface of Hall sensor wafer 10 can be prevented from being ruined by heat treatment, in contrast to other activation methods such as furnace annealing or rapid thermal processing. Moreover, the laser thermal annealing does not add to the thermal budget of the devices formed on the CMOS wafer 20.

Figure 21G:
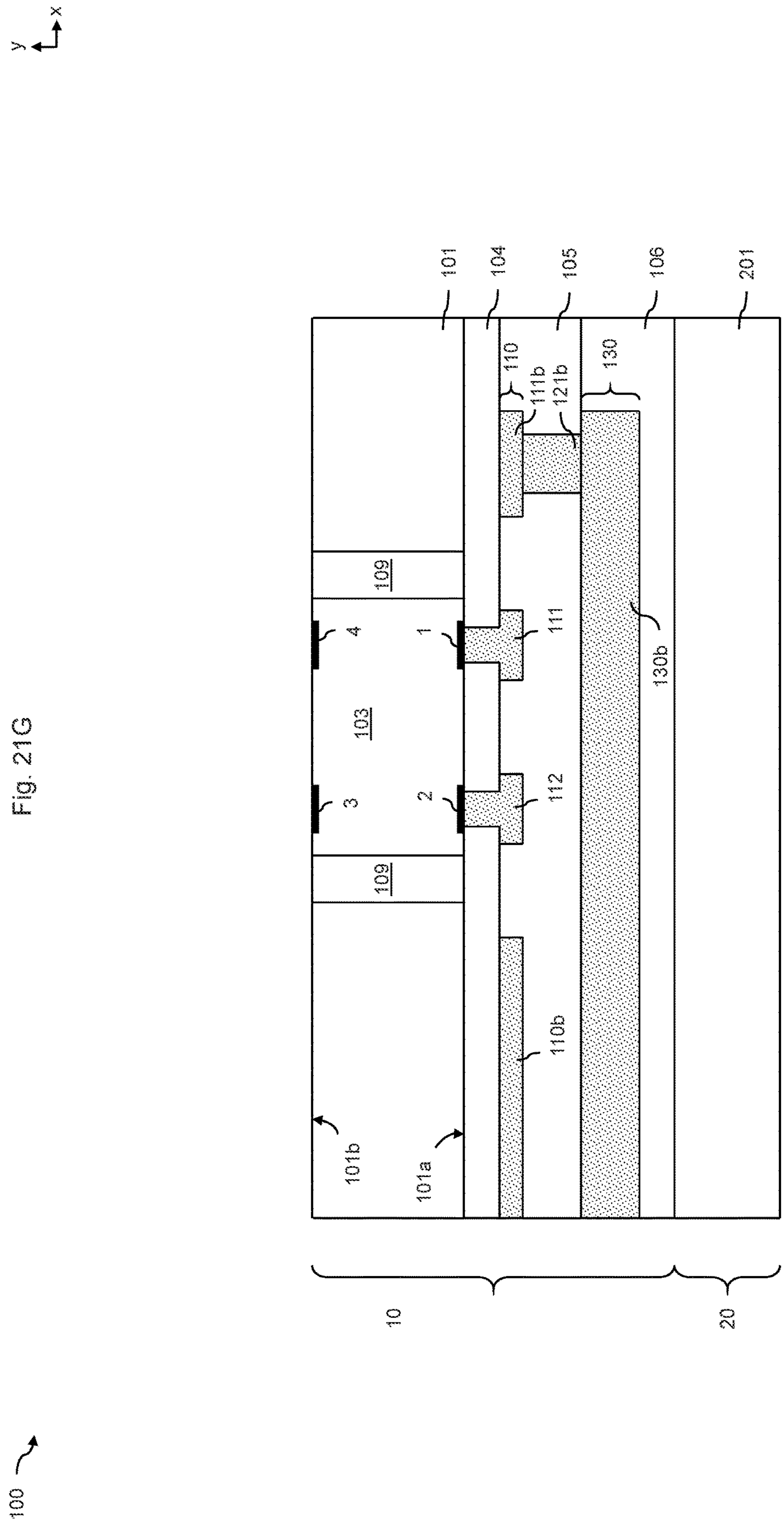

As shown in FIG. 21G a dielectric structure 19 is created, extending from the second surface 101*b* to the first surface 101*a* of the substrate layer 101, laterally enclosing a portion of the substrate layer 101 containing the Hall sensor region (Hall plate) 103. The dielectric structure is created by deep trench isolation process, which is well known in the art.

Figure 21H:
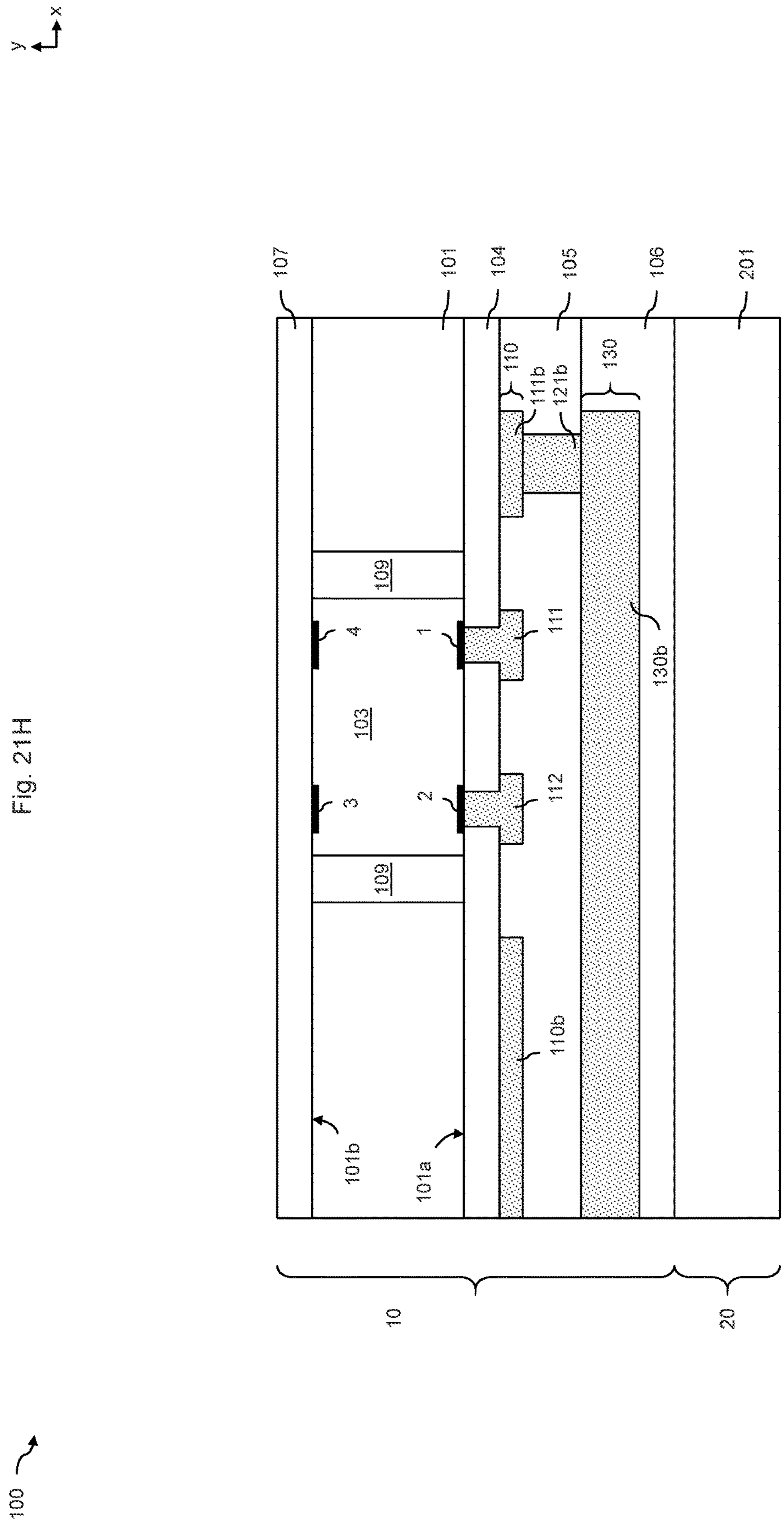

Referring to FIG. 21H a first dielectric layer 107 is deposited on the second surface 101*b*, using the same process and material used for the first dielectric layer 104 of the first side.

Figure 21I:
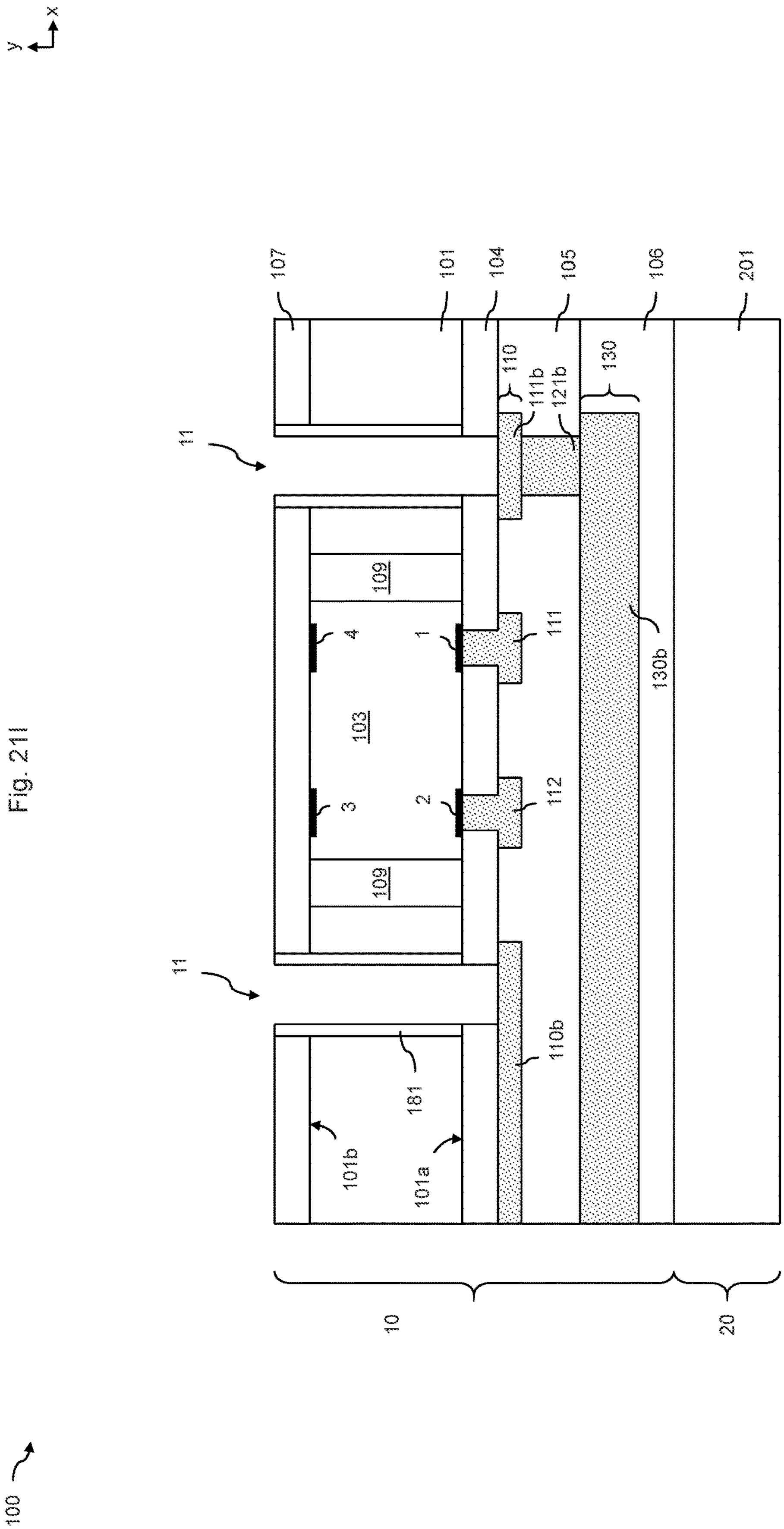
Figure 21J:
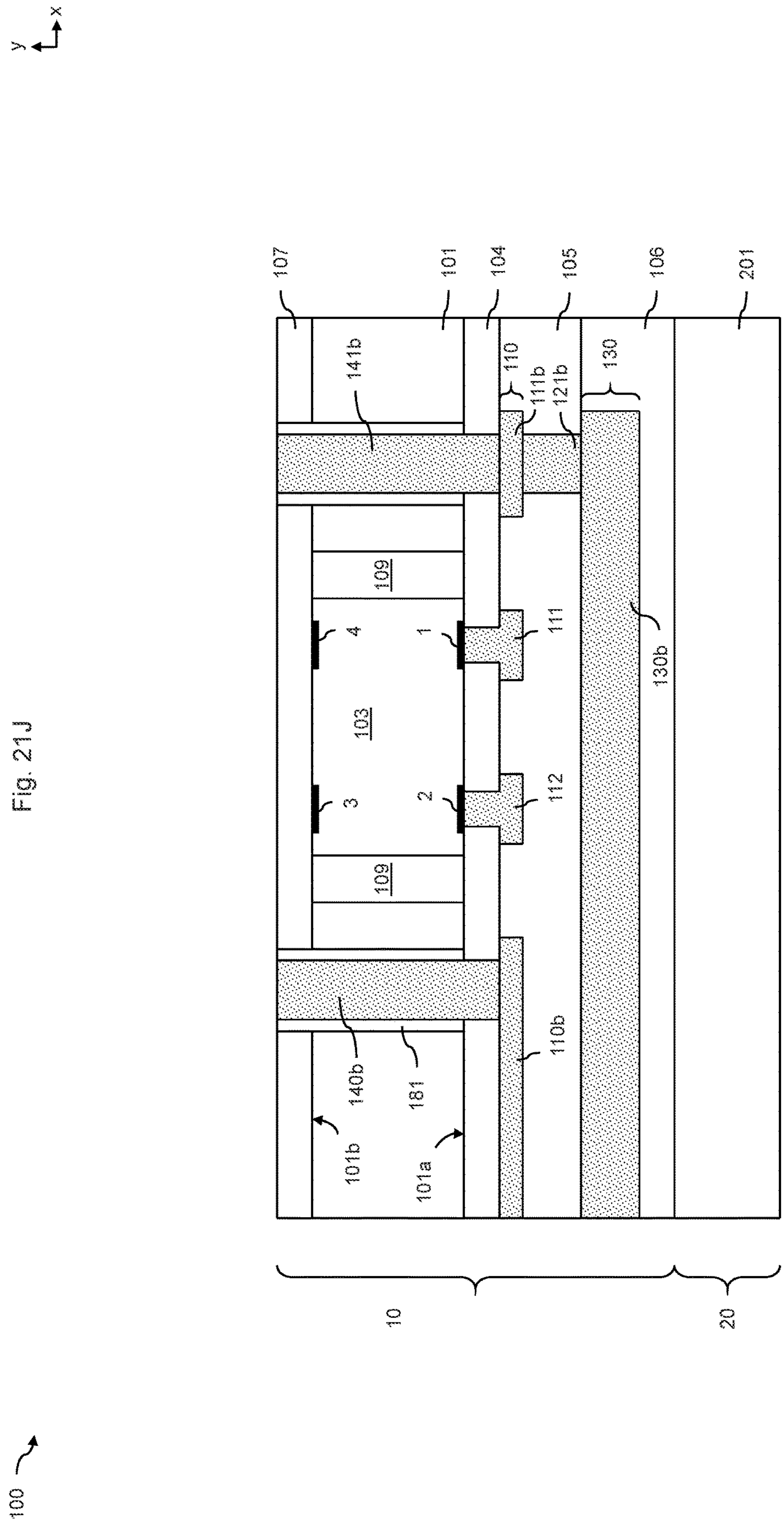

Referring to FIG. 21I, a deep silicon etch process is executed using the silicon nitride layer as hard mask, forming via openings 11. The deep silicon etch is first stopped selectively on the oxide layer 104. A thin oxide layer 181 is deposited. More specifically, the layer 181 may be tetraethyl orthosilicate (TEOS) deposited by plasma enhanced chemical vapor deposition (PECVD) at a temperature not above 400° C. The oxide layer 181 serves as a dielectric liner on the silicon sidewalls exposed by the preceding deep silicon etch. The thickness of the oxide layer 181 might be, for example, 3000 angstroms, but is not limited to this value.

The thin oxide 181 is then etched through at the bottom of the deep silicon via openings 11. The dry etching stops selectively in the titanium nitride barrier layer of the metal structure 110. The via openings 11 are filled with metal layers, which may be a tungsten-based metal layer or, more preferably, a copper-based metal layer.

Figure 21K:
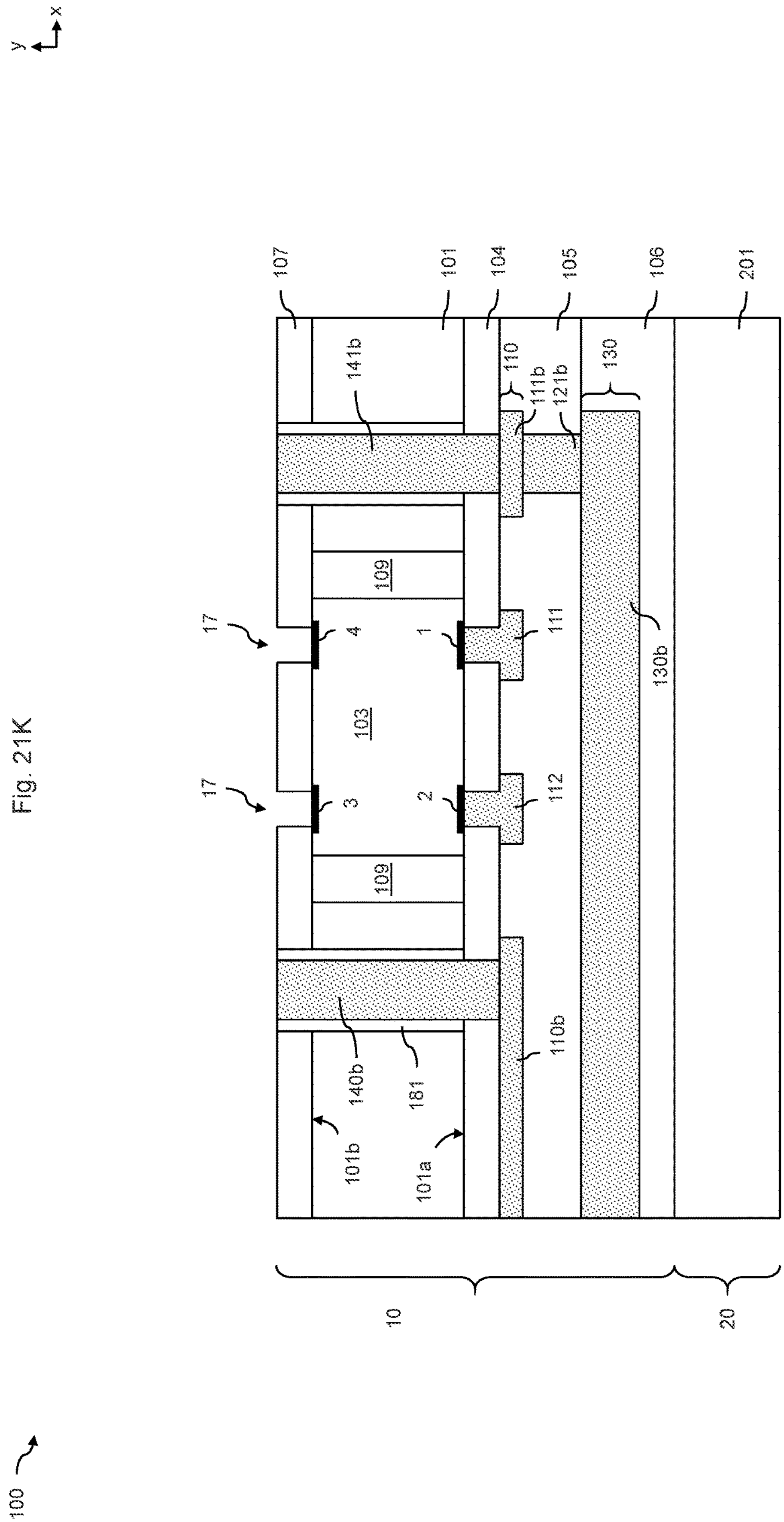

Turning to FIG. 21K, contact trenches or holes 17 are formed by a photo-masked etching process through the dielectric layer 107 such that the highly doped regions 3 and 4 becomes exposed. Thanks to a high selectivity towards silicon the etching can be stopped within the shallow highly doped regions 3 and 4 ensuring that the doping concentration at the silicon surface inside of the trenches or holes 17 is in the range of 1020 atoms/cm$^3$ to 1022 atoms/cm$^3$.

Figure 21L:
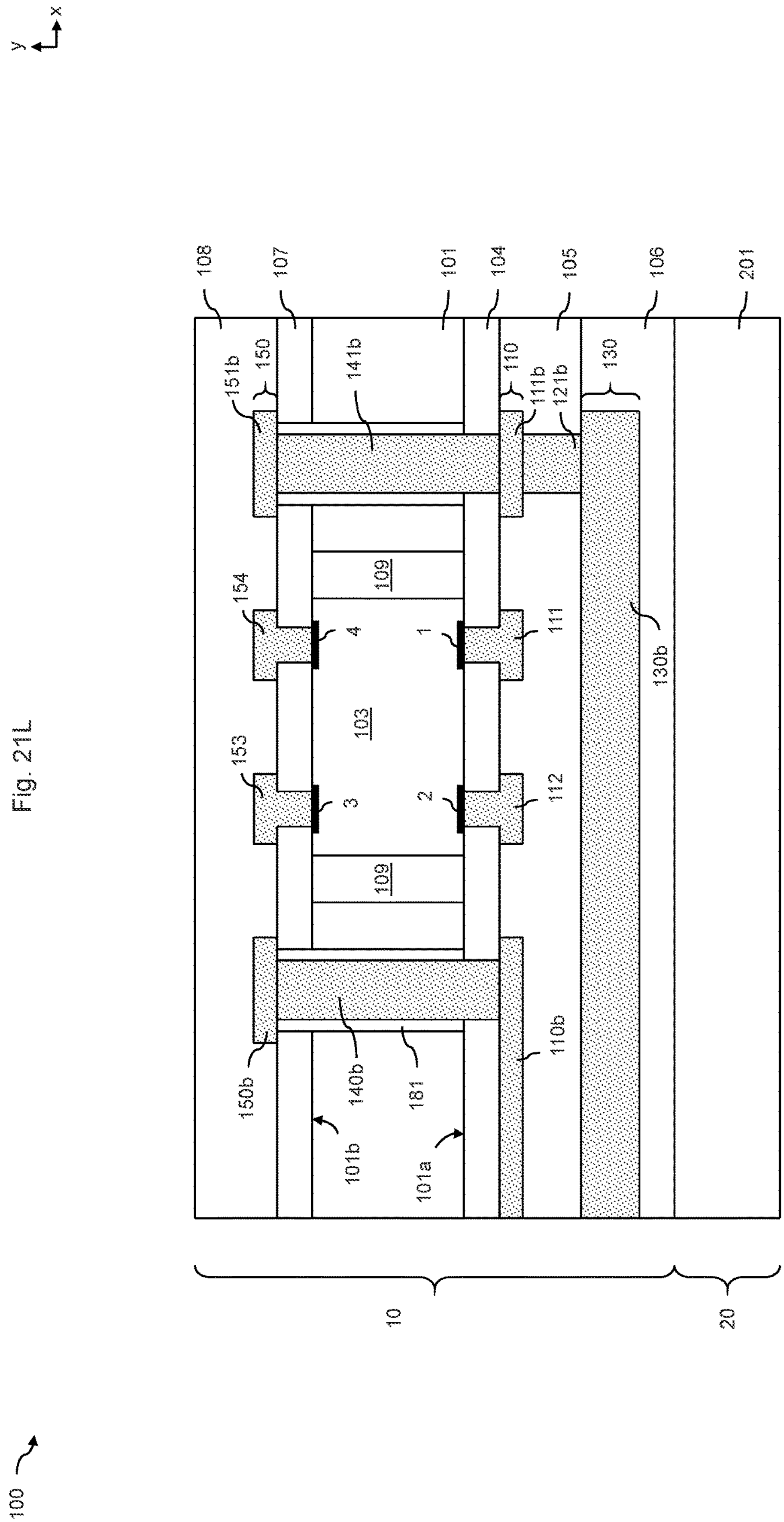

A first metal layer 150 is deposited on the dielectric layer 107 and filling the contact trenches or holes 17. Similar processes and materials are applied as for the metal layer 110 on the first surface. After deposition, the metal layer is structured by photo-masked etching process as shown in FIG. 21L. As depicted, the metal structure 150 fully covers the top surface of the through silicon via 140*b* and 141*b*, achieving an electrical connection between the two through silicon vias.

Figure 21M:
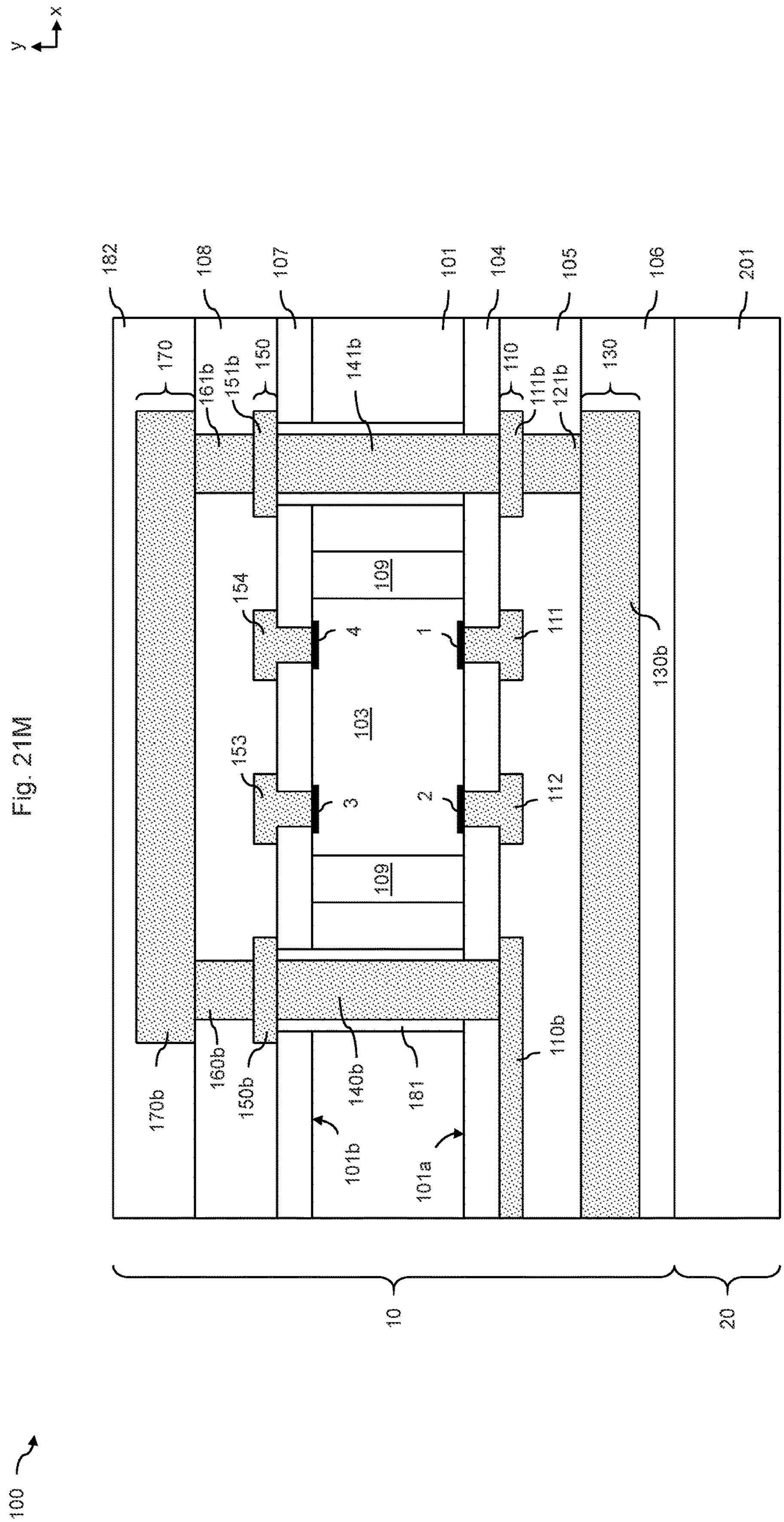

Then an inter-metal dielectric layer 108 is deposited on top of the metal structures 150. Similar processes and materials used for the first-side inter-metal dielectric 105 is used as well. As depicted in FIG. 21M, a via structure is etched through the inter-metal dielectric layer 108 and filled with metal layer 160*b* and 161*b*. A second metal layer 170 is then deposited on top of the inter-metal dielectric layer 108 and structured to connect electrically the vias 160*b* and 161*b* by the metal portion 170*b*. Processes and materials to fill the vias with metal and form the metal layer portion 170*b* are similar as for the second metal layer 130 on the first side of the substrate. Finally a dielectric layer 182 is deposited on top of the metal structure 170, and on the exposed inter-metal dielectric layer 108.

The advantages of the proposed solution are clear from the foregoing description.

In particular, the Hall sensor is configured so that the test and calibration n inductor coils induce a uniform and homogeneous magnetic field in the Hall plate of the vertical or horizontal Hall sensor elements.

Finally, it is clear that modifications and variations may be made to what has been described and illustrated herein, without thereby departing from the scope of the present invention, as defined in the annexed claims.

The invention claimed is:

1. An integrated Hall sensor, comprising:

a main wafer of semiconductor material having a substrate with a first surface and a second surface, opposite to the first surface along a vertical axis;

Hall sensor terminals arranged on at least one of the first and second surfaces of the substrate;

an isolation structure in the substrate defining a Hall sensor plate of the integrated Hall sensor, the Hall sensor terminals being arranged internally to the isolation structure, wherein the integrated Hall sensor further comprises at least one test and calibration coil integrated in the main wafer, having a plurality of windings formed, at least in part, by metal portions arranged above the first and second surfaces of the substrate and defining an inner volume entirely enclosing the Hall sensor plate, wherein said test and calibration coil comprises:

at least a first metal portion defined in a metal layer formed on a first dielectric layer structure arranged on the first surface of the substrate;

at least a second metal portion defined in a respective metal layer formed on a second dielectric layer structure arranged on the second surface of the substrate; and at least a through silicon via extending from the second surface to the first surface of the substrate, and wherein at least one first outer dielectric layer is arranged on the first dielectric structure and said main wafer is attached with the top surface of said outer dielectric layer onto a second wafer, said second wafer being configured for thinning said main wafer from said second surface preferably to a thickness in the range of 10 to 50 micrometers.

2. The integrated Hall sensor according to claim 1, comprising at least one Hall sensor element having first sensor terminals formed at the first surface of the substrate and second sensor terminals formed at the second surface of the substrate opposite to the first sensor terminals; wherein the isolation structure comprises a dielectric structure extending from the second surface to the first surface of the substrate, laterally surrounding a portion of the substrate defining the Hall sensor plate; and wherein the test or calibration coil comprises: first metal region formed on a first dielectric layer structure arranged on the first surface of the substrate; and second metal region formed on a second dielectric layer structure arranged on the second surface of the substrate.

3. The integrated Hall sensor according to claim 2, wherein the first dielectric layer structure has a same thickness of the second dielectric layer structure.

4. The integrated Hall sensor according to claim 2, comprising further Hall sensor elements entirely enclosed by the inner volume defined by the test or calibration coil.

5. The integrated Hall sensor according to claim 4, wherein at least some of the Hall sensor elements are orthogonally coupled elements, jointly forming a Hall sensor designed to be tested and calibrated by the test or calibration coil.

6. The integrated Hall sensor according to claim 1, further comprising an integrated circuit arranged in the inner volume defined by the test or calibration coil.

7. The integrated Hall sensor according to claim 1, further comprising:

a second wafer, having a respective second substrate and at least one metal layer arranged in a dielectric layer formed on the second substrate, the second wafer being attached to the main wafer above the first surface of the substrate of the main wafer, with the dielectric layer facing the same first surface; and a third wafer, having a respective third substrate and at least one metal layer arranged in a dielectric layer formed on the third substrate, the third wafer being attached to the main wafer above the second surface of the substrate of the main wafer, with the dielectric layer facing the same second surface, wherein portions of the metal layers of the second and third wafers contribute to the definition of the windings of the test or calibration coil, and the inner volume of the test or calibration coil, enclosing the Hall sensor plate of a vertical Hall element, extends across the main wafer and the second and third wafers.

8. The integrated Hall sensor according to claim 7, wherein at least one of the second and third wafers is a CMOS wafer integrating circuits for operating the vertical Hall element.

9. The integrated Hall sensor according to claim 1, further comprising at least one further Hall sensor element and a further test or calibration coil integrated in the main wafer, defining a respective inner volume entirely enclosing the Hall sensor plate of the further Hall sensor element; wherein the at least one and the further test or calibration coils are in series so that the at least one and the further Hall sensor elements can be tested or calibrated simultaneously.

10. The integrated Hall sensor according to claim 1, comprising at least one vertical Hall sensor element having a first couple of Hall sensor terminals formed at the first surface of the substrate and a second couple of Hall sensor terminals formed at the second surface of the substrate opposite to the first couple of Hall sensor terminals; wherein each winding of the at least one test or calibration coil comprises: a first metal portion formed on a first dielectric layer structure arranged on the first surface of the substrate; a second metal portion formed on a second dielectric layer structure arranged on the second surface of the substrate; and through silicon vias extending through the substrate and coupled to the first and second metal portions.

11. The integrated Hall sensor according to claim 10, wherein the Hall sensor terminals extend along a first horizontal axis of a plane parallel to the first and second surfaces of the substrate and the first and second metal portions extend along a second horizontal axis of said plane, transverse to the first horizontal axis; and wherein the windings of the test or calibration coil have each a rectangular cross-section in a plane defined by the second horizontal axis and by the vertical axis, are connected in series and are arranged along the first horizontal axis.

12. The integrated Hall sensor according to claim 10, wherein the through silicon vias have a same lateral distance to the Hall sensor plate.

13. The integrated Hall sensor according to claim 10, further comprising an outer coil formed in said main wafer, having a plurality of windings, each comprising: a respective first metal portion formed on a first outer dielectric layer arranged on a first dielectric structure; a respective second metal portion formed on a second outer dielectric layer arranged on a second dielectric structure; and respective through silicon vias extending through the substrate and coupled to the respective first and second metal portions; wherein the outer coil is connected in series to the test or calibration coil.

14. The integrated Hall sensor according to claim 10, further comprising an outer coil formed in the main wafer, having a plurality of windings, each comprising: a respective first metal portion formed on a first outer dielectric layer arranged on the first dielectric structure; a respective second metal portion formed on a second outer dielectric layer arranged on the second dielectric structure; wherein the orientation of the outer coil is rotated by 90 degrees with respect to the test or calibration coil.

15. The integrated Hall sensor according to claim 14, wherein the vertical Hall sensor element is a circular vertical Hall element, with Hall sensor plate having a ring shape entirely arranged in the inner volume commonly defined by the outer and test or calibration coils.

16. The integrated Hall sensor according to claim 1, comprising at least one horizontal Hall sensor element having a first set of doped regions formed at the first surface of the substrate and a second set of doped regions formed at the second surface of the substrate, opposite to the first set of doped regions and defining with the first set of doped regions corresponding Hall sensor terminals of the horizontal Hall sensor element.

17. The integrated Hall sensor according to claim 16, wherein the test or calibration coil comprises: at least a first winding defined in a metal layer formed on a first dielectric layer structure arranged on the first surface of the substrate; and at least a second winding defined in a respective metal layer formed on a second dielectric layer structure arranged on the second surface of the substrate; the first and second windings being arranged facing each other and surrounding the Hall sensor plate.

18. The integrated Hall sensor according to claim 16, wherein the test or calibration coil is formed, at least in part, by a through silicon via laterally enclosing the horizontal Hall element and surrounding a dielectric structure.

19. The integrated Hall sensor according to claim 16, wherein the test or calibration coil has a spiral configuration.

20. The integrated Hall sensor according to claim 16 comprising at least one horizontal Hall sensor element, wherein said first set of doped regions formed at the first surface of the substrate and said second set of doped regions formed at the second surface of the substrate are connected in pair by through silicon vias.

* * * * *